United States Patent
Taya

(10) Patent No.: US 8,067,807 B2
(45) Date of Patent: Nov. 29, 2011

(54) SEMICONDUCTOR INTEGRATED CIRCUIT DEVICE

(75) Inventor: Masatoshi Taya, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 168 days.

(21) Appl. No.: 12/508,560

(22) Filed: Jul. 23, 2009

(65) Prior Publication Data

US 2010/0052073 A1    Mar. 4, 2010

(30) Foreign Application Priority Data

Sep. 1, 2008  (JP) ................................. 2008-223344

(51) Int. Cl.
*H01L 27/088*    (2006.01)

(52) U.S. Cl. ................. 257/392; 257/E27.061

(58) Field of Classification Search .................. 257/392, 257/476, E27.061, 368, 491, 499, 500
See application file for complete search history.

(56) References Cited

U.S. PATENT DOCUMENTS

| 6,780,717 B2 | 8/2004 | Yasuoka et al. |
| 2006/0027880 A1 * | 2/2006 | Taya .............................. 257/392 |

FOREIGN PATENT DOCUMENTS

| JP | 2002-170888 A | 6/2002 |
| JP | 2005-340627 A | 12/2005 |

* cited by examiner

*Primary Examiner* — Thomas L Dickey
*Assistant Examiner* — Nikolay Yushin
(74) *Attorney, Agent, or Firm* — Miles & Stockbridge P.C.

(57) ABSTRACT

In an LCD driver IC, a high-breakdown-voltage MISFET is mounted together with a typical low-breakdown-voltage MISFET. Because the high-breakdown-voltage MISFET has a gate oxide film thicker than that of the typical MISFET, the electrode of the high-breakdown-voltage MISFET is inevitably high in level. Accordingly, the depth of a gate contact is shallow so that process compatibility with the typical portion is necessary. In the present invention, in, e.g., the channel width direction of the high-breakdown-voltage MISFET, the boundary of a thick-film gate oxide region is located inwardly of the end of a gate electrode. At the gate electrode portion thus lowered in level, a gate contact is disposed so that the boundary of the thick film is located inwardly of the end of the gate electrode and between the gate contact and a channel end.

28 Claims, 96 Drawing Sheets

FIG. 93 <PROCESS CORRELATION TABLE>

| PROCESS STEP | REFERENCE NUMERALS IN DEVICE STRUCTURE 1 | | | | PROCESS STEP | REFERENCE NUMERALS IN DEVICE STRUCTURE 2 | | | |
|---|---|---|---|---|---|---|---|---|---|
| | PORTION | | | | | PORTION | | | |
| | CHANNEL LENGTH DIRECTION | | CHANNEL WIDTH DIRECTION | | | CHANNEL LENGTH DIRECTION | | CHANNEL WIDTH DIRECTION | |
| | LOW-BREAKDOWN-VOLTAGE PORTION | HIGH-BREAKDOWN-VOLTAGE PORTION | LOW-BREAKDOWN-VOLTAGE PORTION | HIGH-BREAKDOWN-VOLTAGE PORTION | | LOW-BREAKDOWN-VOLTAGE PORTION | HIGH-BREAKDOWN-VOLTAGE PORTION | LOW-BREAKDOWN-VOLTAGE PORTION | HIGH-BREAKDOWN-VOLTAGE PORTION |
| 0 | | | | | 0 | | 96 | | |
| 1 | 7 | 16 | 25 | 34 | 1 | 46 | 57 | 68 | 79 |
| 2 | 8 | 17 | 26 | 35 | 2 | 47 | 58 | 69 | 80 |
| 3 | 9 | 18 | 27 | 36 | 3 | 48 | 59 | 70 | 81 |
| 4 | 10 | 19 | 28 | 37 | 4-1 | 49 | 60 | 71 | 82 |
| | | | | | 4-2 | 50 | 61 | 72 | 83 |
| | | | | | 4-3 | 51 | 62 | 73 | 84 |
| 5 | 11 | 20 | 29 | 38 | 5 | 52 | 63 | 74 | 85 |
| 6 | 12 | 21 | 30 | 39 | 6 | 53 | 64 | 75 | 86 |
| 7 | 13 | 22 | 31 | 40 | 7 | 54 | 65 | 76 | 87 |
| 8 | 14 | 23 | 32 | 41 | 8 | 55 | 66 | 77 | 88 |
| 9 | 15 | 24 | 33 | 42 | 9 | 56 | 67 | 78 | 89 |
| 10 | | | | 95 | 10 | | | | |

US 8,067,807 B2

SEMICONDUCTOR INTEGRATED CIRCUIT DEVICE

CROSS-REFERENCE TO RELATED APPLICATIONS

The disclosure of Japanese Patent Application No. 2008-223344 filed on Sep. 1, 2008 including the specification, drawings and abstract is incorporated herein by reference in its entirety.

BACKGROUND OF THE INVENTION

The present invention relates to a technique which is effective when applied to a semiconductor integrated circuit device (or a semiconductor device) in which plural types of MISFETs (Metal Insulator Semiconductor Field Effect Transistors) having different breakdown voltages are integrated.

Each of Japanese Unexamined Patent Publication No. 2002-170888 (Patent Document 1) and U.S. Pat. No. 6,780,717 (Patent Document 2) discloses a semiconductor integrated circuit device in which two types of MISFETs having a low breakdown voltage and a high breakdown voltage, respectively, are integrated. In the high-breakdown-voltage MISFET, a gate electrode has an entire periphery thereof overlying a high-breakdown-voltage gate insulating film formed by CVD.

Japanese Unexamined Patent Publication No. 2005-340627 (Patent Document 3) discloses a technique which couples a gate electrode directly to a substrate to form a path for accumulated charges in order to prevent a dielectric breakdown in a lower-layer gate insulating film which occurs during the plasma etching of a metal wiring in the manufacturing process of a semiconductor integrated circuit device in which typical MISFETs are integrated. In the publication, there is shown a structure in which a gate electrode extending beyond the end portion of a gate insulating film deposited over a substrate has a portion coupled to a contact electrode outside a region covered with the gate insulating film.
[Patent Document 1]
Japanese Unexamined Patent Publication No. 2002-170888
[Patent Document 2]
U.S. Pat. No. 6,780,717
[Patent Document 3]
Japanese Unexamined Patent Publication No. 2005-340627

SUMMARY OF THE INVENTION

In an LCD (Liquid Crystal Display) driver IC (Integrated Circuit), a high-breakdown-voltage MISFET is mounted in conjunction with a typical low-breakdown-voltage MISFET. Because the high-breakdown-voltage MISFET has a gate oxide film thicker than that of the typical MISFET, the electrode thereof is inevitably high in level. As a result, the depth of the gate contact thereof is shallow, which requires process compatibility with the typical portion. In addition, the present inventors have elucidated that, since the gate contact is positioned at an appropriate distance from the boundary of the thick-film region, there is a problem of an accordingly larger layout or the like.

That is, in a typical high-breakdown-voltage MISFET, a thick-film gate oxide region is formed slightly larger in size than a gate electrode. Accordingly, the entire region of the gate electrode is higher in level than the gate electrode of a low-breakdown-voltage portion. A gate contact is provided over the gate electrode.

The depth of the gate contact of the high-breakdown-voltage portion is shallower than that of the typical MISFET. As a result, there are three depths of contacts including a contact with a diffusion region in the surface of a substrate, which is disadvantageous in terms of a manufacturing process such as dry etching. Since the depth of the contact is thus relatively shallow, the diameter of the contact of the high-breakdown-voltage portion tends to be large, and requires a layout margin larger than that required by each of the other contacts. In addition, a power supply ring for a well needs to be provided at a proper distance from the boundary of a thick-film region, which results in the problem of a layout unable to be reduced.

The present invention has been achieved in order to solve these problems.

An object of the present invention is to provide a semiconductor integrated circuit device suited to mass production.

The above and other objects and novel features of the present invention will become apparent from the description of the present specification and the accompanying drawings.

As shown below, a brief description will be given of a representative aspect of the invention disclosed in the present application.

That is, in a channel width direction of a high-breakdown-voltage MISFET according to the present invention, e.g., the boundary of the thick-film gate oxide region is positioned inwardly of an end of the gate electrode. The gate contact is disposed in the gate electrode portion that has been thus lowered in level so that the boundary of the thick film is located inwardly of the end of the gate electrode and between the gate contact and a channel end.

The following is a brief description of an effect obtained by a representative aspect of the invention disclosed in the present application.

That is, the depth of the gate contact becomes equal to that of a typical MISFET portion so that the diameter of a hole becomes equal. In addition, a layout margin is sufficient as long as it is equal to that for the typical MISFET portion, and can be reduced. Further, since the boundary of the thick film is within a range located under the electrode, an allowance for a distance from the boundary provided between the end of the electrode and a well power supply ring (P-type high-concentration guard ring contact region or an N-type high-concentration guard ring contact region) is no more needed. This allows the well power supply ring to be closer to the MISFET, and allows a reduction in the size of an element.

BRIEF DESCRIPTION OF THE DRAWINGS

FIG. 93 is a process step correlation table showing correlations (simultaneous or pre/post relations) among FIGS. 7 to 42, 46 to 89, and 95;

DETAILED DESCRIPTION OF THE PREFERRED EMBODIMENTS

Outline of Embodiments

Figure 1:
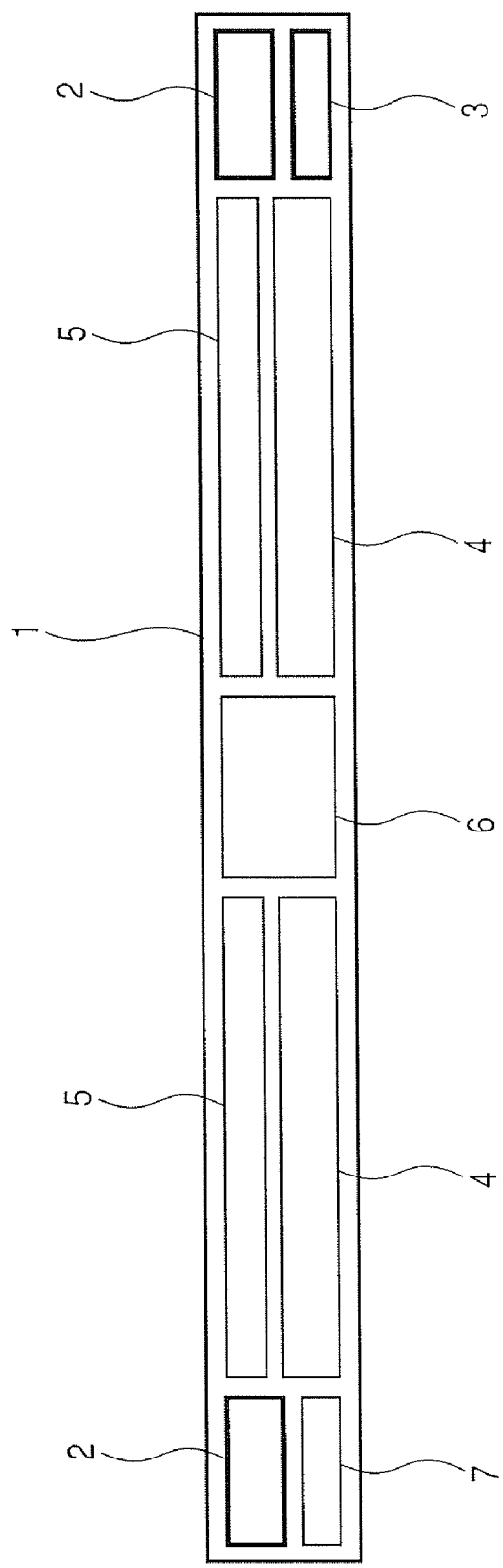
FIG. 1 is a layout diagram of the entire upper surface of a semiconductor chip of a semiconductor integrated circuit device in an embodiment of the present invention.

As shown below, a brief description will be given of the outline of representative embodiments of the invention disclosed in the present application.

1. A semiconductor integrated circuit device including: (a) a semiconductor substrate having a first principal surface and a second principal surface; (b) a first MISFET group formed at the first principal surface; and (c) a second MISFET group formed at the first principal surface, and lower in breakdown voltage than the first MISFET group, wherein each of MISFETs belonging to the first MISFET group includes: (i) a first source region and a first drain region which are formed in a surface region of the first principal surface to oppose each other with a first channel region being interposed therebetween; (ii) a first gate insulating film deposited by CVD over the first principal surface so as to cover the first channel region, and reach a surface portion of a first field insulating film around an entire periphery of the first channel region; (iii) a first gate electrode film formed over the first gate insulating film so as to cover the first channel region, and reach an outside of the region covered with the first gate insulating film; and (iv) a first gate contact portion provided over the first gate electrode film outside the region covered with the first gate insulating film.

2. In the semiconductor integrated circuit device defined in the section 1, the first gate contact portion is provided in a gate width direction.

3. In the semiconductor integrated circuit device defined in the section 1, the first gate contact portion is provided in a gate length direction.

4. In the semiconductor integrated circuit device defined in any one of the sections 1 to 3, each of MISFETs belonging to the second MISFET group includes: (i) a second gate insulating film formed by thermal oxidation over a second channel region of the first principal surface.

5. In the semiconductor integrated circuit device defined in the section 1, 2, or 4, a part of each of both end portions of the first gate electrode film is over the first gate insulating film in a gate length direction.

6. In the semiconductor integrated circuit device defined in the section 1, 3, or 4, the first gate electrode film covers an entire region of the first gate insulating film.

7. In the semiconductor integrated circuit device defined in any one of the sections 1 to 6, an end portion of the first gate insulating film is over the first field insulating film around an entire periphery thereof.

8. In the semiconductor integrated circuit device defined in any one of the sections 1 to 7, at the first gate contact portion, a contact is formed of a single or a plurality of metal plugs each having a first diameter.

9. In the semiconductor integrated circuit device defined in any one of the sections 1 to 8, at a second gate contact portion of each of MISFETs belonging to the second MISFET group, a contact is formed of a metal plug having a first diameter.

10. In the semiconductor integrated circuit device defined in any one of the sections 1 to 9, at a first source contact portion of each of the MISFETs belonging to the first MISFET group and at a drain contact portion thereof, contacts are formed of metal plugs each having a first diameter.

11. A semiconductor integrated circuit device including: (a) a semiconductor substrate having a first principal surface and a second principal surface; (b) a first MISFET group formed at the first principal surface; and (c) a second MISFET group formed at the first principal surface, and lower in breakdown voltage than the first MISFET group, wherein each of MISFETs belonging to the first MISFET group includes: (i) a first source region and a first drain region which are formed in a surface region of the first principal surface to oppose each other with a first channel region being interposed therebetween; (ii) a first gate insulating film deposited by thermal oxidation over the first principal surface so as to cover the first channel region, and be coupled to a first field insulating film around an entire periphery of the first channel region; (iii) an insulating film mesa region formed of the first gate insulating film and of a thick portion of the first field insulating film on a periphery of the first gate insulating film; (iv) a first gate electrode film formed over the first gate insulating film so as to cover the first channel region, and reach an outside of the insulating film mesa region; and (v) a first gate contact portion provided over the first gate electrode film outside the insulating film mesa region.

12. In the semiconductor integrated circuit device defined in the section 11, the first gate contact portion is provided in a gate width direction.

13. In the semiconductor integrated circuit device defined in the section 11, the first gate contact portion is provided in a gate length direction.

14. In any one of the sections 11 to 13, each of MISFETs belonging to the second MISFET group includes: (i) a second gate insulating film formed by thermal oxidation over a second channel region of the first principal surface.

15. In the semiconductor integrated circuit device defined in the section 11, 12, or 14, a part of each of both end portions of the first gate electrode film is over the insulating film mesa region in a gate length direction.

16. In the semiconductor integrated circuit device defined in the section 11, 13, or 14, the first gate electrode film covers the entire insulating film mesa region.

17. In the semiconductor integrated circuit device defined in any one of the sections 11 to 16, an end portion of the insulating film mesa region is over the first field insulating film around an entire periphery thereof.

18. In the semiconductor integrated circuit device defined in any one of the sections 11 to 17, wherein, at the first gate contact portion, a contact is formed of a single or a plurality of metal plugs having a first diameter.

19. In the semiconductor integrated circuit device defined in any one of the sections 11 to 18, at a second gate contact portion of each of MISFETs belonging to the second MISFET group, a contact is formed of a metal plug having a first diameter.

20. In the semiconductor integrated circuit device defined in any one of the sections 11 to 19, at a first source contact portion of each of the MISFETs belonging to the first MISFET group and at a drain contact portion thereof, contacts are formed of metal plugs each having a first diameter.

21. In the semiconductor integrated circuit device defined in any one of the sections 1 to 20, a drain contact portion of each of the MISFETs belonging to the first MISFET group is formed in an internal region of the first field insulating film.

22. The semiconductor integrated circuit devices defined in any one of the sections 1 to 21 is of a CMIS type.

Explanation of Description Form, Basic Terminology, and Use thereof in Present Invention 1. In the present invention, if necessary for the sake of convenience, the embodiments will be each divided into a plurality of sections in description. However, they are by no means independent of or distinct from each other unless particularly explicitly described otherwise, and one of the individual parts of a single example is details, variations, and so fourth of part or the whole of the others. In principle, the repetition of like parts will be omitted. Each constituent element in the embodiments is not indispensable unless particularly explicitly described otherwise, unless the constituent element is theoretically limited to a specific number, or unless it is obvious from the context that the constituent element is indispensable.

2. Likewise, even when the wording "X made of A" or the like is used in association with a material, a composition, or the like in the description of the embodiments or the like, it does not exclude a material, a composition, or the like which contains an element other than A as one of main constituent elements unless particularly explicitly described otherwise, or unless it is obvious from the context that it excludes such a material, a composition, or the like. For example, when a component is mentioned, the wording means "X containing A as a main component" or the like. It will be easily appreciated that, even when such wording as "silicon member", or the like is used, it is not limited to pure silicon, and a member containing a SiGe alloy, another multi-element alloy containing silicon as a main component, another additive, or the like is also included. Likewise, it will also be easily appreciated that, even when the wording "silicon dioxide film" is used, it includes not only relatively pure undoped silicon dioxide, but also a thermal oxide film of FSG (Fluorosilicate Glass), TEOS-based silicon oxide, SiOC (Silicon Oxicarbide), carbon-doped Silicon oxide, OSG (Organosilicate glass), PSG (Phosphorus Silicate Glass), BPSG (Borophosphosilicate Glass), or the like, a CVD oxide film, coating silicon dioxide such as SOG (Spin ON Glass) or NCS (Nano-Clustering Silica), a silica-based Low-k insulating film (porous insulating film) obtained by introducing voids into the same member as mentioned above, a composite film with another silicon-based insulating film which contains any of these mentioned above as a main constituent element, and the like.

3. Likewise, it will also be easily appreciated that, although a preferable example is shown in association with a graphical figure, a position, an attribute, or the like, it is not strictly limited thereto unless particularly explicitly described otherwise, or unless it is obvious from the context that the example is strictly limited thereto.

4. Further, when a specific numerical value or numerical amount is mentioned, it may be either more or less than the specific numerical value unless particularly explicitly described otherwise, unless the numerical value is theoretically limited to the number, or unless it is obvious from the context that the numeral value is limited to the number.

5. When the term "wafer" or "chip" is used, it typically indicates a single-crystal silicon wafer on which a semiconductor integrated circuit device (the same as a semiconductor device or an electronic device) is formed, but it will be easily appreciated that "wafer" or "chip" also includes a composite wafer of an insulating substrate and a semiconductor layer or the like, such as an epitaxial wafer, a SOI substrate, or an LCD glass substrate.

6. Because the "diameter of a contact electrode" decreases from the upper end thereof toward the lower end thereof, it is assumed that "the diameter of a contact electrode" indicates that of an upper end portion corresponding to the diameter of a mask opening, unless a location is shown particularly explicitly.

Details of Embodiments

The embodiments will be further described in greater detail. In the individual drawings, the same or like parts are designated by the same or similar symbols or reference numerals, and the description thereof will not be repeated in principle.

1. Description of Device/Circuit Structure in Semiconductor Integrated Circuit Device in Each of Embodiments of Present Invention (Primarily Using FIGS. 1 to 94)

Figure 94:
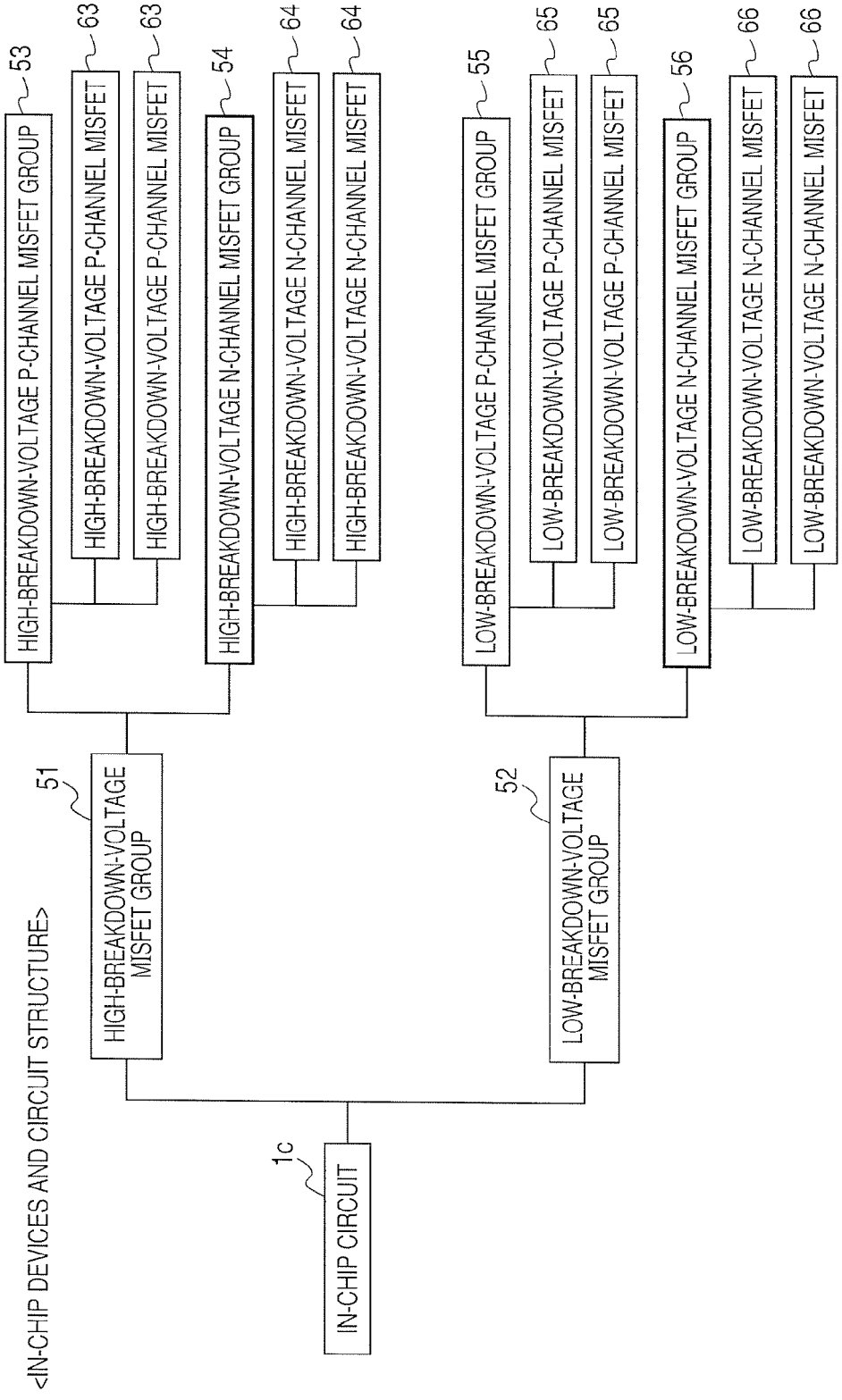
FIG. 94 is a classification diagram of a device/circuit structure showing a device and a circuit structure in the semiconductor chip of FIG. 1.

FIG. 1 is a layout diagram of the entire upper surface of a semiconductor chip of a semiconductor integrated circuit device in an embodiment of the present invention. FIG. 94 is a classification diagram of a device/circuit structure showing a device and a circuit structure in the semiconductor chip of FIG. 1. Based on these drawings, a description will be given of the device/circuit structure in each of the embodiments of the present invention.

In the present embodiment, as an LCD IC, a semiconductor integrated circuit device (LCD driver) for driving a liquid crystal display, which drives a liquid crystal display device, will be shown by way of example.

FIG. 1 shows an on-chip circuit layout of a representative LCD IC. In this example, the LCD IC includes circuit blocks such as a single power supply circuit portion 3, a controller portion 6, a nonvolatile redundant fuse circuit portion 7, a pair of memory circuit portions 4, a pair of source driver circuit portions 5, and a pair of gate driver circuit portions 2. Among them, the gate driver circuit portions 2, the power supply circuit portion 3, and the like are particularly required to have high breakdown voltages.

Accordingly, as shown in FIG. 94, an in-chip circuit 1c includes a plurality of device groups having different breakdown voltages such as, e.g., a low-breakdown-voltage MISFET group 52 (with an operating voltage of, e.g., about 1.5 V), and a high-breakdown-voltage MISFET group 51 (with an operating voltage of, e.g., about 28 V). Basically, each of the low-breakdown-voltage MISFET group 52 and the high-breakdown-voltage MISFET group 51 has a CMOS (Complementary Metal Oxide Semiconductor) structure or a CMIS (Complementary Metal Insulator Semiconductor) structure. Therefore, the high-breakdown-voltage MISFET group 51 has a high-breakdown-voltage P-channel MISFET group 53 and a high-breakdown-voltage N-channel MISFET group 54. Likewise, the low-breakdown-voltage MISFET group 52 has a low-breakdown-voltage P-channel MISFET group 55 and a low-breakdown-voltage N-channel MISFET group 56. The high-breakdown-voltage P-channel MISFET group 53, the high-breakdown-voltage N-channel MISFET group 54, the low-breakdown-voltage P-channel MISFET group 55, and the low-breakdown-voltage N-channel MISFET group 56 have a plurality of high-breakdown-voltage P-channel MISFETs 63, a plurality of high-breakdown-voltage N-channel MISFETs 64, a plurality of low-breakdown-voltage P-channel MISFETs 65, and a plurality of low-breakdown-voltage N-channel MISFETs 66, respectively.

A P-channel device and an N-channel device are substantially symmetric with respect to P-N inversion. In the following description, to avoid intricacy resulting from the repetition of the same description, a detailed structure and the like will be described specifically using an N-channel device as an example.

2. Description of Outline of Semiconductor Integrated Circuit Device in Embodiment of Present Invention (Primarily Using FIGS. 2 to 5)

Figure 2:
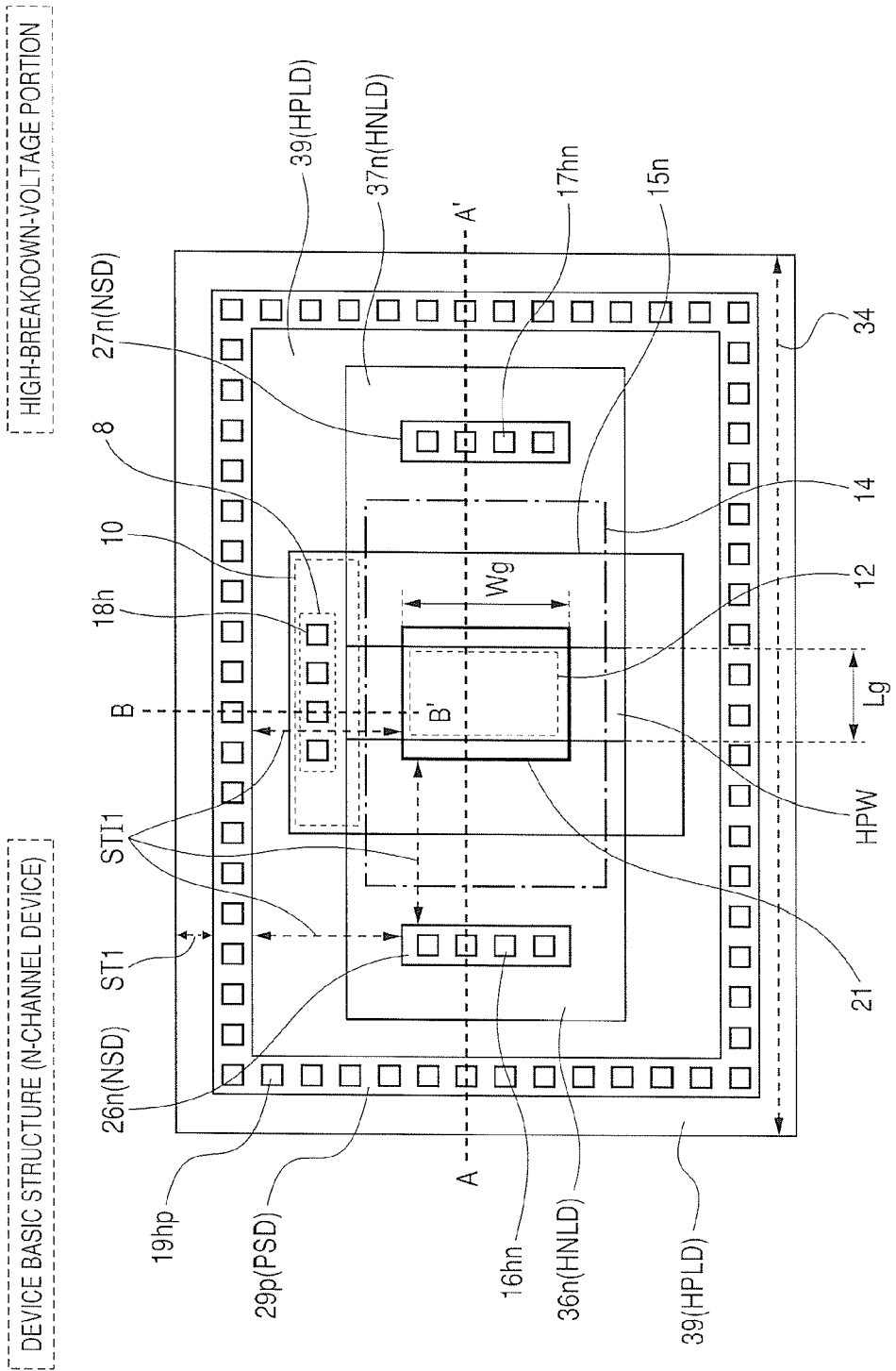
FIG. 2 is an upper-surface layout diagram of a high-breakdown-voltage-portion N-channel MISFET (a basic structure according to a CVD gate insulating film method) in the semiconductor integrated circuit device in the embodiment of the present invention.
Figure 3:
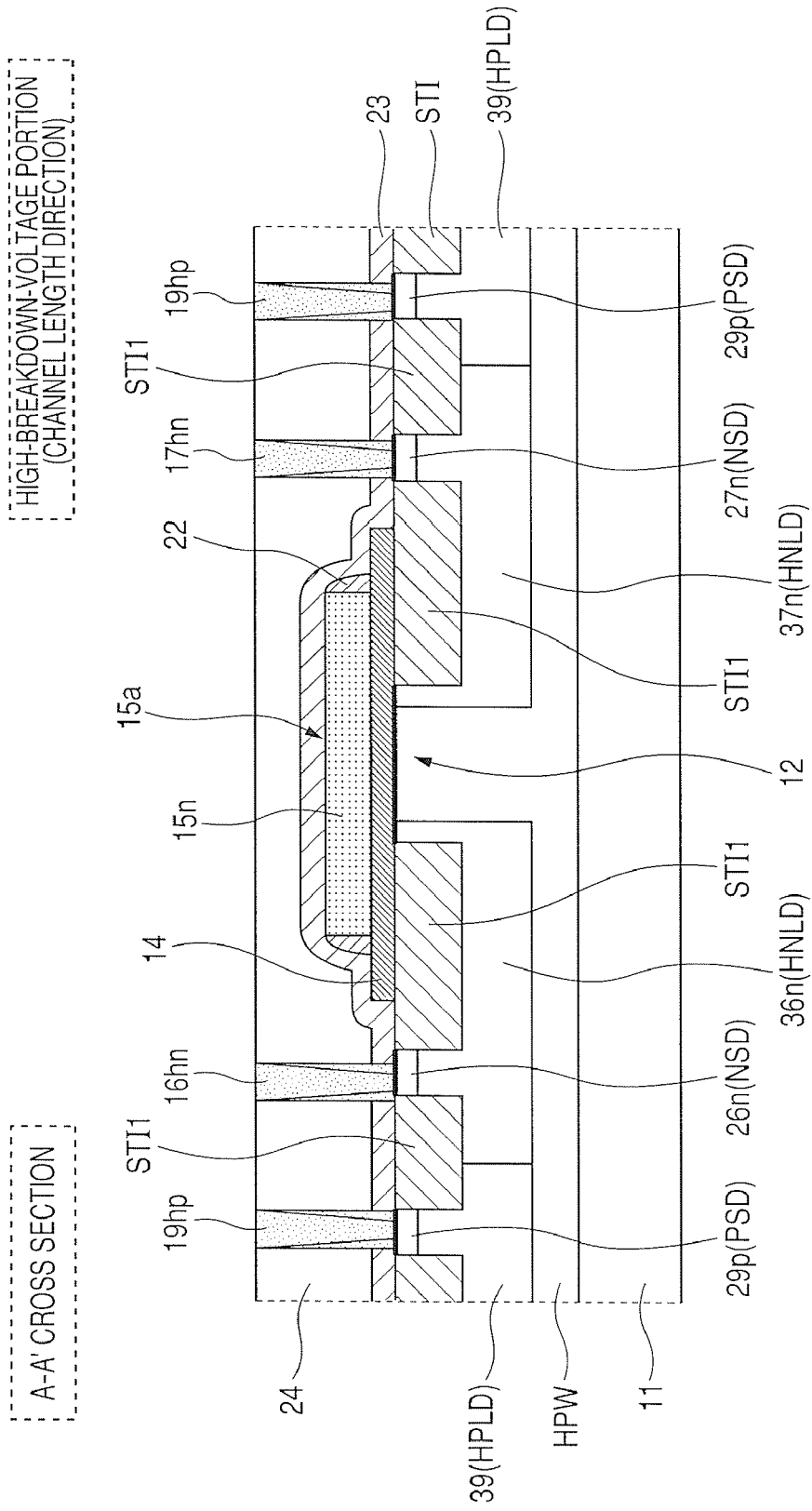
FIG. 3 is a cross-sectional view along the line A-A' of FIG. 2.
Figure 4:
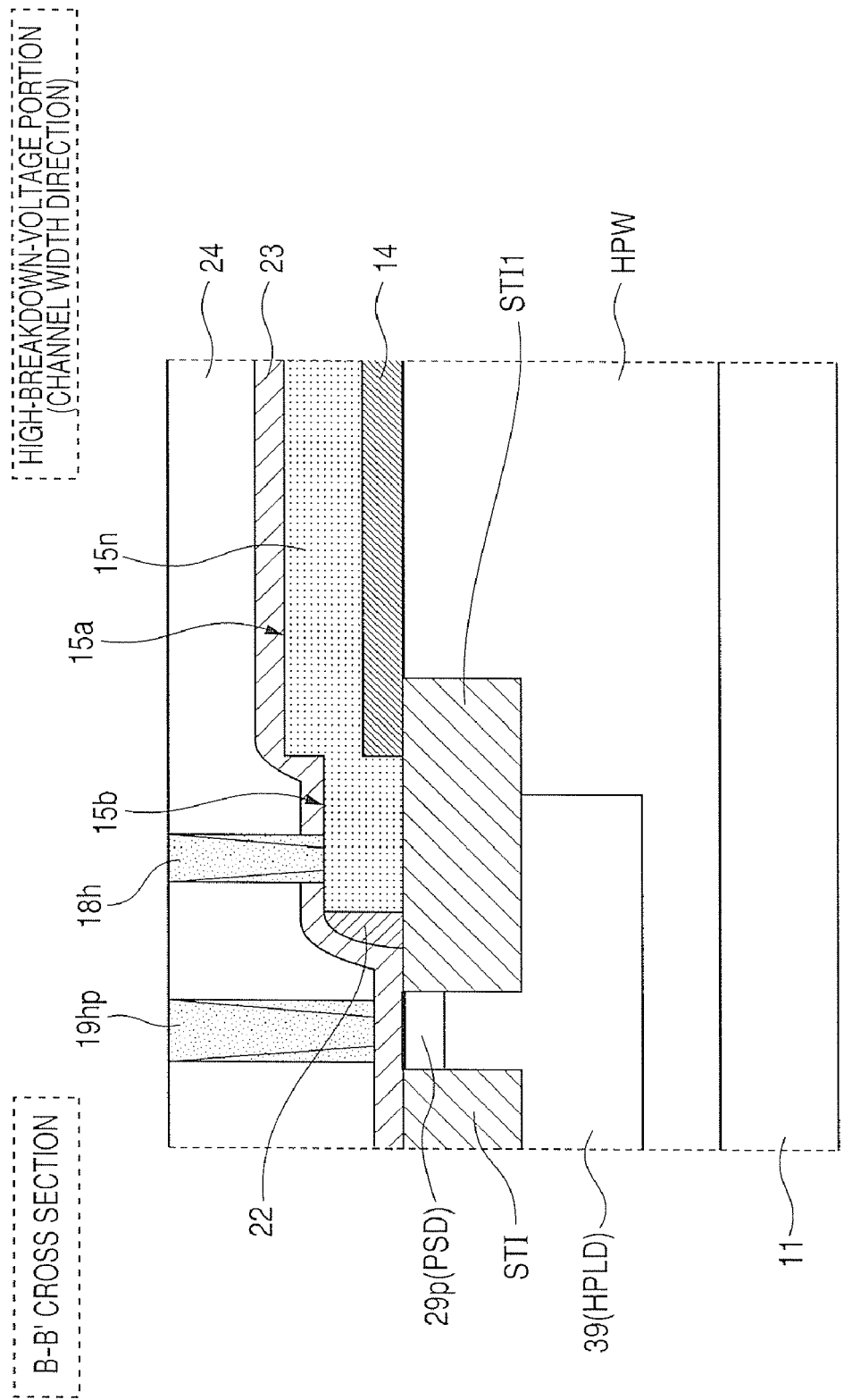
FIG. 4 is a cross-sectional view along the line B-B' of FIG. 2.
Figure 5:
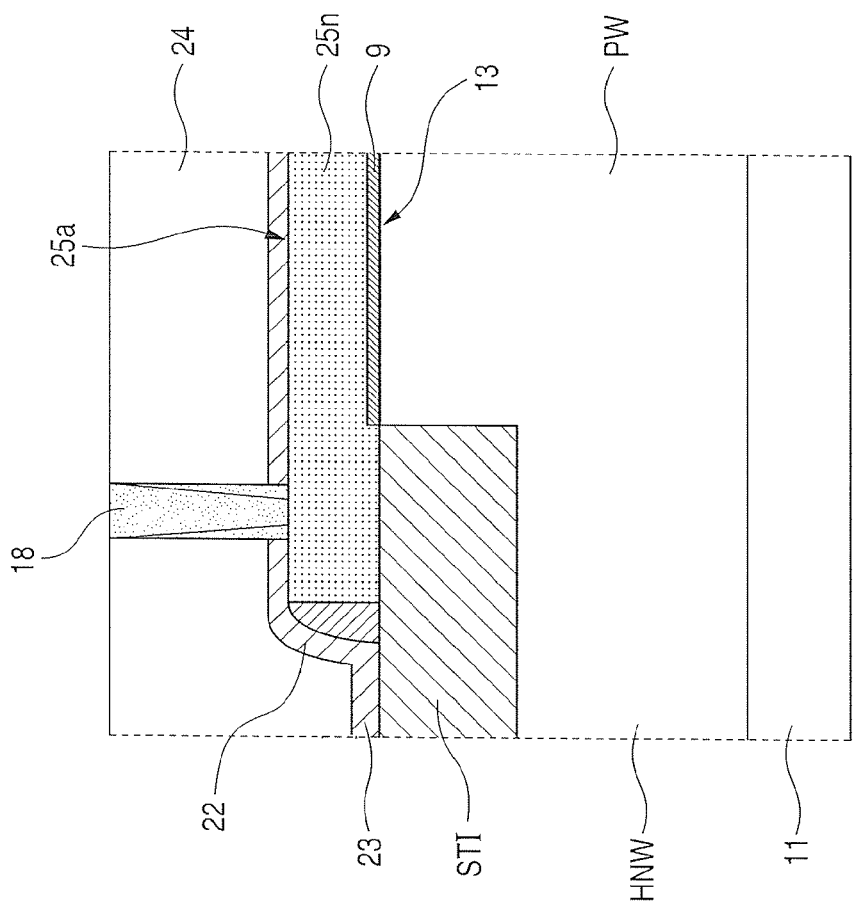
FIG. 5 is a cross-sectional view of the portion of a low-breakdown-voltage-portion N-channel MISFET corresponding to the high-breakdown-voltage N-channel MISFET of FIG. 2, which corresponds to a cross section along the line B-B' of FIG. 2.

FIG. 2 is an upper-surface layout diagram of a high-breakdown-voltage-portion N-channel MISFET (a basic structure according to a CVD gate insulating film method) in the semiconductor integrated circuit in the embodiment of the present invention. FIG. 3 is a cross-sectional view along the line A-A' of FIG. 2. FIG. 4 is a cross-sectional view along the line B-B' of FIG. 2. FIG. 5 is a cross-sectional view of the portion of a low-breakdown-voltage-portion N-channel MISFET corresponding to the high-breakdown-voltage N-channel MISFET of FIG. 2, which corresponds to a cross section along the line B-B' of FIG. 2. With reference to these drawings, the outline of the semiconductor integrated circuit device in the embodiment of the present invention will be described.

First, a plan structure of the high-breakdown-voltage MISFET will be described. Hereinbelow, a specific description will be given using an N-channel device in the high-breakdown-voltage N-channel device region 34 of FIG. 2 As shown in FIG. 2, an N-type source region 36n (first source region), and an n-type drain region 37n (first drain region) are provided in a P-type deep well HPW in the surface region of a device-side face 11a of a P-type single-crystal silicon substrate 11 so as to oppose each other in the direction of a channel length Lg with a channel region 12 (first channel region) of a high-breakdown-voltage MISFET 64 (FIG. 94) surrounded by a P-type guard ring region 39 being interposed therebetween. Over these impurity doped regions, an indiscrete STI field insulating film STI1 (first field insulating film) is provided, which has an opening 21 in the center portion thereof. Over the field insulating film STI1, a high-breakdown-voltage-portion gate insulating film (first gate insulating film or a region covered with the first gate insulating film) 14 made of a silicon dioxide film deposited by CVD (Chemical Vapor Deposition) or the like is provided so as to cover the channel region 12 such that the entire periphery thereof is located over the field insulating film STI1. Further, over the field insulating film STI1, a gate electrode 15n (first gate electrode film) made of an N-type polysilicon film or the like is provided so as to span the high-breakdown-voltage-portion gate insulating film 14 in the direction (gate width direction) of a channel width Wg. Of the region over the gate electrode 15n, a region 10 where the high-breakdown-voltage gate insulating film 14 is not present thereunder is provided with a gate contact portion 8 (first gate contact portion) of the high-breakdown-voltage MISFET. The gate contact portion 8 includes a plurality of gate contact electrodes 18h (tungsten plugs, which holds true hereinafter), and the like. In respective end portions of the N-type source region 36n and the N-type drain region 37n, an N-type high-concentration source contact region 26n and an N-type high-concentration drain contact region 27n are provided. Over the N-type high-concentration source contact region 26n and the N-type high-concentration drain contact region 27n, a plurality of N-type source contact electrodes 16hn and a plurality of N-type drain contact electrodes 17hn (metal plugs each having a first diameter) are provided. In the P-type guard ring region 39, a P-type high-concentration guard ring contact region 29p is provided, and coupled to a predetermined reference potential by a large number of P-type guard ring contact electrodes. The field insulating film STI outside the P-type high-concentration guard ring contact region 29p is two-dimensionally separated from the field insulating film STI1 inside the P-type high-concentration guard ring contact region 29p by the p-type high-concentration guard ring contact region 29p.

Next, the cross section along the line A-A' (in the channel length direction) of FIG. 2 will be described. As shown in FIG. 3, a deep P-well region HPW (well region for the high-breakdown-voltage N-channel MISFET) is provided in the device-side principal face of the low-concentration P-type Si single-crystal substrate 11. In the surface region of the device-side principal face in the deep P-well region HPW, the N-type source region 36n and the N-type drain region 37n are each provided so as to cover the field insulating film STI1 from thereunder. In the respective surfaces of the N-type source region 36n and the N-type drain region 37n, the N-type high-concentration source contact region 26n and the N-type high-concentration drain contact region 27n having impurity concentrations higher than those of the N-type source region 36n and the N-type drain region 37n are provided. That is, the source region of the high-breakdown-voltage N-channel MISFET includes the N-type source region 36n and the N-type high-concentration source contact region 26n, and the drain region of the high-breakdown-voltage N-channel MISFET includes the N-type source region 37n and the N-type high-concentration source contact region 27n. Around the N-type source region 36n and the N-type drain region 37n, the high-breakdown-voltage-portion P-type guard ring region 39 is provided so as to surround them. In the surface of the high-breakdown-voltage P-type guard ring region 39, the P-type high-concentration guard ring contact region is provided. Over the channel region 12, the CVD gate insulating film 14 extends. Over the CVD gate insulating film 14, an N-type polysilicon gate electrode 15n having sidewalls 22 is provided. Substantially the entire surface of the device-side face (except for contact openings) of the semiconductor substrate 11 including an upper surface 15a (upper-level portion) of the N-type polysilicon gate electrode 15n is covered with a silicon nitride film 23 as an etch stop film. Over the silicon nitride film 23, a planar pre-metal insulating film 24 such as a silicon dioxide film deposited with, e.g., HDP (High Density Plasma) is provided (the pre-metal insulating film indicates a primary interlayer insulating film portion in a layer upper than that of the silicon substrate, and lower than that of a first-layer aluminum wiring. See FIG. 95). The contact holes are opened to extend through the pre-metal insulating film 24 and the silicon nitride film 23. In the contact holes, tungsten plugs 16hn, 17hn, and 19hp are buried.

Next, the cross section along the line B-B' of FIG. 2 (in the channel width direction) will be described. As shown in FIG. 4, on an upper surface 15b (lower-level portion) of the N-type polysilicon gate electrode 15n, a gate contact electrode 18h (a single or a plurality of metal plugs each having the first diameter, and provided in a first gate contact portion) is provided.

Next, for a comparison with the high-breakdown-voltage N-channel device, the portion of the low-breakdown-voltage N-channel MISFET 66 (FIG. 94) corresponding to FIG. 4 will be described with reference to FIG. 5. As shown in FIG. 5, the low-breakdown-voltage N-channel MISFET 66 is formed in a P-type well region PW formed in the surface region of a deep N-well region HNW formed in the device-side face of the same P-type silicon substrate as that of the high-breakdown-voltage N-channel MISFET 64. Over a gate insulating film (a second gate insulating film) 9 deposited over a channel region 13 (a second channel region) by thermal oxidation or the like, an N-type polysilicon gate electrode 25n (in the same layer as that of the high-breakdown-voltage MISFET) is formed. To an upper surface 25a (at substantially the same height as that of the lower-level upper surface 15b of the high-breakdown-voltage gate electrode 15), a gate contact electrode 18 (a single or a plurality of metal plugs each having the first diameter, and provided in a second gate contact portion) is coupled.

As described above, the high-breakdown-voltage N-channel MISFET (which substantially corresponds also to the high-breakdown-voltage P-channel MISFET hereinafter) in the present embodiment has a structure in which, in the channel width direction, the end portion of the high-breakdown-voltage gate insulating film (CVD gate insulating film) 14 is located inwardly of the end portion of the gate electrode 15n and between the gate contact portion 8 and the channel end portion. That is, in the channel width direction, the length of the gate insulating film 14 is smaller than the length of the gate electrode 15n, and larger than the length of a channel formation portion as a region interposed in the field insulating film STI1. In addition, the gate contact portion 8 is located between the end portion of the gate insulating film 14 and the gate electrode 15n. Accordingly, the depth of the gate contact in the high-breakdown-voltage portion is equal to the depth of the gate contact in the low-breakdown-voltage portion to facilitate manufacturing. As a result, the diameter (diameter of the lower end portion) of the gate contact in the high-breakdown-voltage portion decreases equally to the diameter of the gate contact in the low-breakdown-voltage portion, and a layout margin for the gate contact in the high-breakdown-voltage portion increases.

Additionally, in the channel width direction, the end portion of the high-breakdown-voltage gate insulating film 14 (CVD gate insulating film) is located inwardly of the end portion of the gate electrode 15n and between the gate contact portion 8 and the channel end portion. This allows a margin for the distance between the end portion of the gate electrode and the P-well power supply ring 29p to be reduced (since the CVD gate insulating film is not present therebetween), and allows higher integration.

Further, since the gate contact portion 8 is not present in the channel length direction, there is an advantage that the width of the STI isolation can be reduced in a region with a relatively low operating voltage (e.g., a high-breakdown-voltage region with an operating voltage of not more than 20 V).

Additionally, as shown in FIG. 2, the gate insulating film 14 is formed to have a plan configuration which is larger, in the channel width direction and the channel length direction, than opening 21 of the field insulating film substantially corresponding to the channel region. As a result, as shown in the description of the subsequent manufacturing process, the silicon dioxide film in a trench is recessed at the end portion of the field insulating film STI through wet etching used in removing the gate insulating film 14 in a low-breakdown-voltage region or the like. This causes the degradation of a breakdown voltage at the end portion of the field insulating film STI, and the problem of the occurrence of a kink phenomenon or the like. Thus, by forming the gate insulating film 14 in the plan configuration which is larger, in the channel width direction and the channel length direction, than the opening 21 of the field insulating film substantially corresponding to the channel region, the recess in the silicon dioxide film at the end portion of the field insulating film STI1 can be prevented to allow an improvement in the breakdown voltage of the MISFET.

The same holds true in an example of Section 4, but the advantage of easier manufacturing is offered in a region where the gate insulating film is relatively thick (with a thickness of, e.g., 35 nm or more), because the CVD insulating film (specifically a composite film of a thermal oxide film and a CVD silicon dioxide film thicker than the thermal oxide film) is used as the gate insulating film in the region with the thick gate insulating film. This is because, when a thermal oxide gate insulating film is used with the thick gate insulating film, the STI insulating film is significantly scraped due to the etching rate difference between the thermal oxide film and the CVD oxide film in removing the thermal oxide gate insulating film in the low-breakdown-voltage portion. Conversely, in a region where the gate insulating film is relatively thin (with a thickness of, e.g., less than 35 nm), using a high-breakdown-voltage gate insulating film as the thermal oxide film (in Sections 5 and 6) allows easier manufacturing in terms of film thickness control.

It will be easily appreciated that the above-mentioned advantages (including those described in Section 4) associated with aspects other than the material of the gate insulating film are also achievable in a device corresponding to a plan structure described in Sections 5 and 6.

3. Description of Cross-Sectional Flow in Each Device Portion in Manufacturing Process of Semiconductor Integrated Circuit Device Including High-Breakdown-Voltage-Portion MISFET (Basic Structure 1 According to CVD Gate Insulating Film Method: Wg-Direction Contact Method) in Embodiment of Present Invention (Primarily Using FIGS. 6, 7 to 42, 93, and 95)

In an LCD driver in which a large number of high-breakdown-voltage elements (which will be described specifically using elements each having an operating voltage of about 28 V to 30 V), a current leading-edge product corresponds to a 130 nm technology node so that a specific description will be given using a 130 nm process as an example (the same holds true in the other sections).

Figure 6:
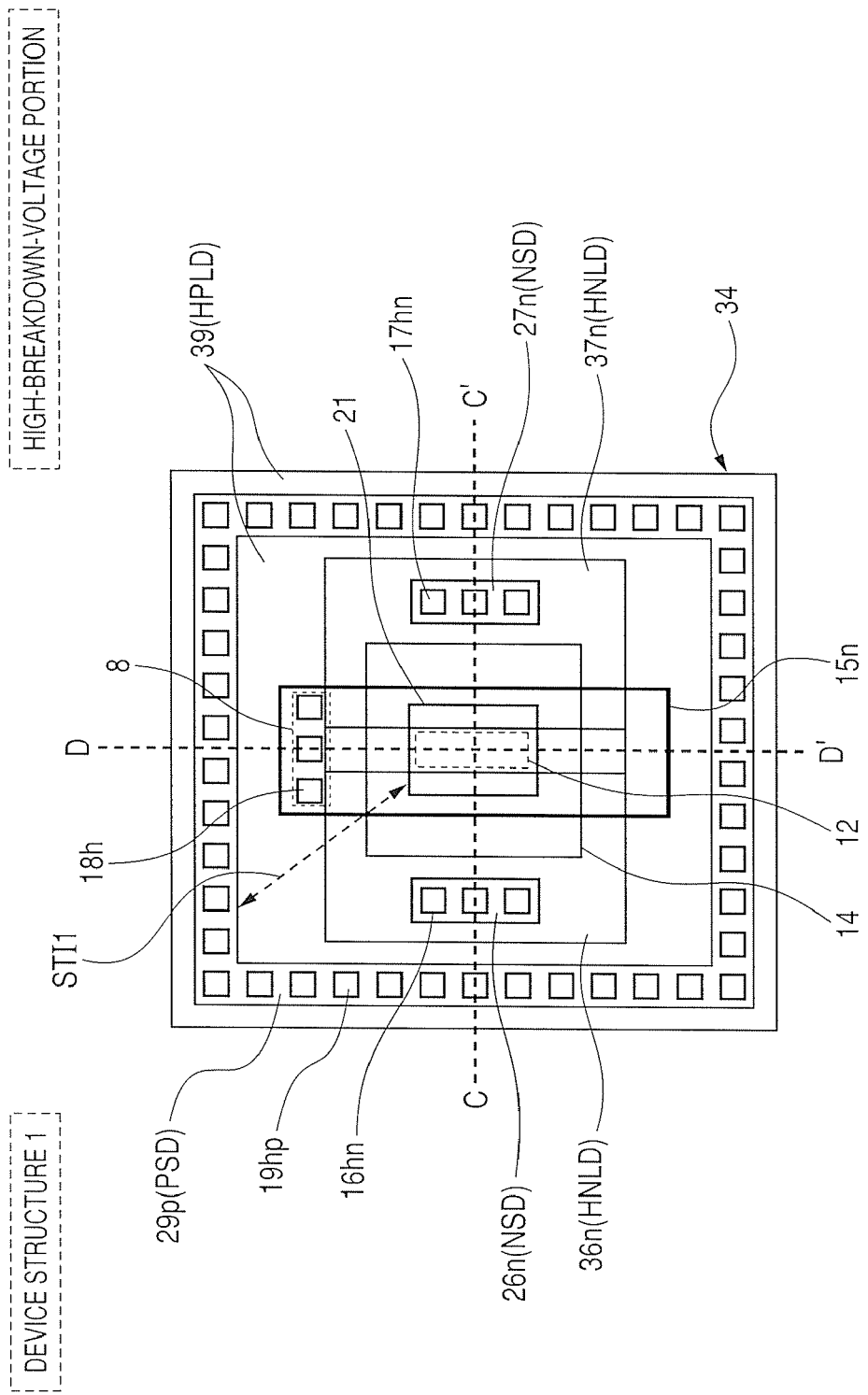
FIG. 6 is an upper-surface layout diagram of the high-breakdown-voltage-portion N-channel MISFET (a basic structure 1 according to the CVD gate insulating film method) in the semiconductor integrated circuit device in the embodiment of the present invention, which corresponds to FIG. 2.

FIG. 6 is an upper-surface layout diagram of the high-breakdown-voltage N-channel MISFET (a basic structure 1 according to a CVD gate insulating film method) in the semiconductor integrated circuit device in the embodiment of the present invention, which corresponds to FIG. 2.

FIGS. 7, 16, 25, and 34 illustrate a STI (Shallow Trench Isolation) step. FIGS. 8, 17, 26, and 35 illustrate a deep well step. FIGS. 9, 18, 27, and 36 illustrate a step of forming the source/drain regions of the high-breakdown-voltage MISFET. FIGS. 10, 19, 28, and 37 illustrate a step of forming the gate insulating film of the high-breakdown-voltage MISFET.

Figure 95:
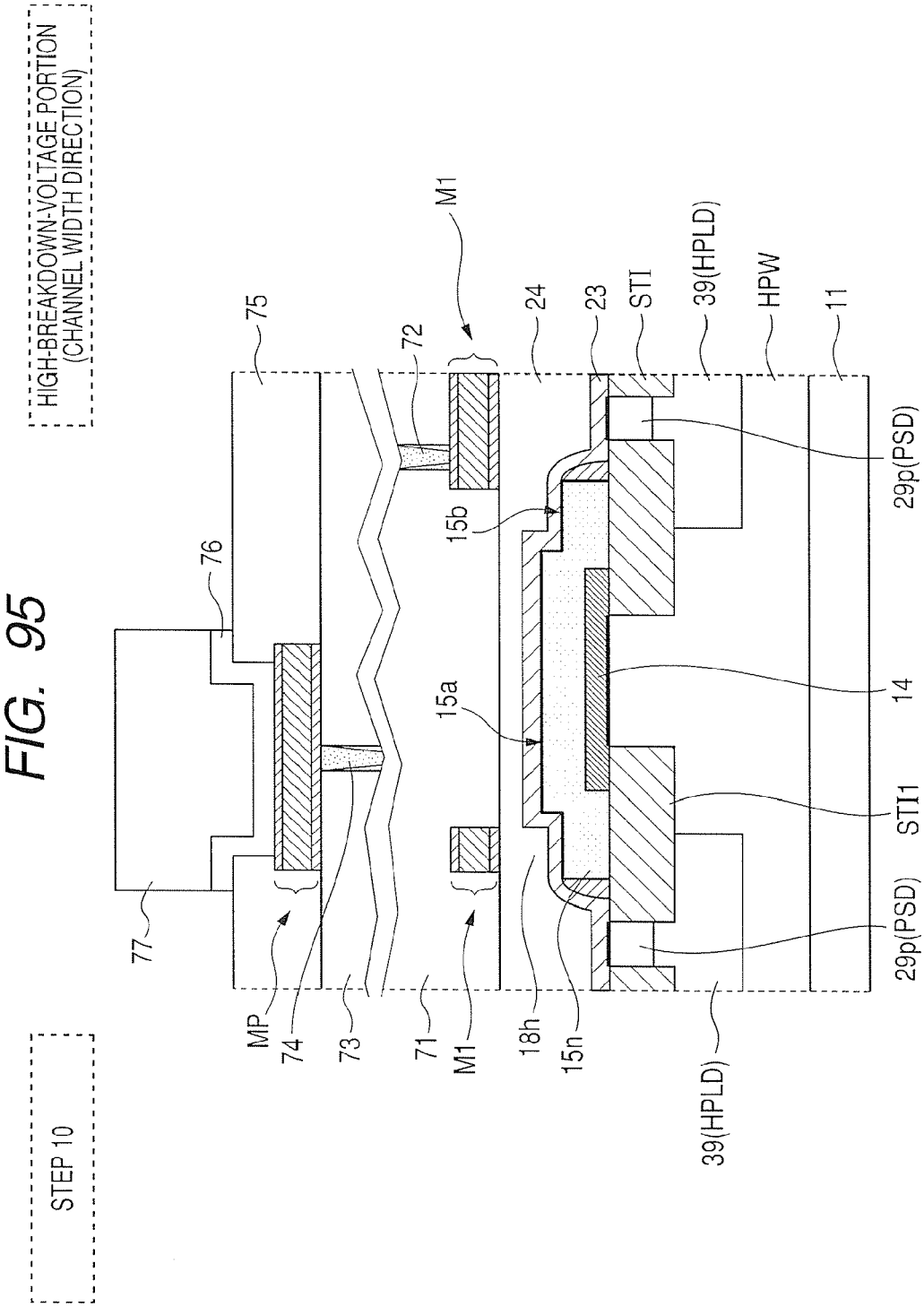
FIG. 95 is a device cross-sectional flow diagram (in a step of forming a metal wiring and the like in the high-breakdown-voltage portion, which is subsequent to FIG. 42) in the channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.

FIGS. 11, 20, 29, and 38 illustrate a step of forming the well region. FIGS. 12, 21, 30, and 39 illustrate a gate electrode patterning step. FIGS. 13, 22, 31, and 40 illustrate a step of forming a LDD (Lightly Doped Drain) and the sidewalls. FIGS. 14, 23, 32, and 41 illustrate a step of forming high-concentration source/drain contact regions. FIGS. 15, 24, 33, and 42 illustrate a pre-metal step. FIG. 95 illustrates a step of forming the metal wiring and the like. FIG. 93 is a process step correlation table showing correlations (simultaneous or pre/post relations) among FIGS. 7 to 42, 46 to 89, and 95.

The device upper-surface diagram of FIG. 6 shows a structure of a high-breakdown-voltage device basically corresponding to FIGS. 2 to 4. In FIG. 6, shapes and the like are optimized to achieve optimization as a mass-produced product. A cross section along the line C-C' of FIG. 6 is in the channel length direction, and a cross section along the line D-D' of FIG. 6 is in the channel width direction.

Hereinbelow, the manufacturing process will be described. As shown in FIGS. 7, 16, 25, and 34, a P-type single-crystal silicon wafer 11 having a diameter of, e.g., 300φ, and a relatively low concentration is prepared. In the surface region of the device-side face 11a (which is a device-side face 1a of the chip 1, i.e., a first principal surface after the division of the wafer 11 into individual devices, while the surface of the chip 1 or the semiconductor substrate opposite to the device-side face 1a is a back surface or a second principal surface 1b) thereof, the STI (Shallow Trench Isolation) field insulating films STI and STI1 (the depth of the trench is, e.g., about 300 nm) are formed. The field insulating film STI shown in the present embodiment is formed by forming the trench at a depth of about 300 nm in the semiconductor substrate, depositing an insulating film such as a silicon dioxide film over the semiconductor substrate including the inside of the trench, and then polishing the insulating film by a CMP method to bury the insulating film in the trench.

Figure 7:
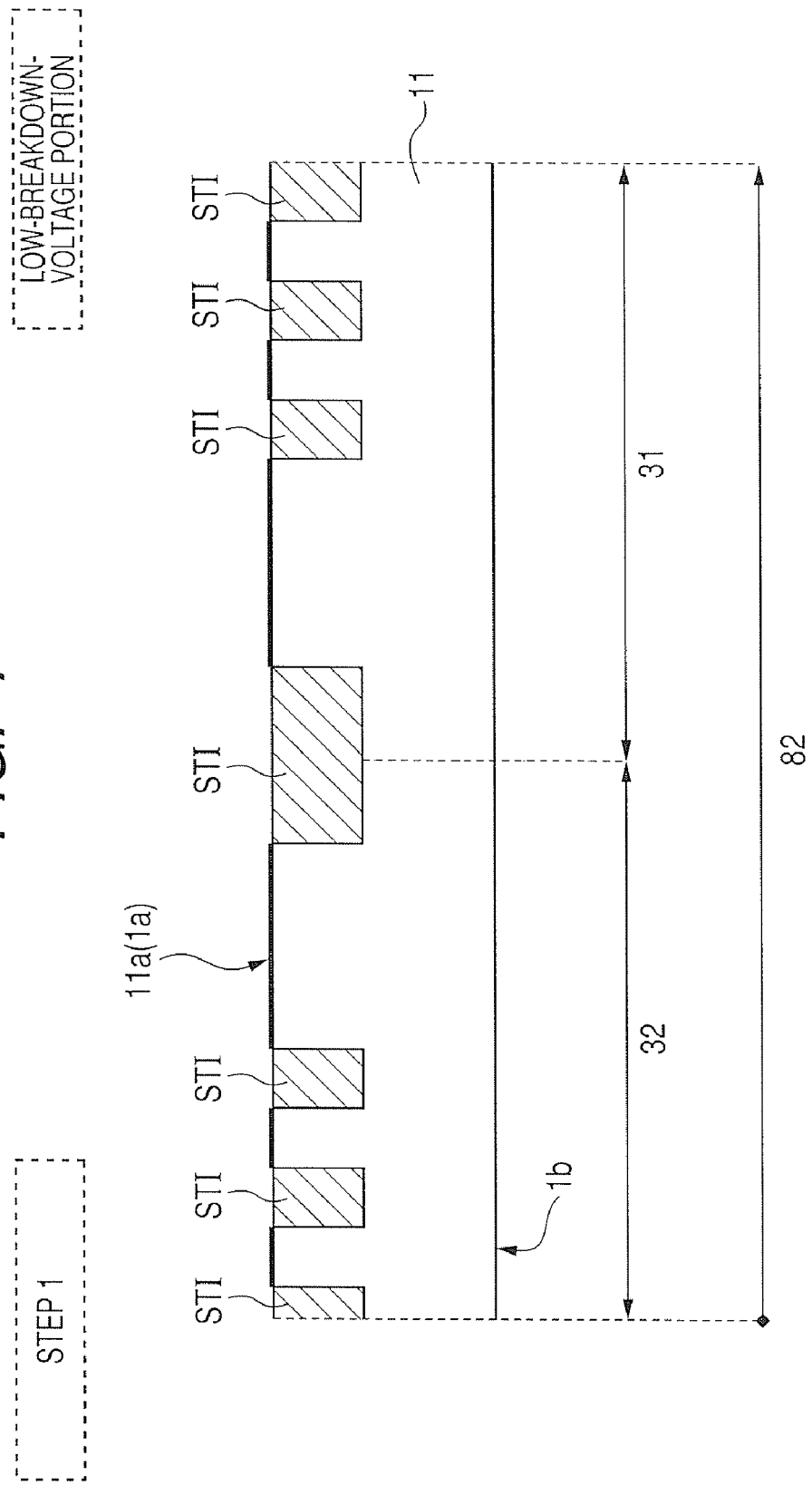
FIG. 7 is a device cross-sectional flow diagram (in a step of forming an isolation region in a low-breakdown-voltage portion) in a channel length direction for illustrating a wafer process for a CMIS (Complementary Metal Insulator Semiconductor) IC corresponding to the semiconductor integrated circuit device (using the basic structure 1 according to the CVD gate insulating film method in a high-breakdown-voltage portion) in the embodiment of the present invention.
Figure 8:
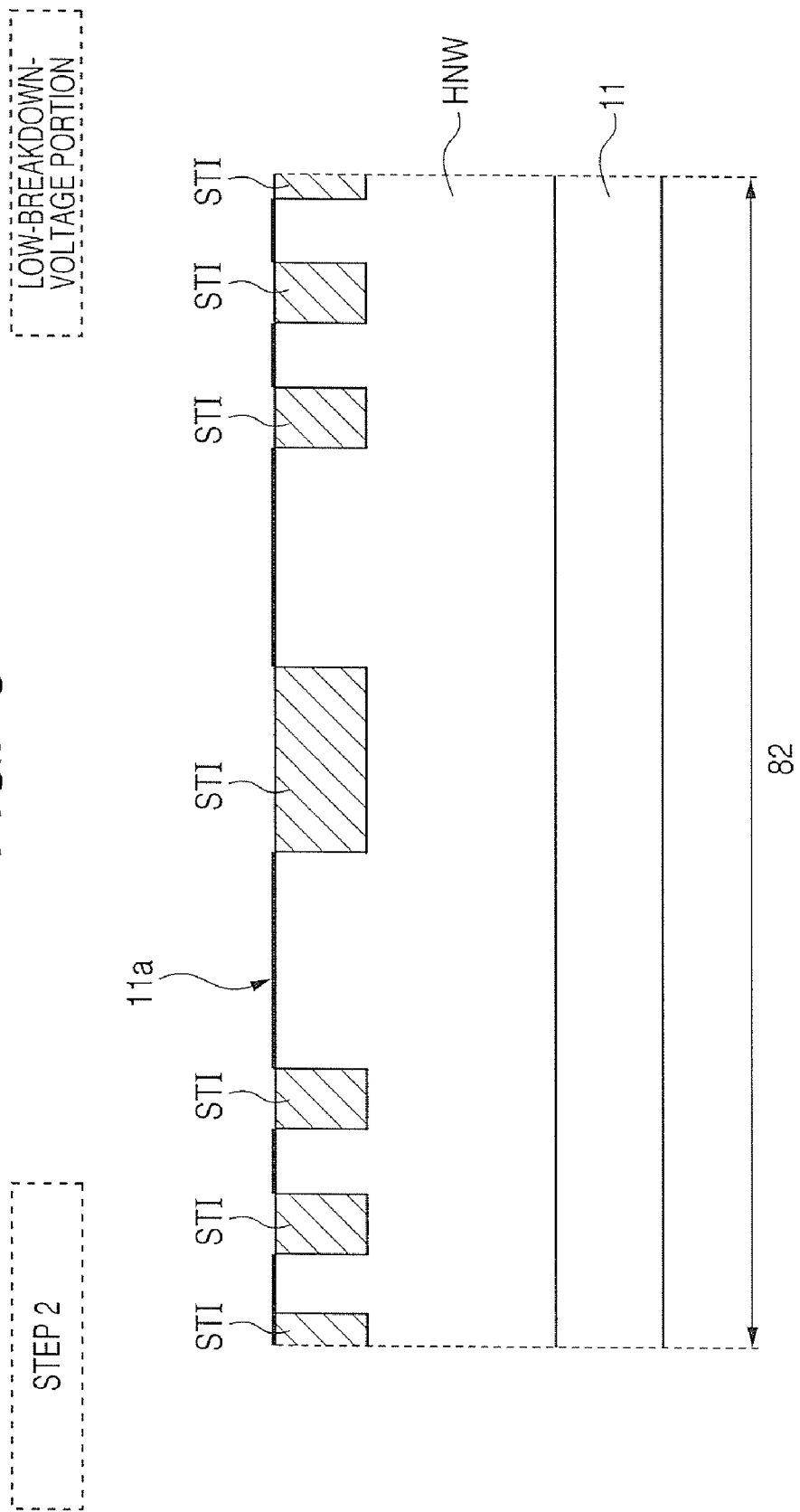
FIG. 8 is a device cross-sectional flow diagram (in a step of forming a deep N-well in the low-breakdown-voltage portion) in the channel length direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 9:
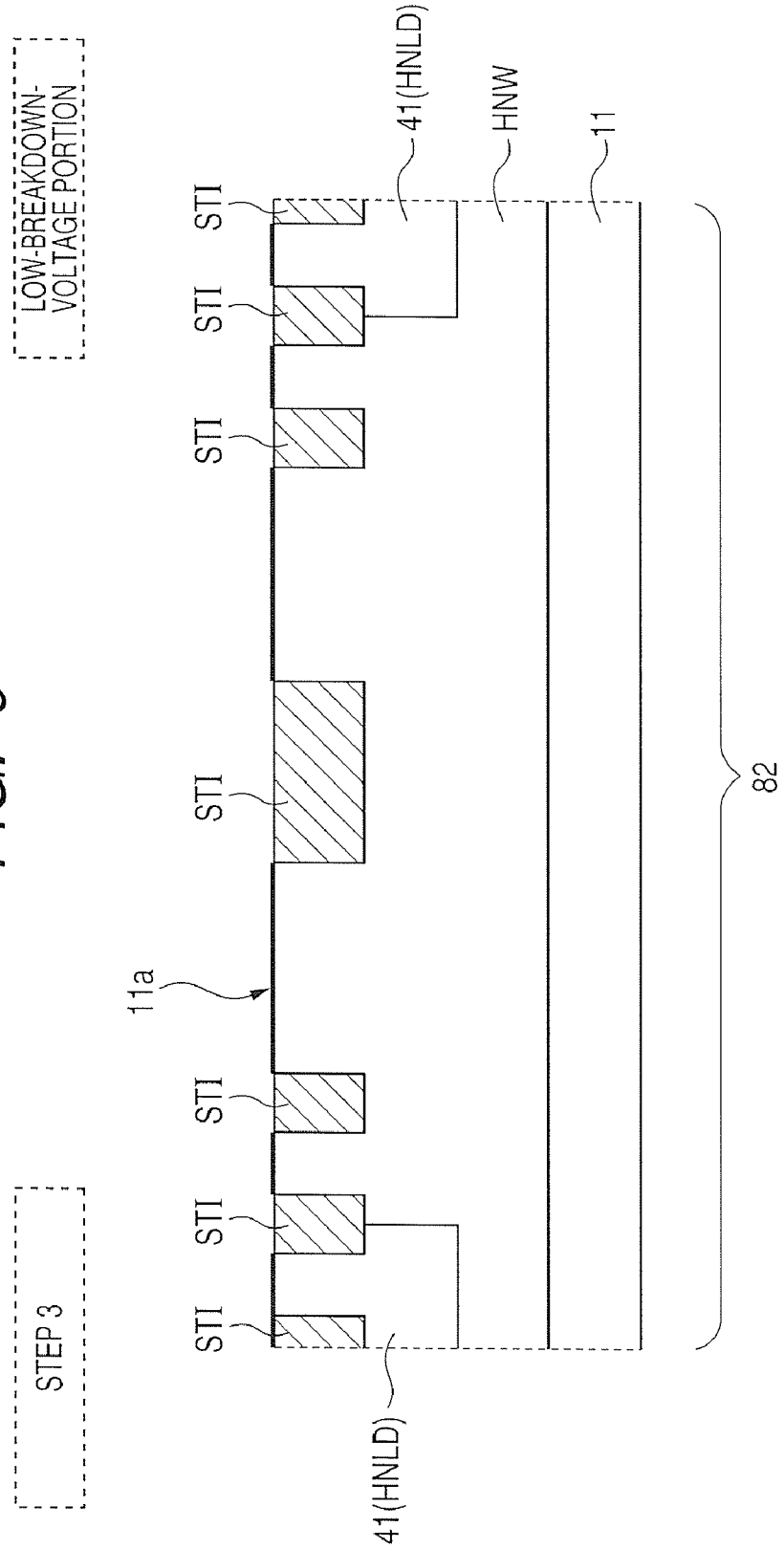
FIG. 9 is a device cross-sectional flow diagram (in a step of forming an N-type guard ring region in the low-breakdown-voltage portion) in the channel length direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 10:
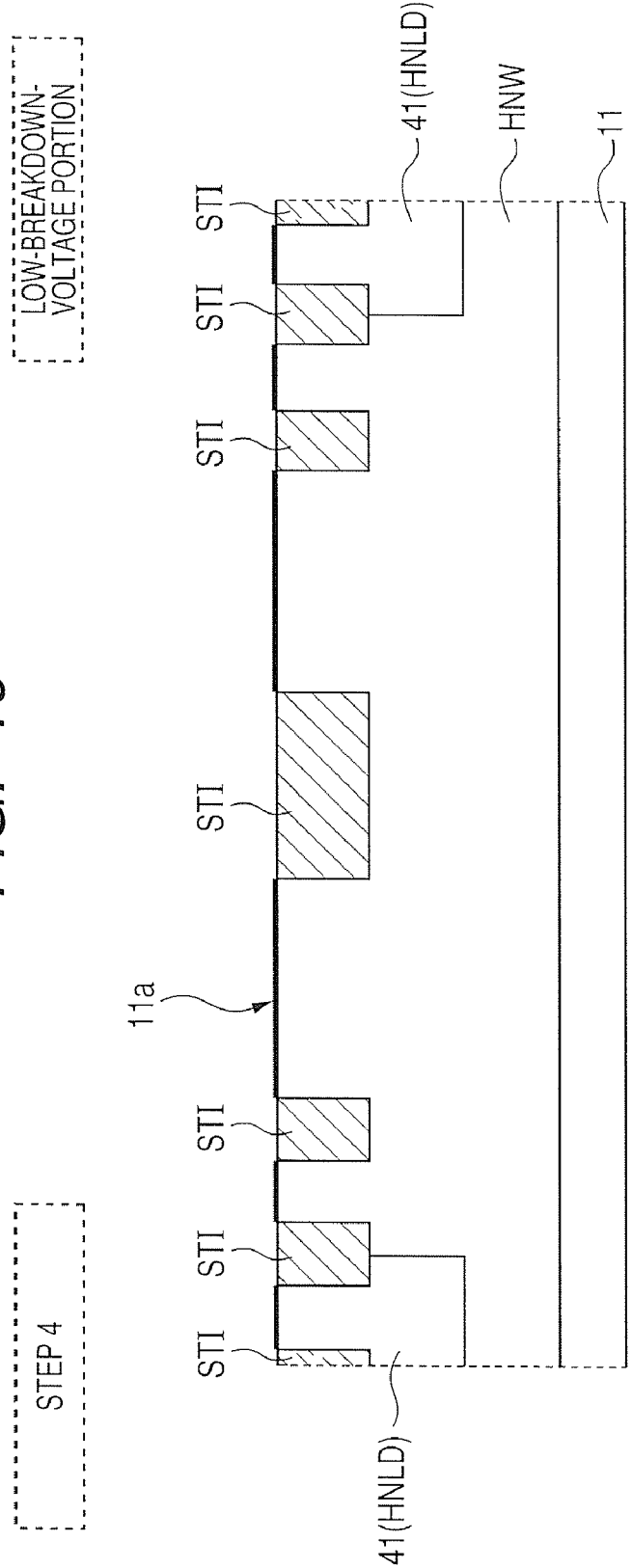
FIG. 10 is a device cross-sectional flow diagram (in a step 4 in the low-breakdown-voltage portion) in the channel length direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 11:
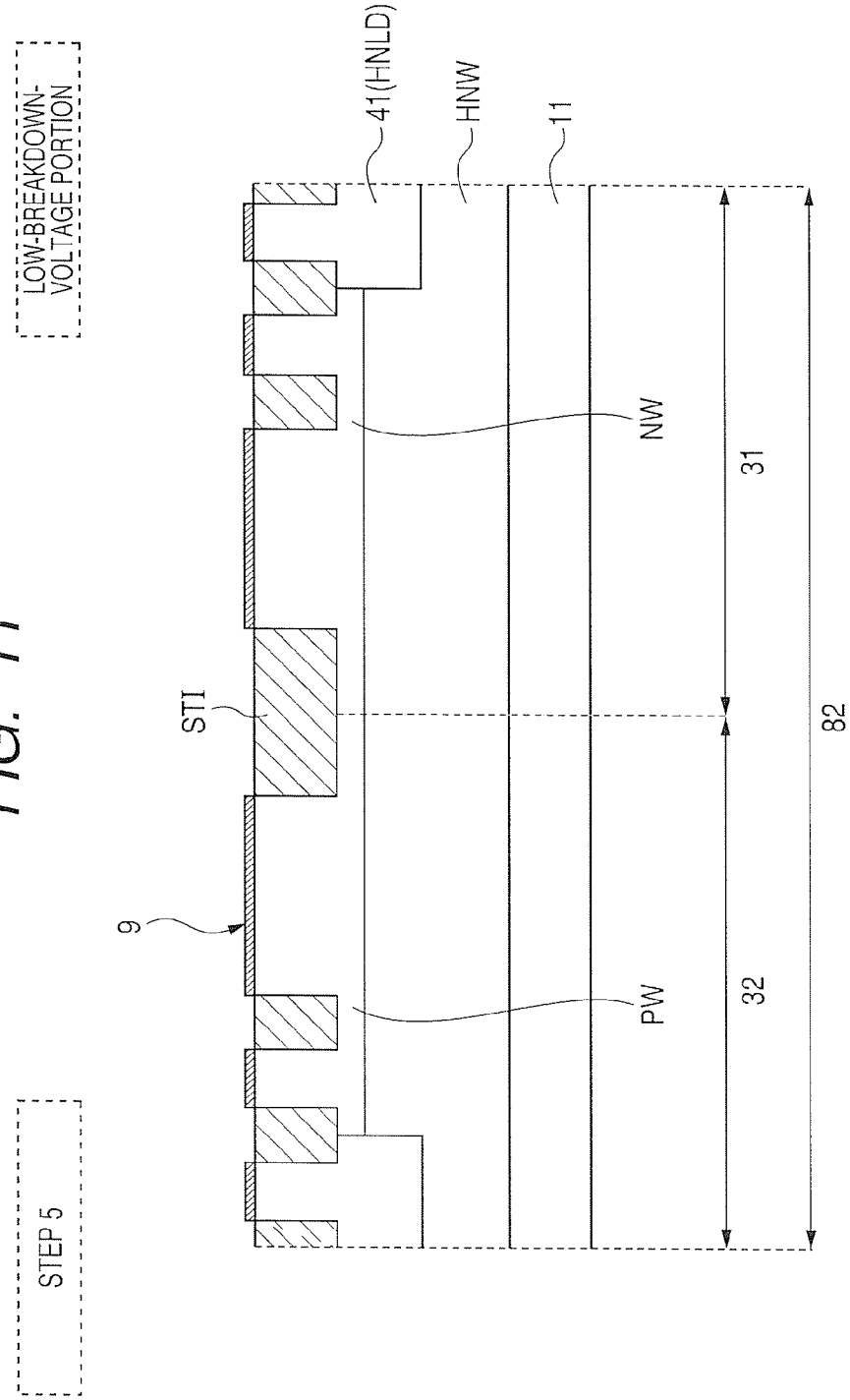
FIG. 11 is a device cross-sectional flow diagram (in the formation of both wells and a gate oxide film in the low-breakdown-voltage portion) in the channel length direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 12:
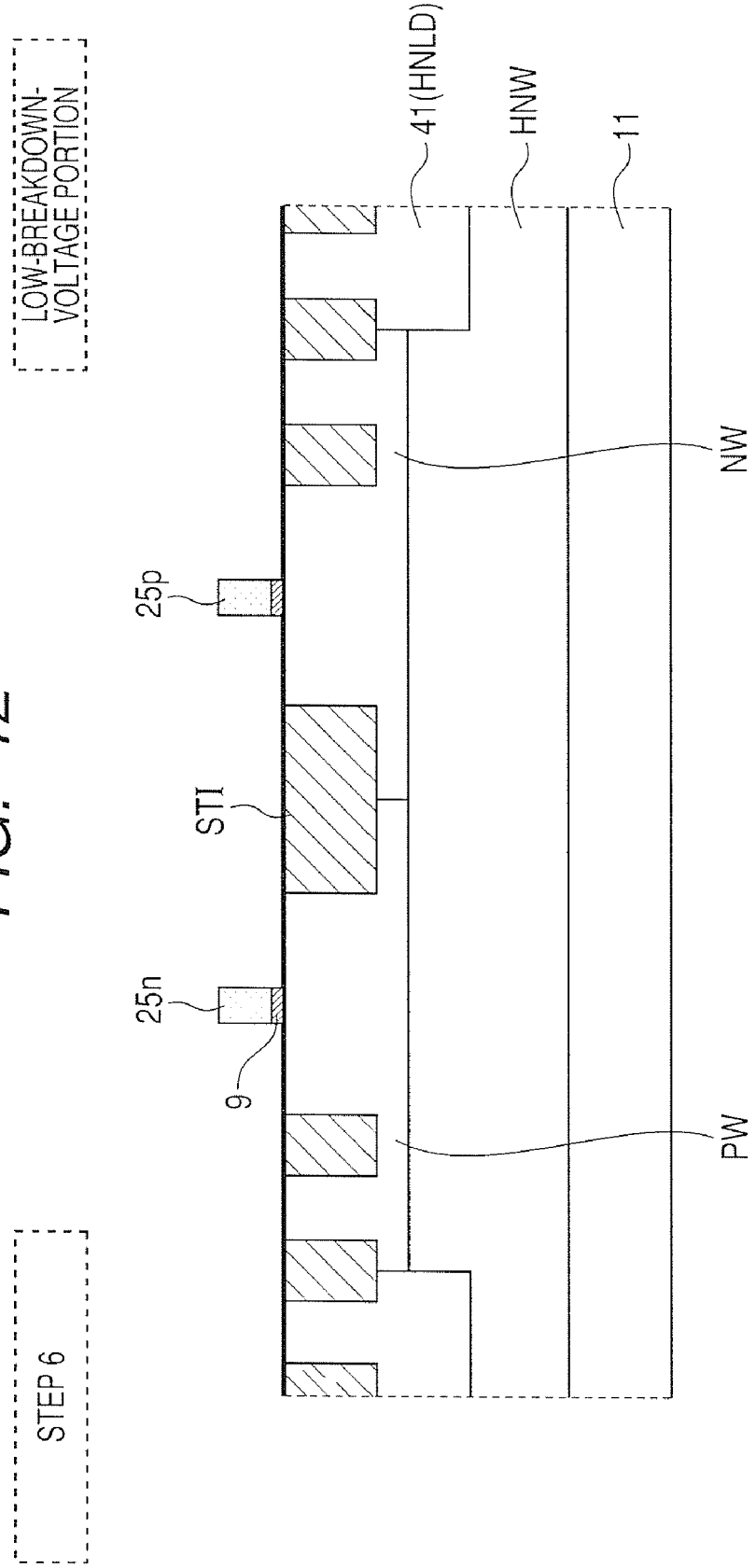
FIG. 12 is a device cross-sectional flow diagram (in a gate-electrode patterning step in the low-breakdown-voltage portion) in the channel length direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 13:
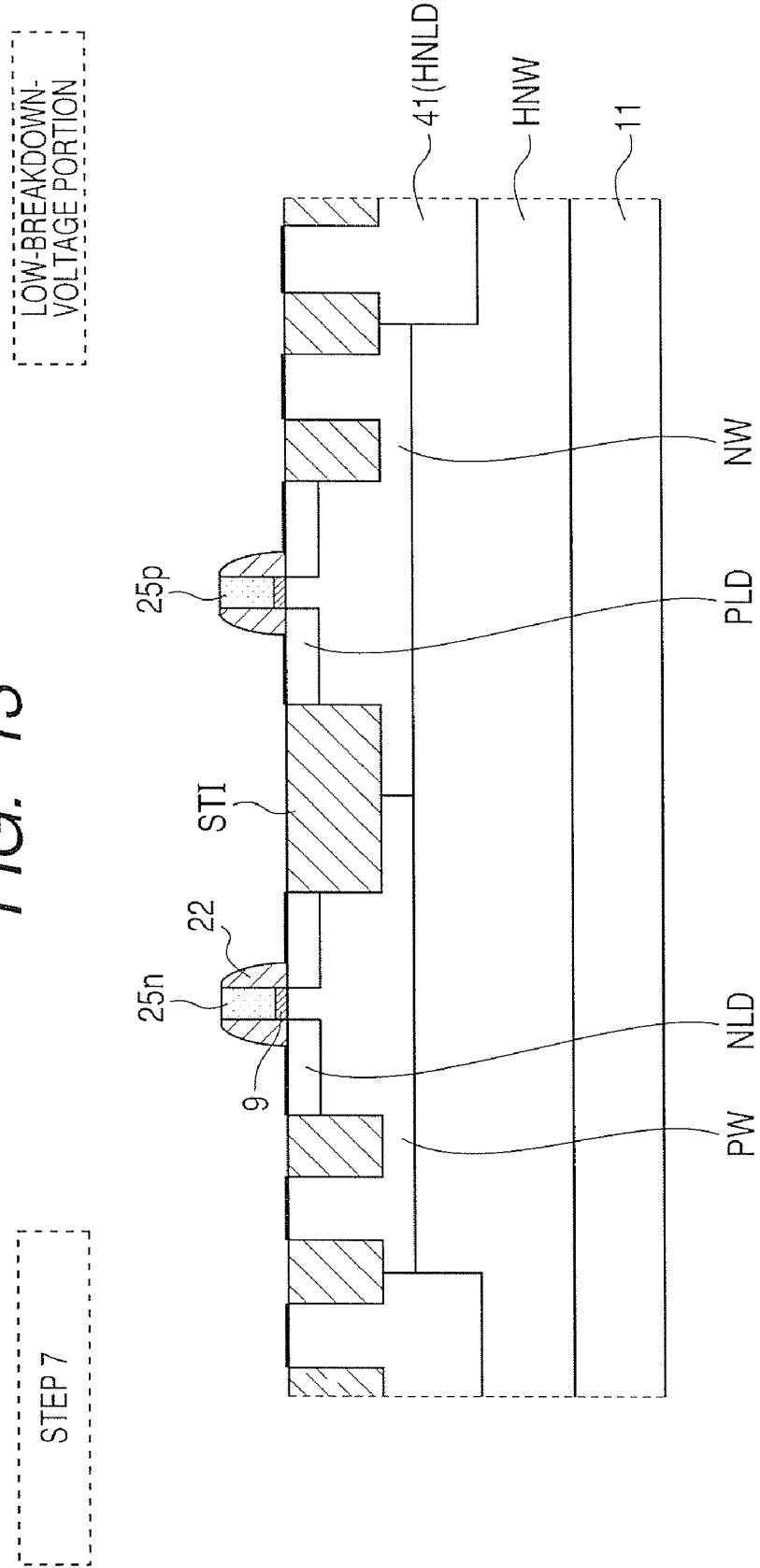
FIG. 13 is a device cross-sectional flow diagram (in a step of forming source/drain extension regions and sidewalls in the low-breakdown-voltage portion) in the channel length direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 14:
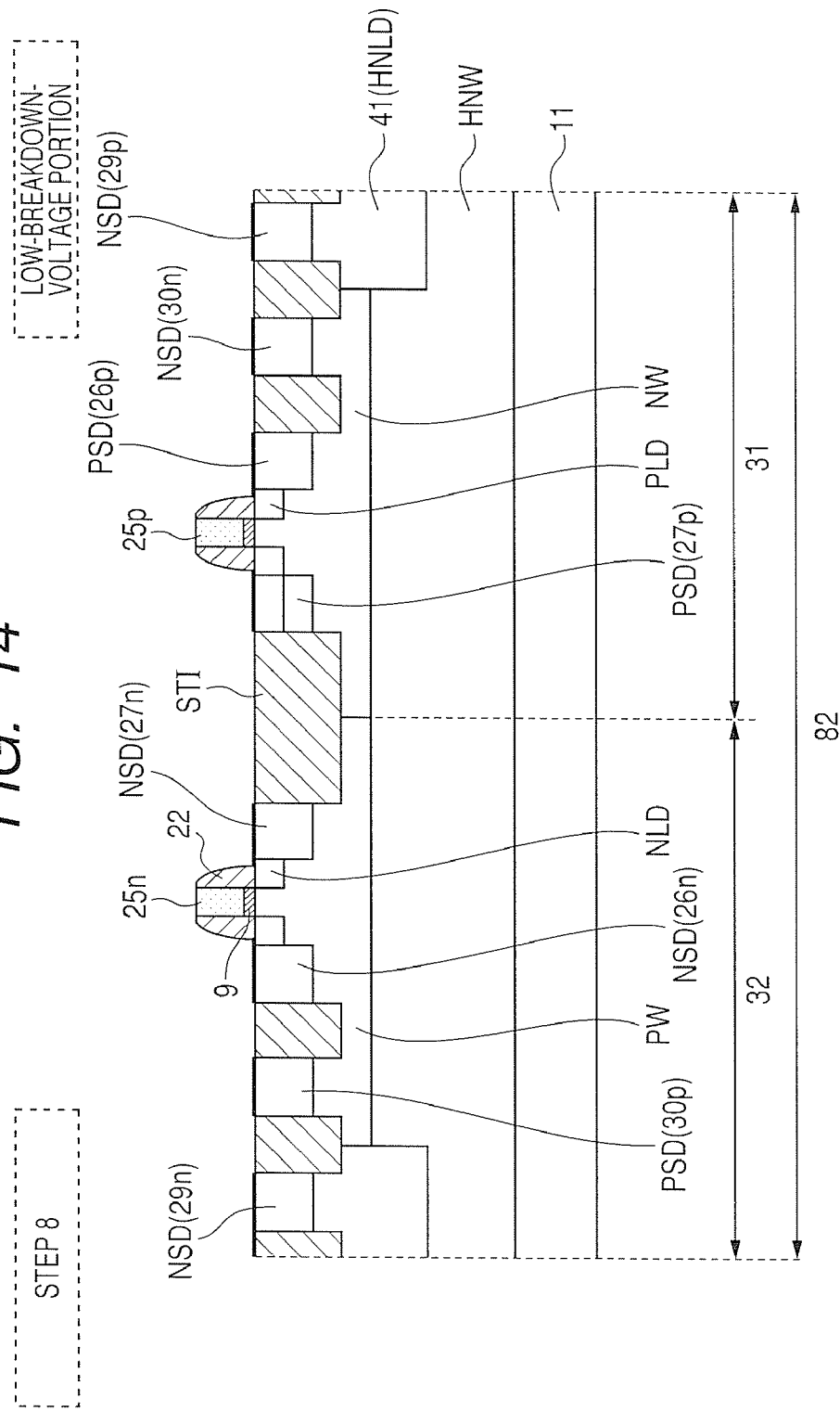
FIG. 14 is a device cross-sectional flow diagram (in a step of forming high-concentration source/drain regions and the like in the low-breakdown-voltage portion) in the channel length direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 15:
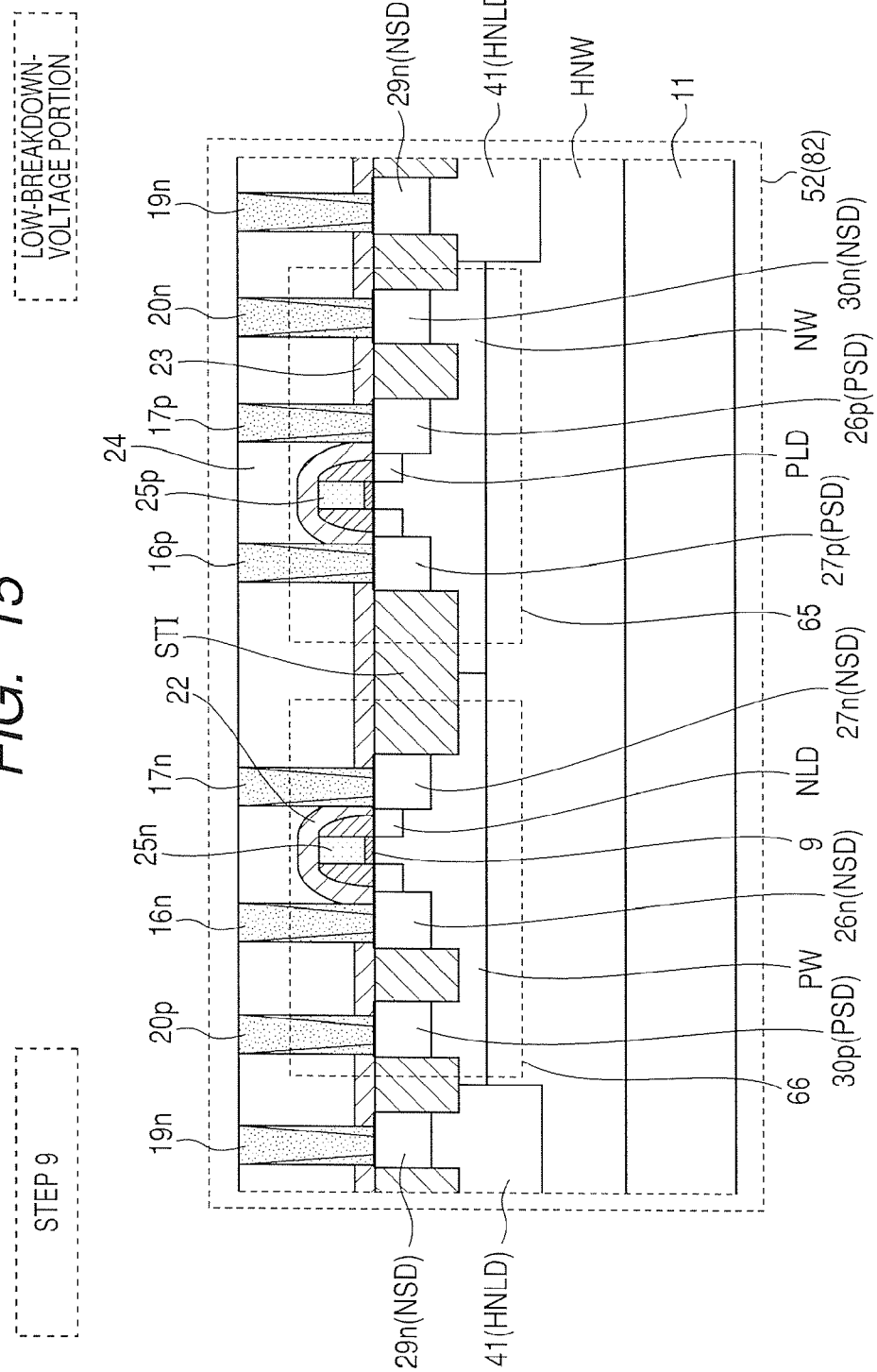
FIG. 15 is a device cross-sectional flow diagram (in a pre-metal step in the low-breakdown-voltage portion) in the channel length direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 16:
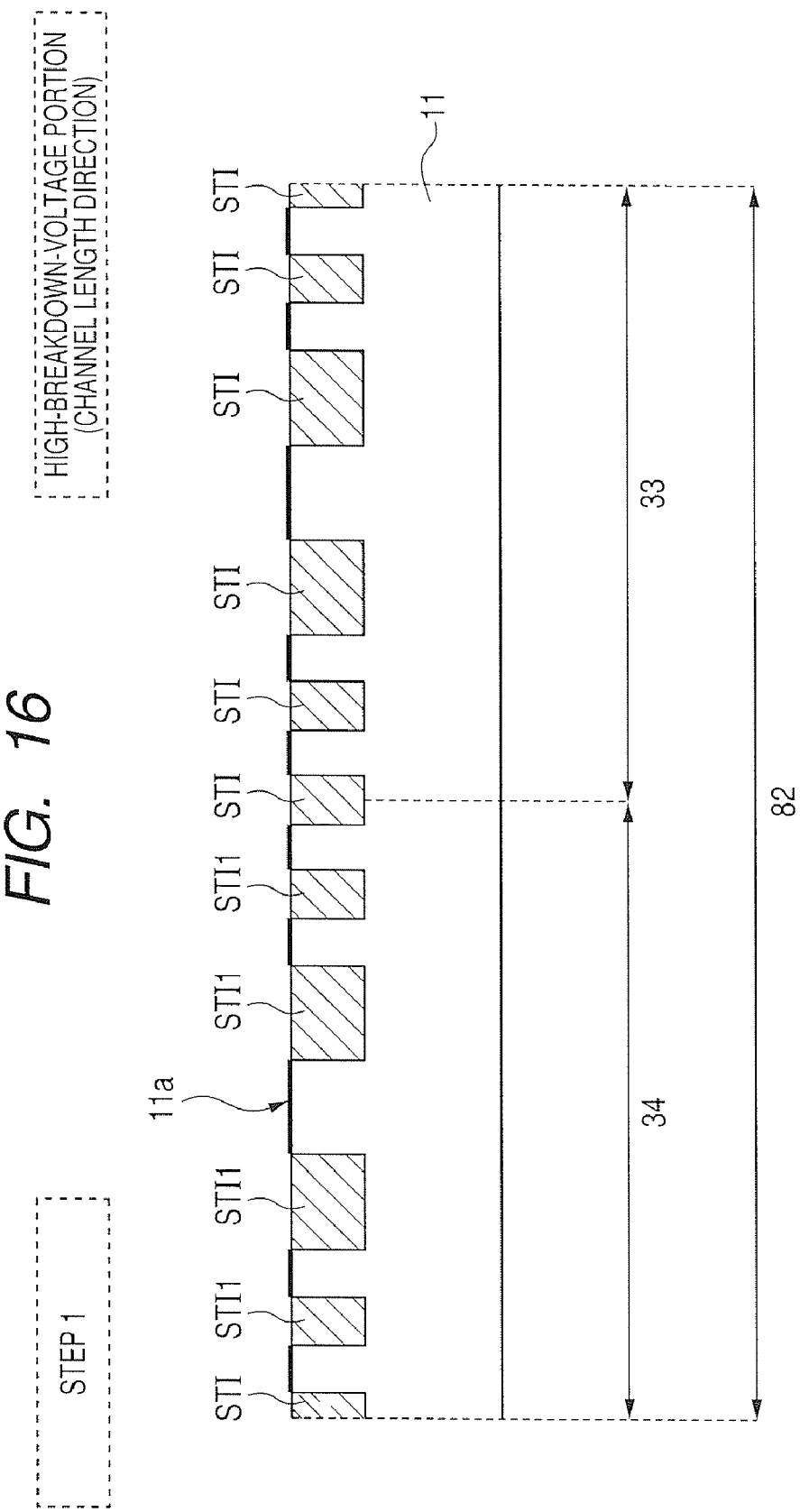
FIG. 16 is a device cross-sectional flow diagram (in a step of forming an isolation region in the high-breakdown-voltage portion) in the channel length direction (corresponding to a cross section along the line C-C' of FIG. 6, which holds true hereinafter) for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 17:
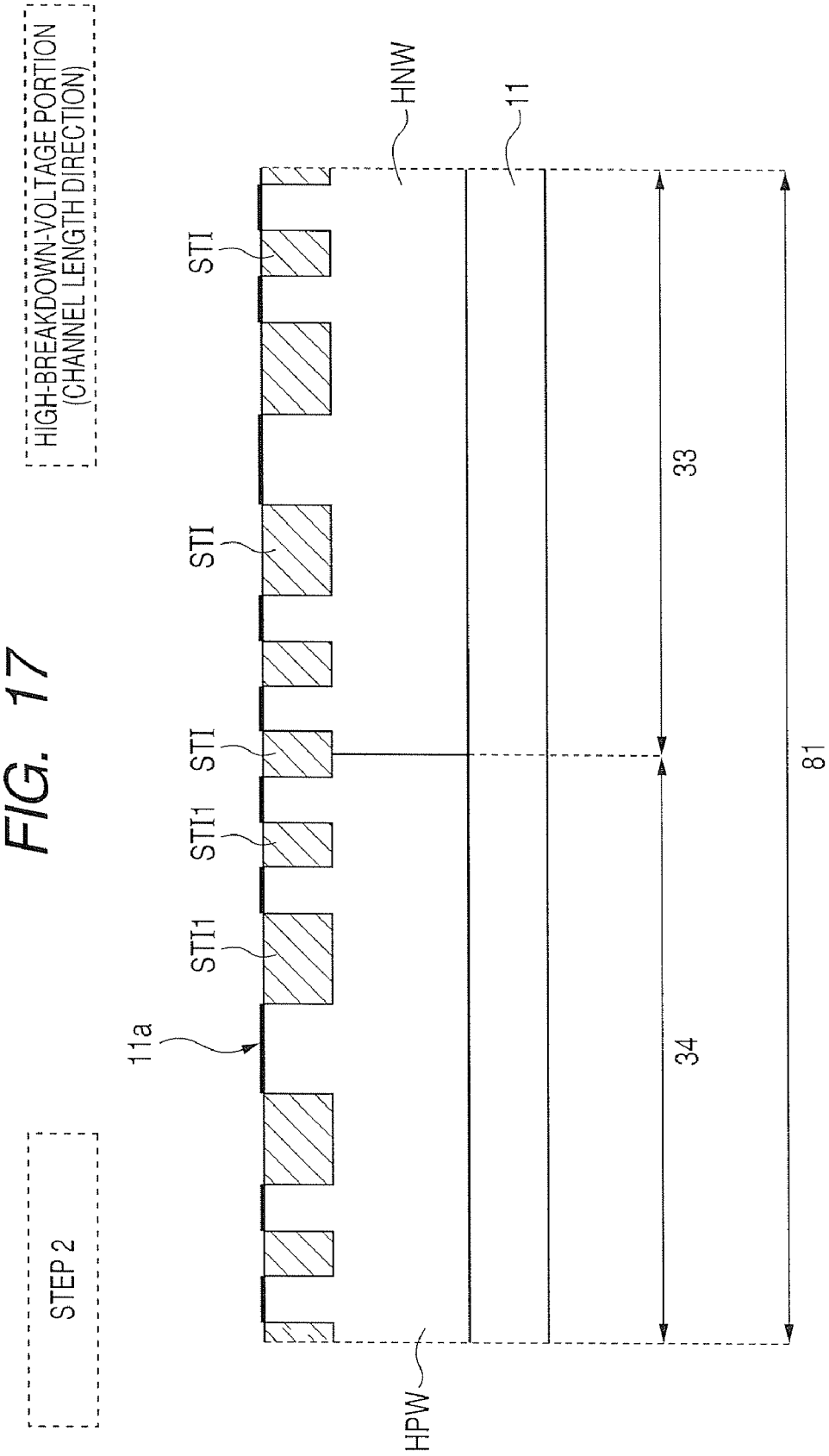
FIG. 17 is a device cross-sectional flow diagram (in a step of forming both deep well regions in the high-breakdown-voltage portion) in the channel length direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 18:
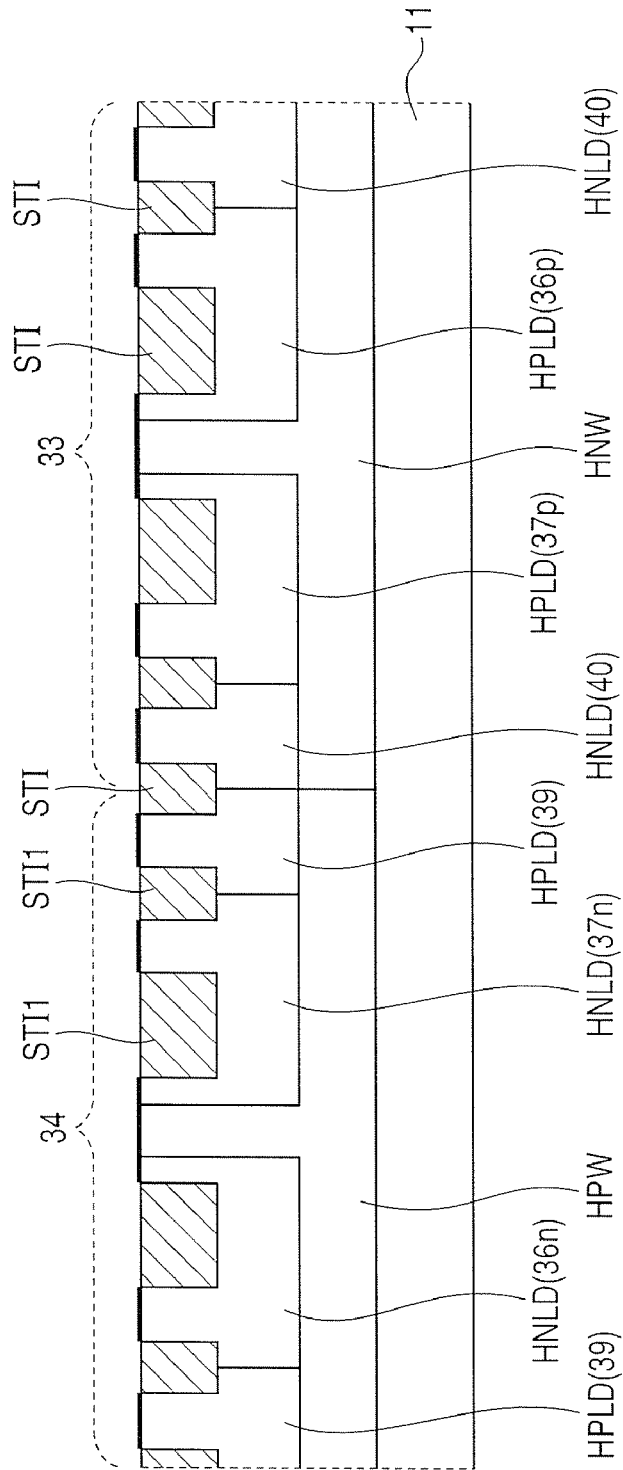
FIG. 18 is a device cross-sectional flow diagram (in a step of forming both source/drain regions in the high-breakdown-voltage portion) in the channel length direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 19:
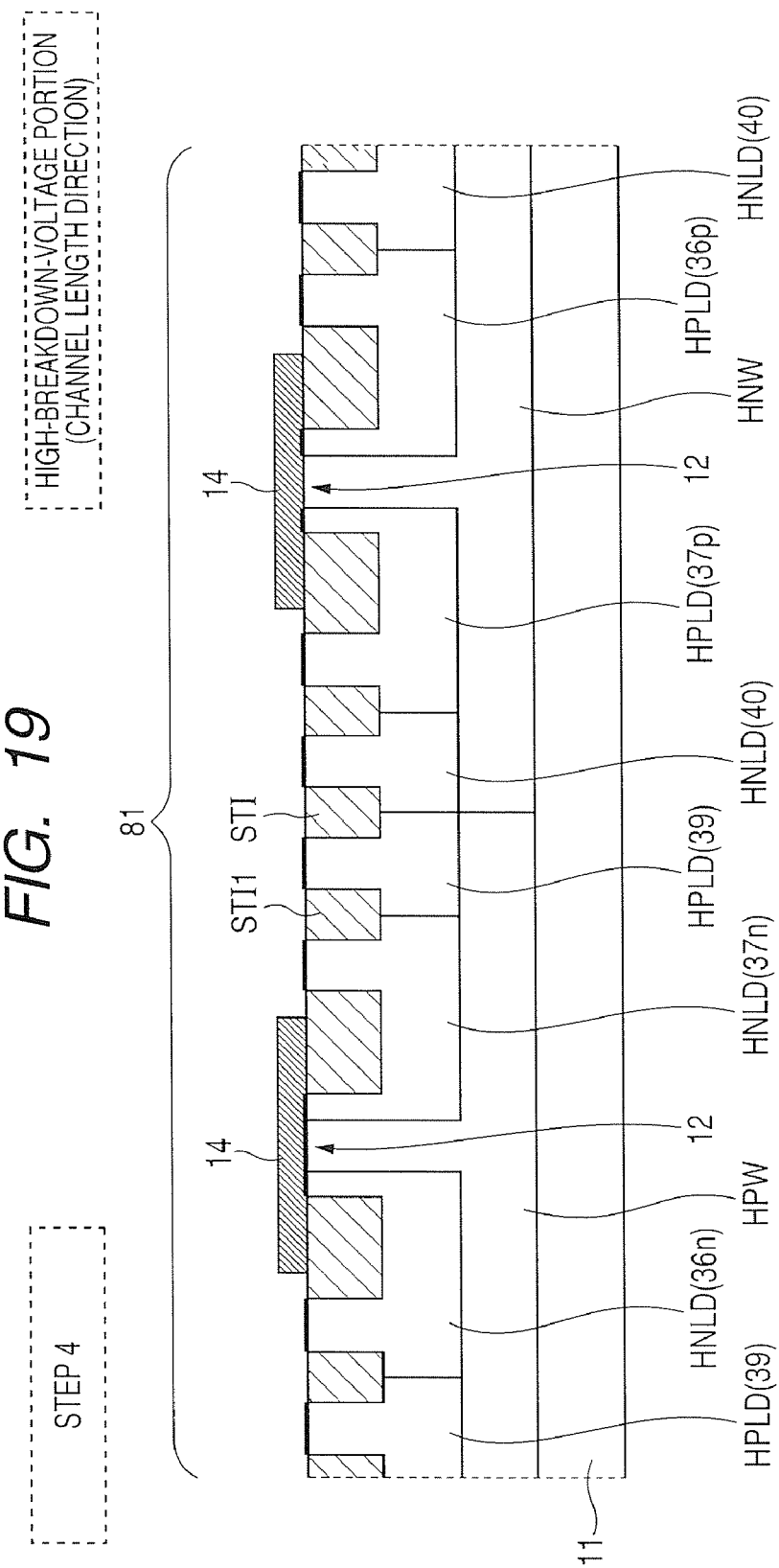
FIG. 19 is a device cross-sectional flow diagram (in a step of forming a CVD gate insulating film in the high-breakdown-voltage portion) in the channel length direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 20:
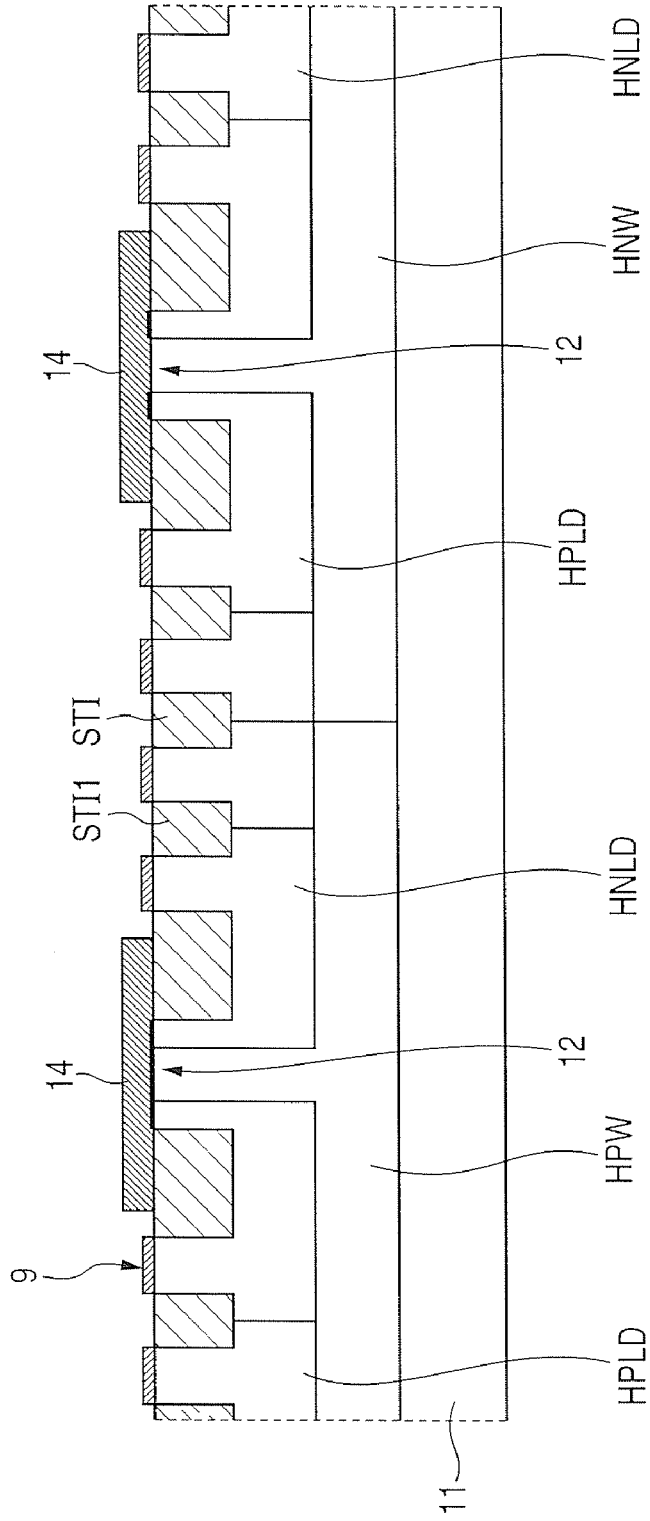
FIG. 20 is a device cross-sectional flow diagram (in a step 5 in the high-breakdown-voltage portion) in the channel length direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 21:
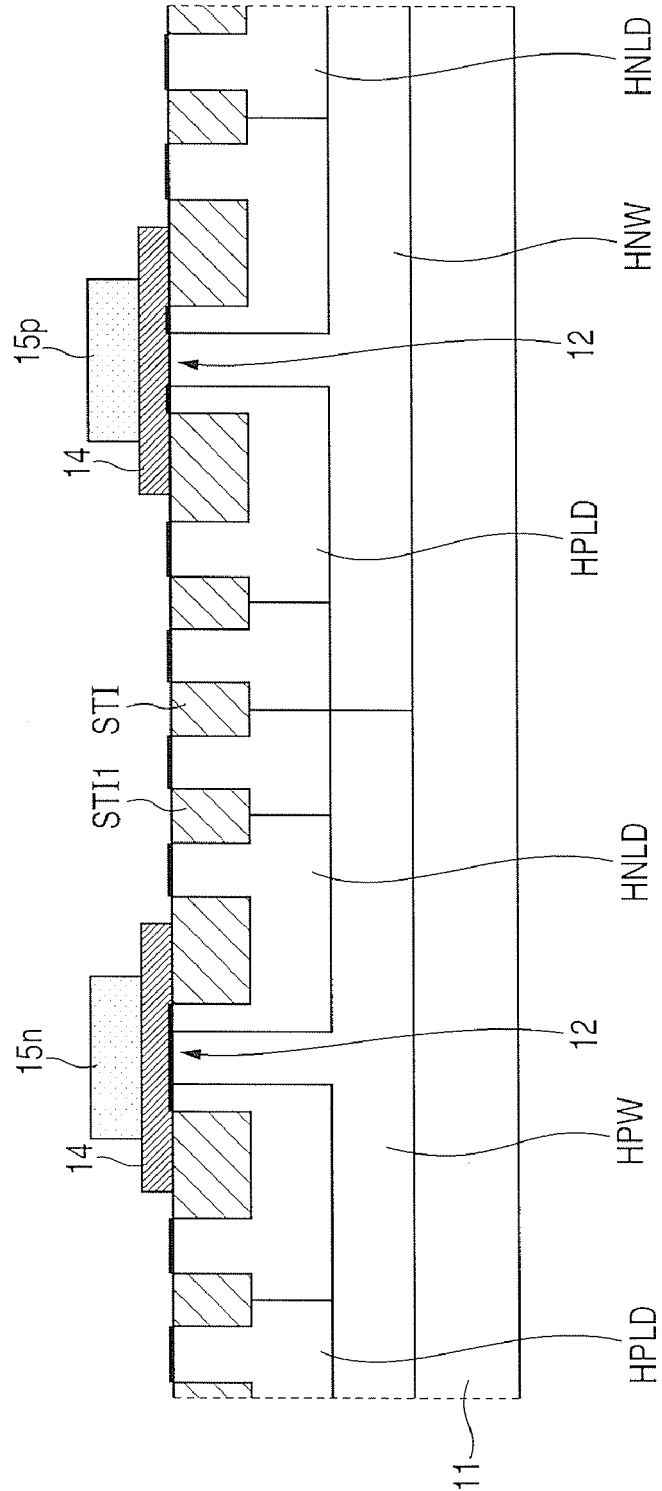
FIG. 21 is a device cross-sectional flow diagram (in a step of forming a gate electrode in the high-breakdown-voltage portion) in the channel length direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 22:
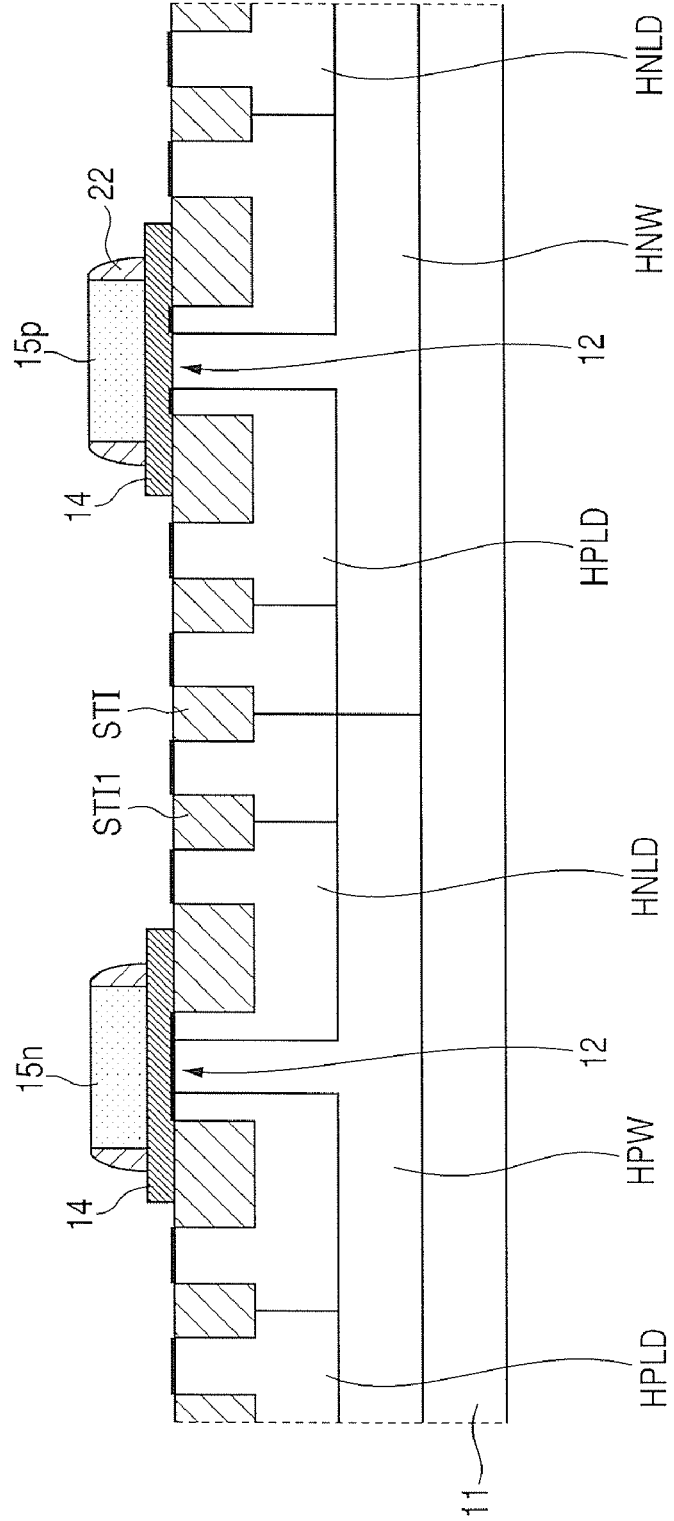
FIG. 22 is a device cross-sectional flow diagram (in a step of forming sidewalls in the high-breakdown-voltage portion) in the channel length direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 23:
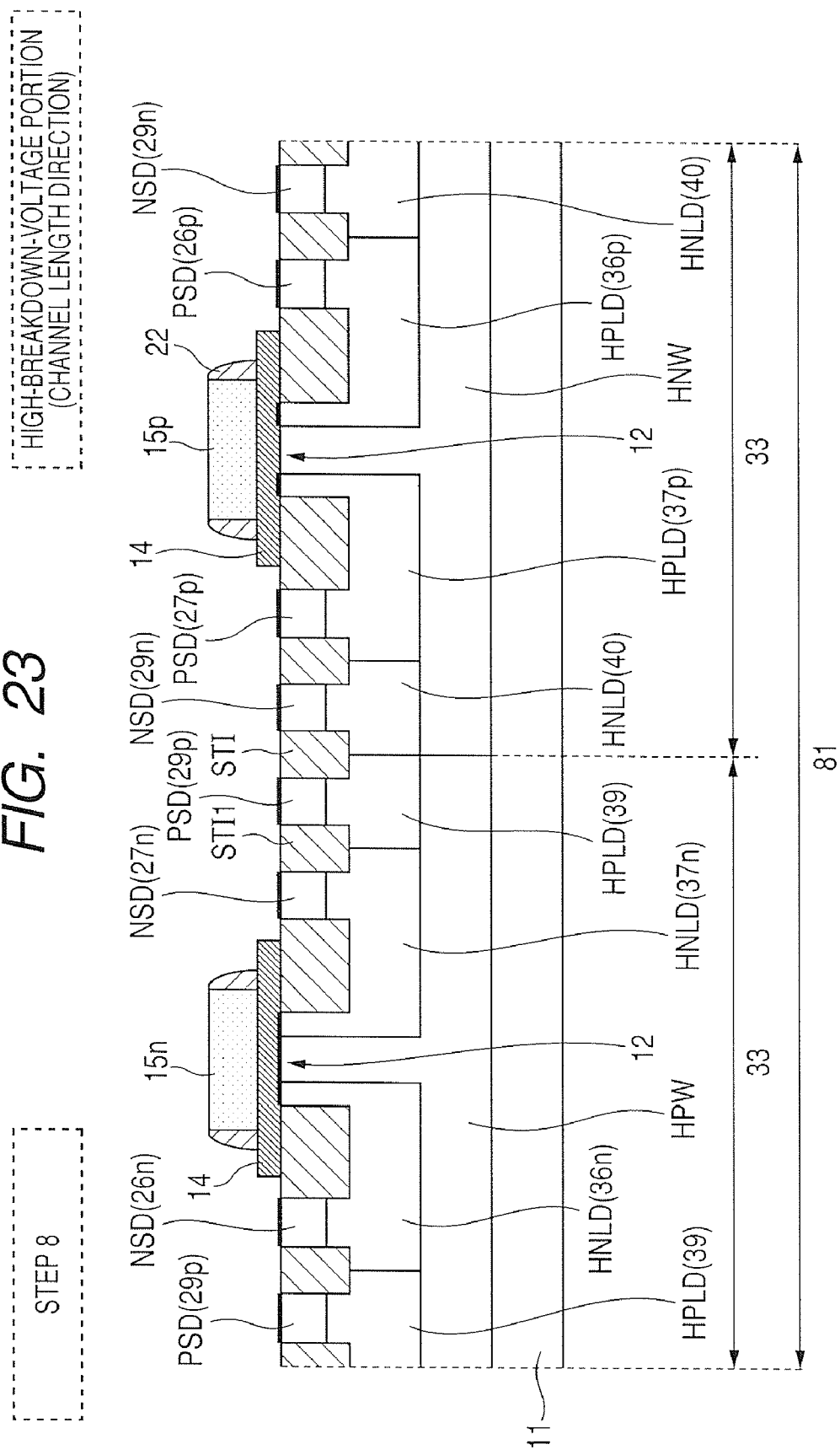
FIG. 23 is a device cross-sectional flow diagram (in a step of forming high-concentration contact regions in the high-breakdown-voltage portion) in the channel length direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 24:
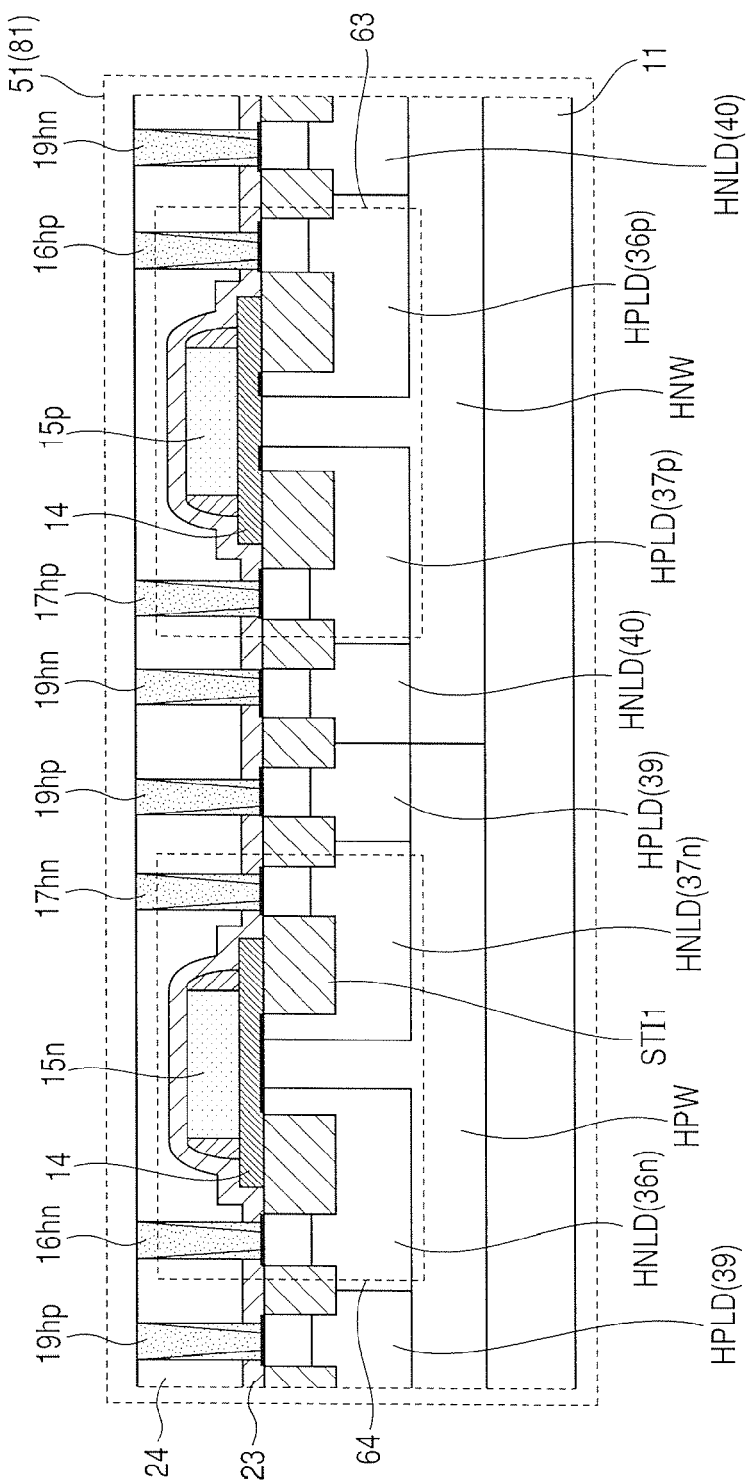
FIG. 24 is a device cross-sectional flow diagram (in a pre-metal step in the high-breakdown-voltage portion) in the channel length direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 25:
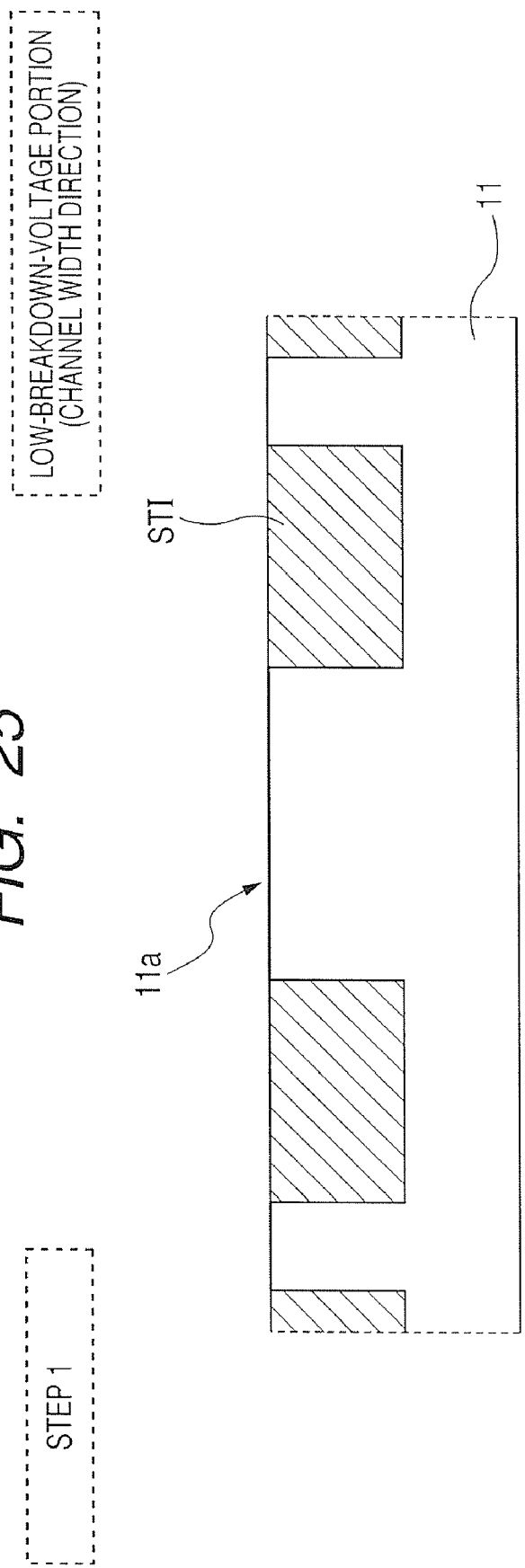
FIG. 25 is a device cross-sectional flow diagram (in the step of forming the isolation region in the low-breakdown-voltage portion) in a channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 26:
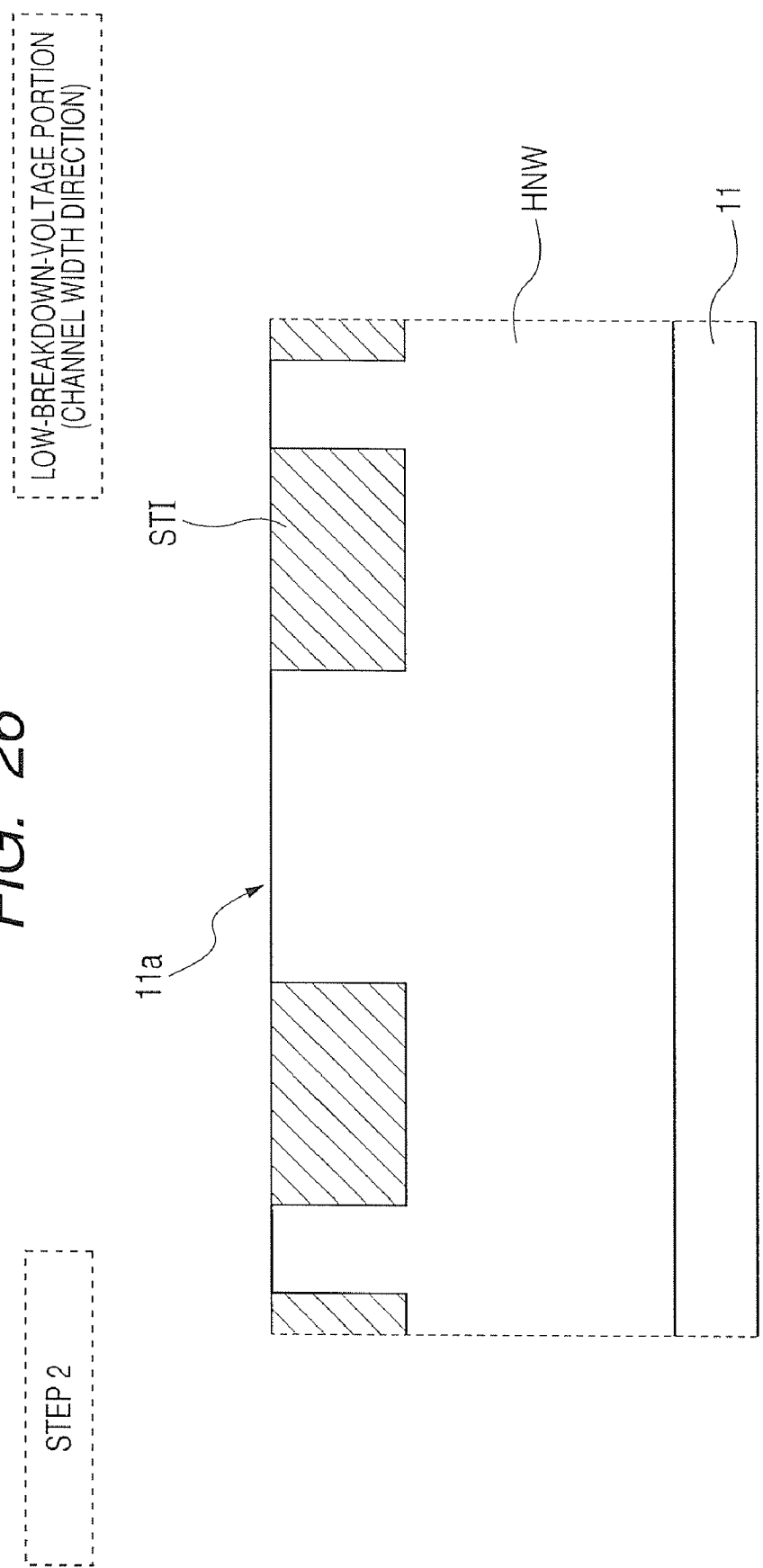
FIG. 26 is a device cross-sectional flow diagram (in the step of forming the deep N-well in the low-breakdown-voltage portion) in the channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 27:
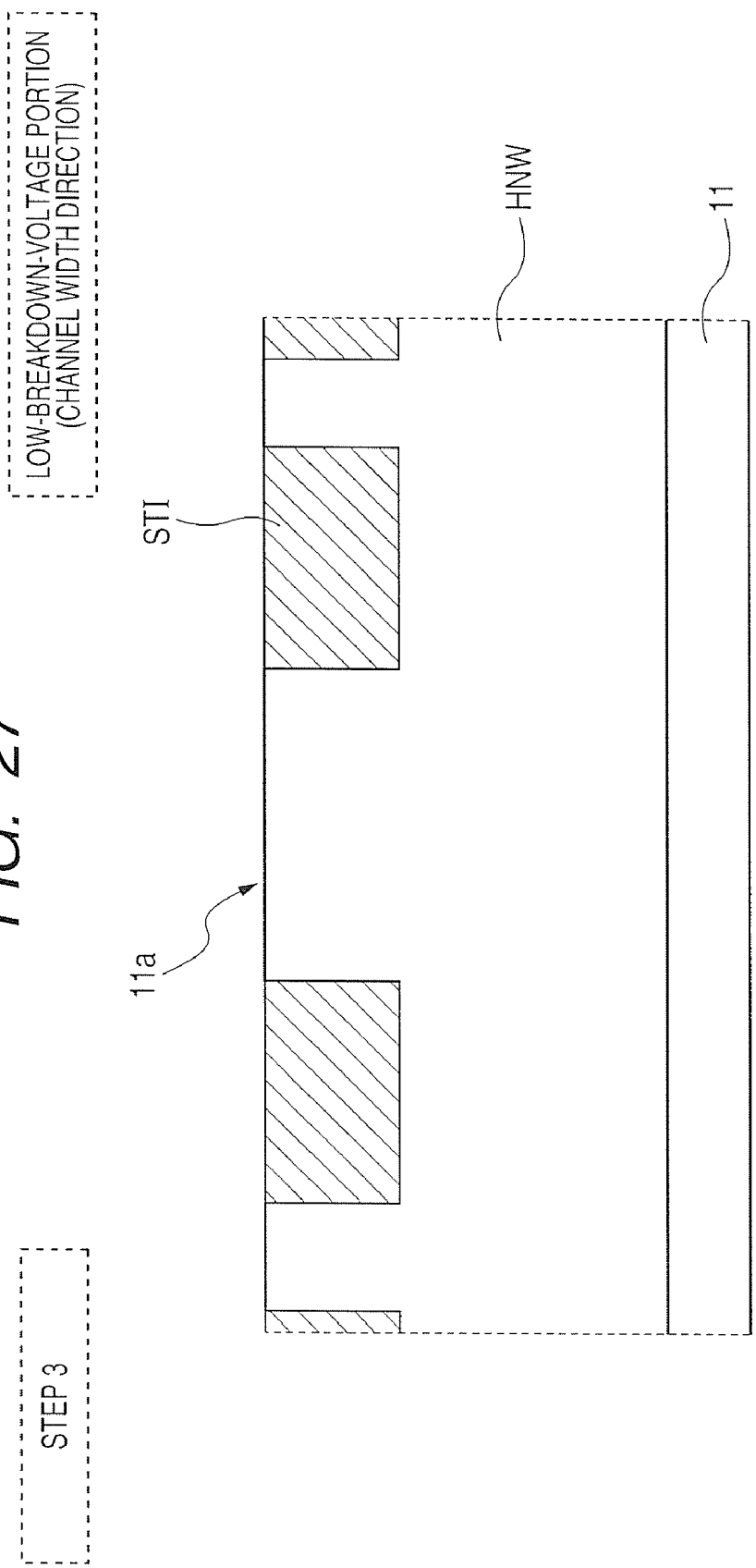
FIG. 27 is a device cross-sectional flow diagram (in a step 3 in the low-breakdown-voltage portion) in the channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 28:
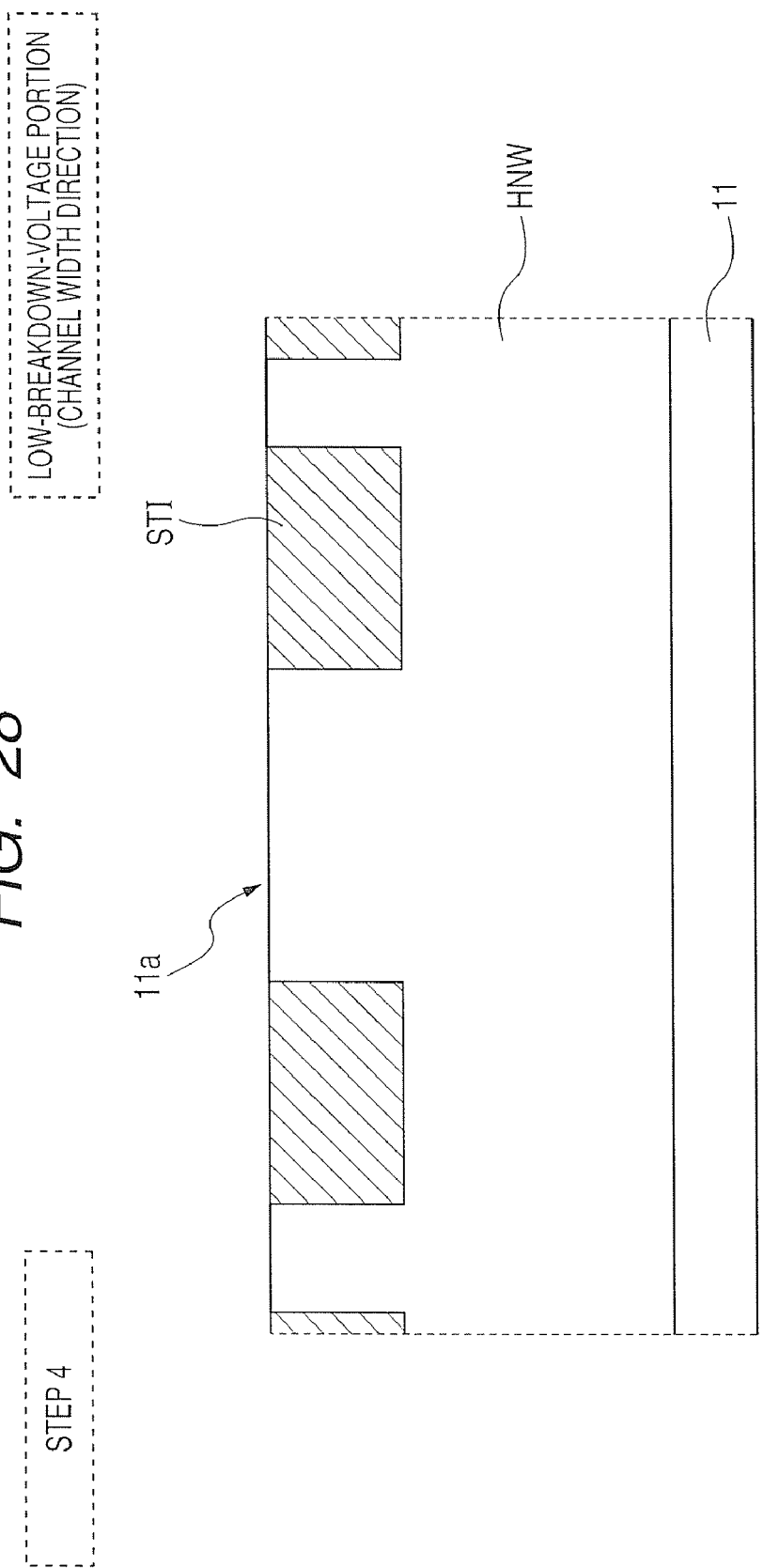
FIG. 28 is a device cross-sectional flow diagram (in a step 4 in the low-breakdown-voltage portion) in the channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 29:
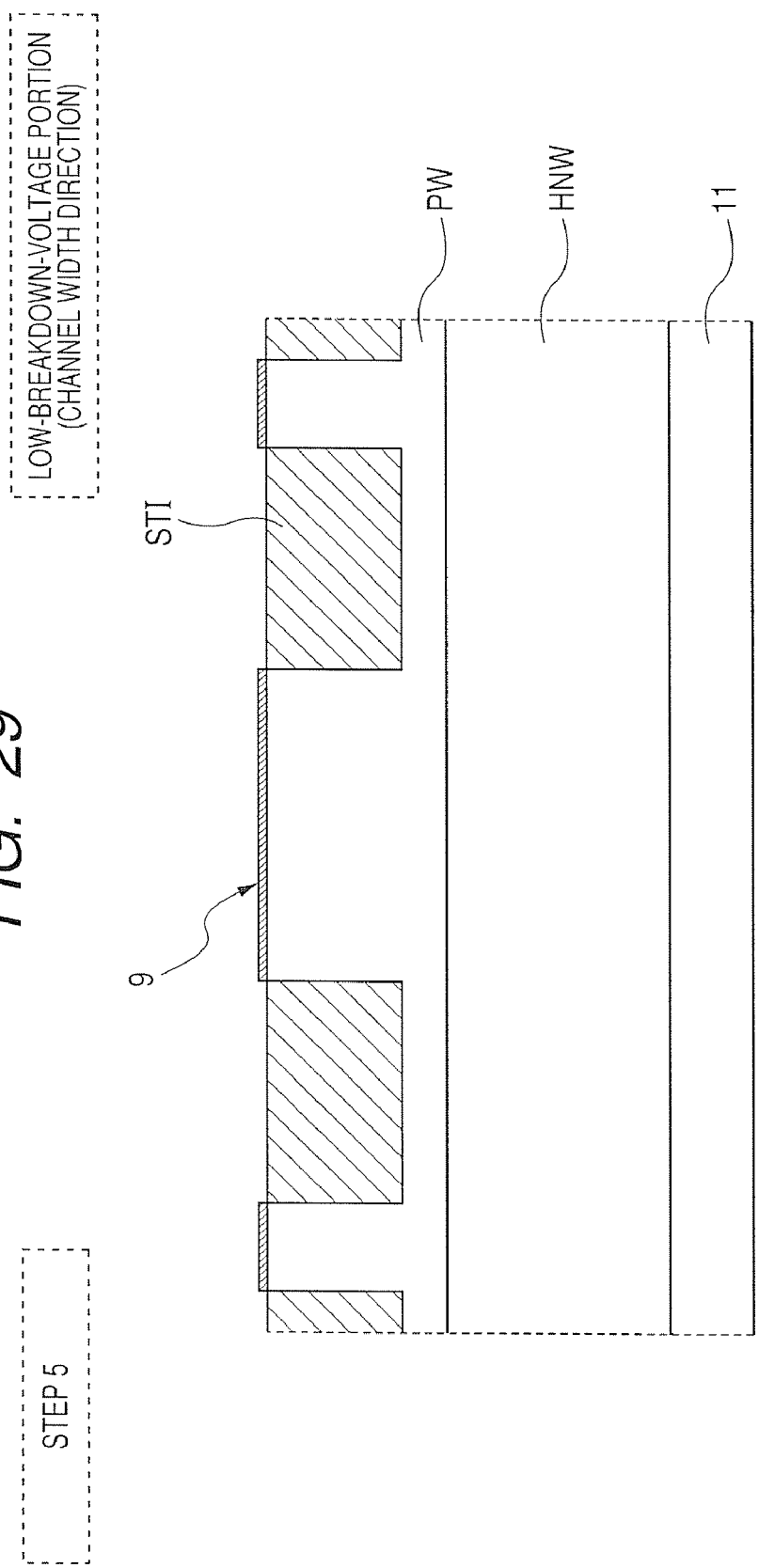
FIG. 29 is a device cross-sectional flow diagram (in a step of forming a P-well in the low-breakdown-voltage portion) in the channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 30:
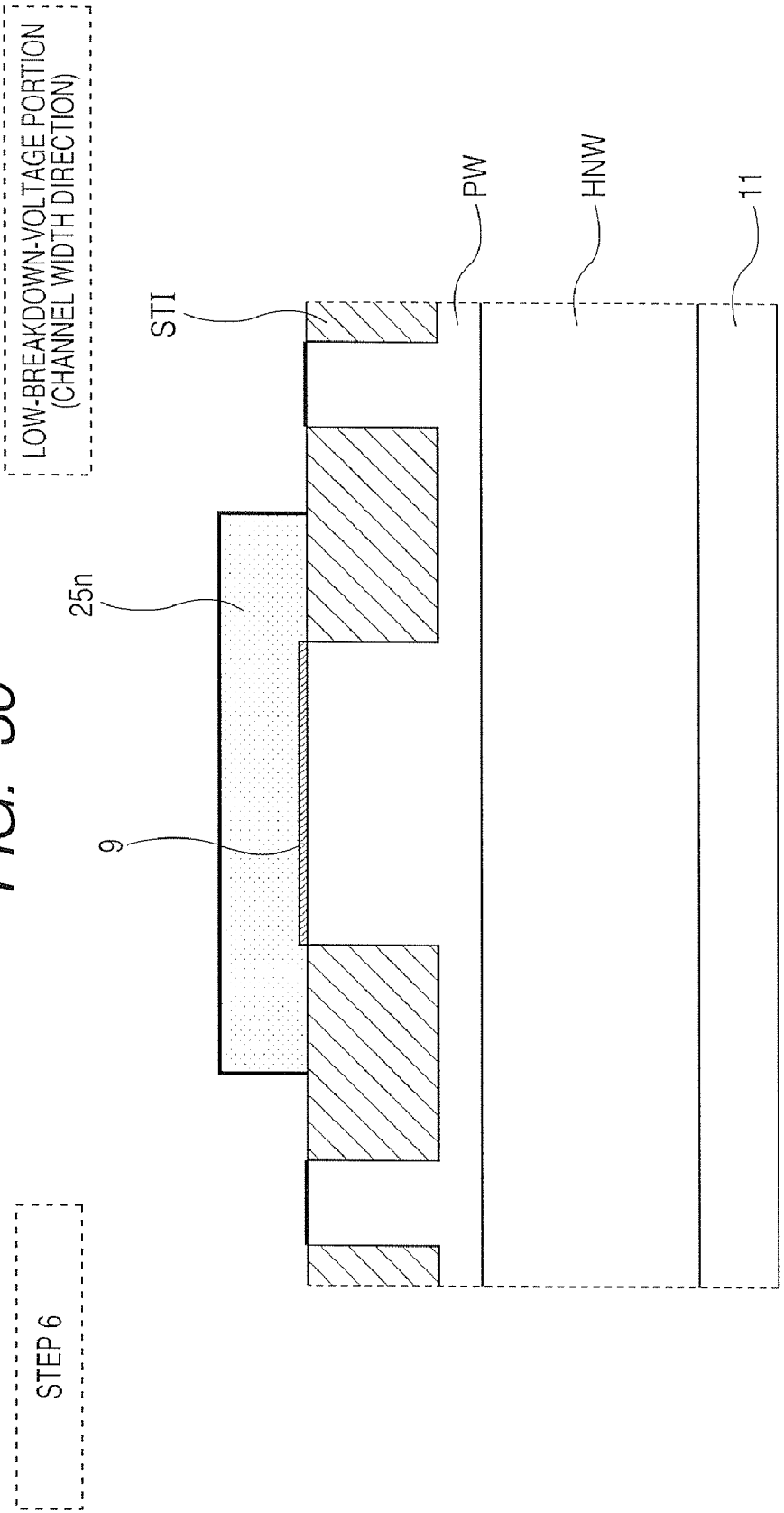
FIG. 30 is a device cross-sectional flow diagram (in a step of forming a gate electrode in the low-breakdown-voltage portion) in the channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 31:
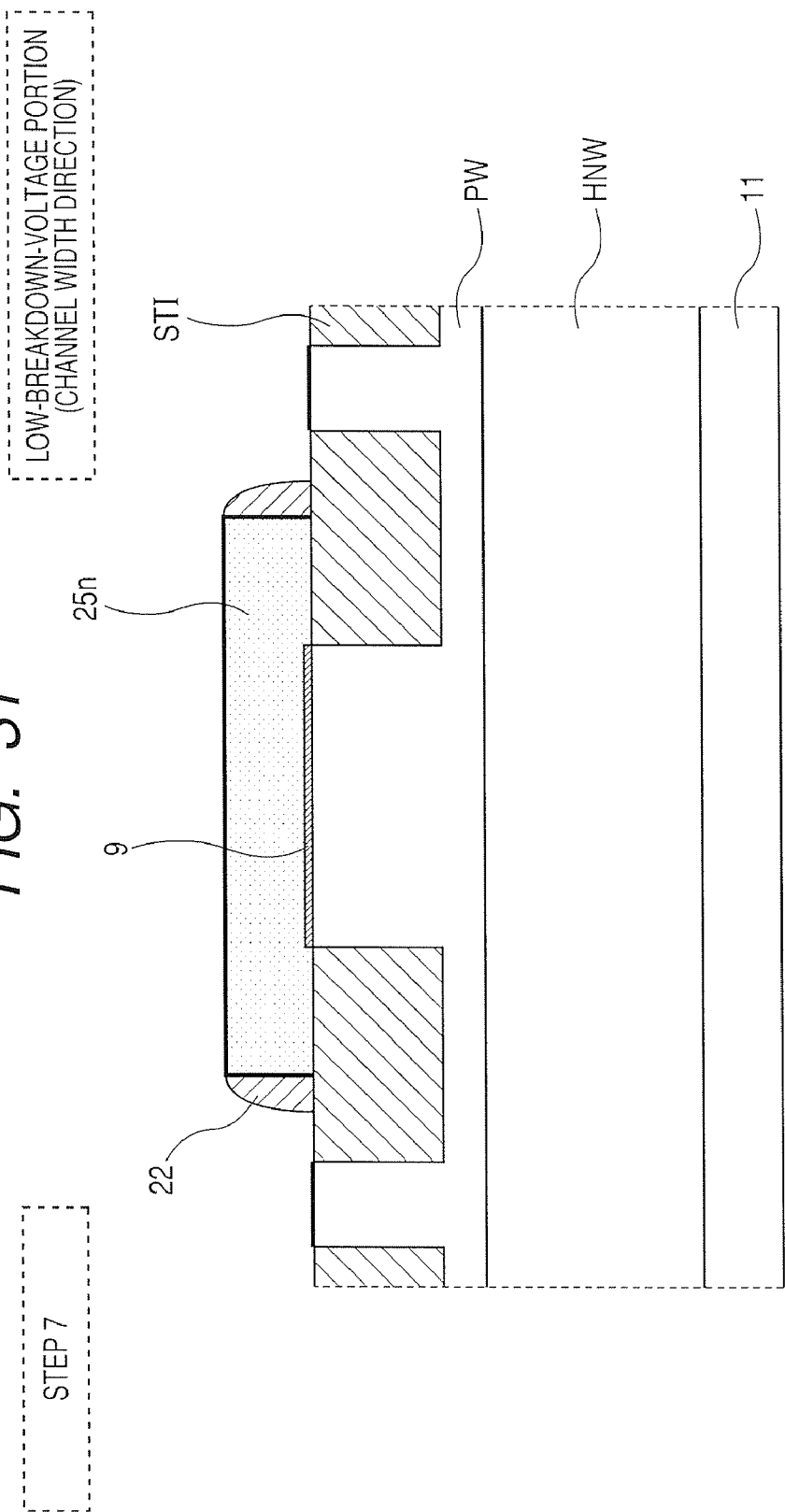
FIG. 31 is a device cross-sectional flow diagram (in a step of forming sidewalls in the low-breakdown-voltage portion) in the channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 32:
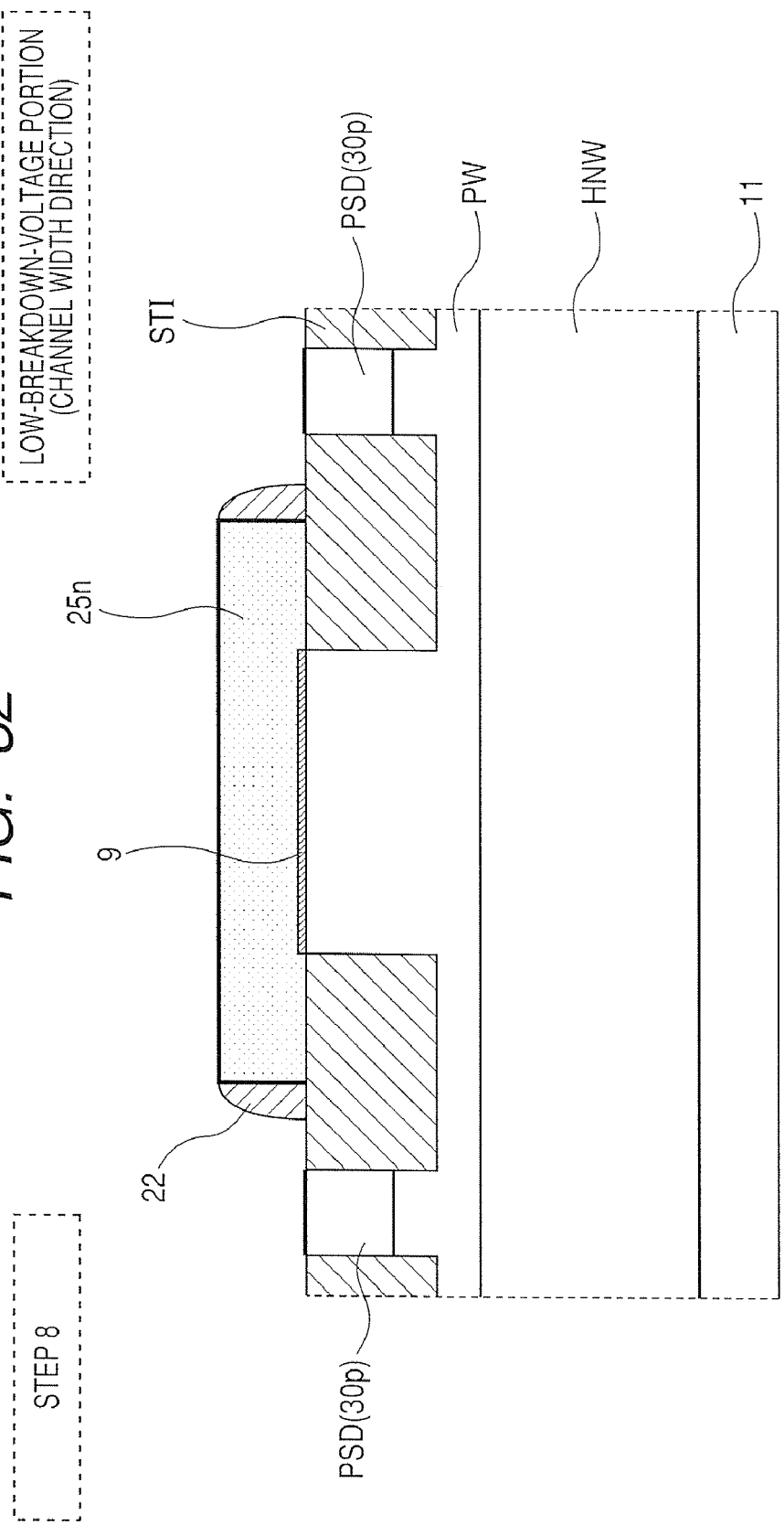
FIG. 32 is a device cross-sectional flow diagram (in a step of forming well contact regions in the low-breakdown-voltage portion) in the channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 33:
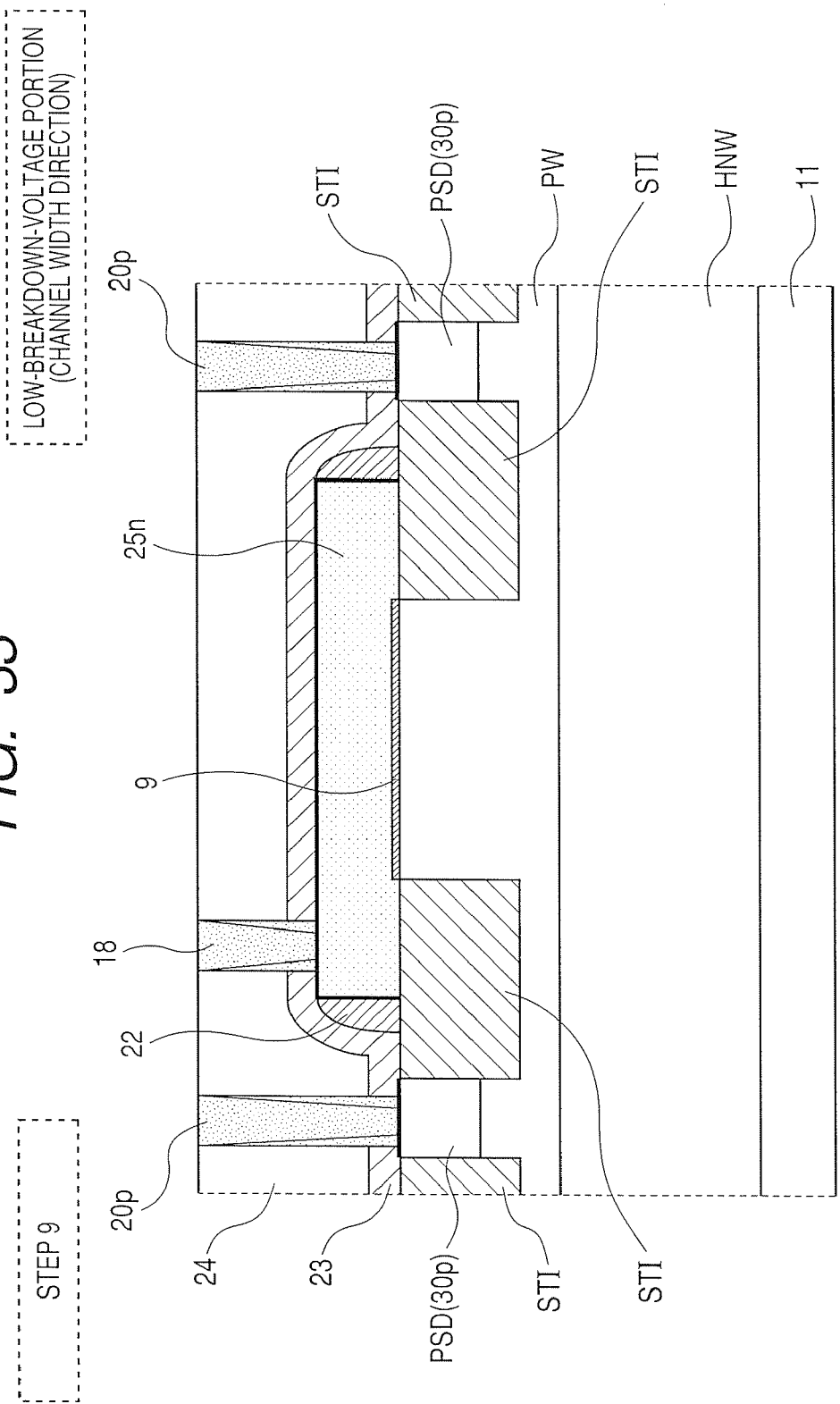
FIG. 33 is a device cross-sectional flow diagram (in the pre-metal step in the low-breakdown-voltage portion) in the channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 34:
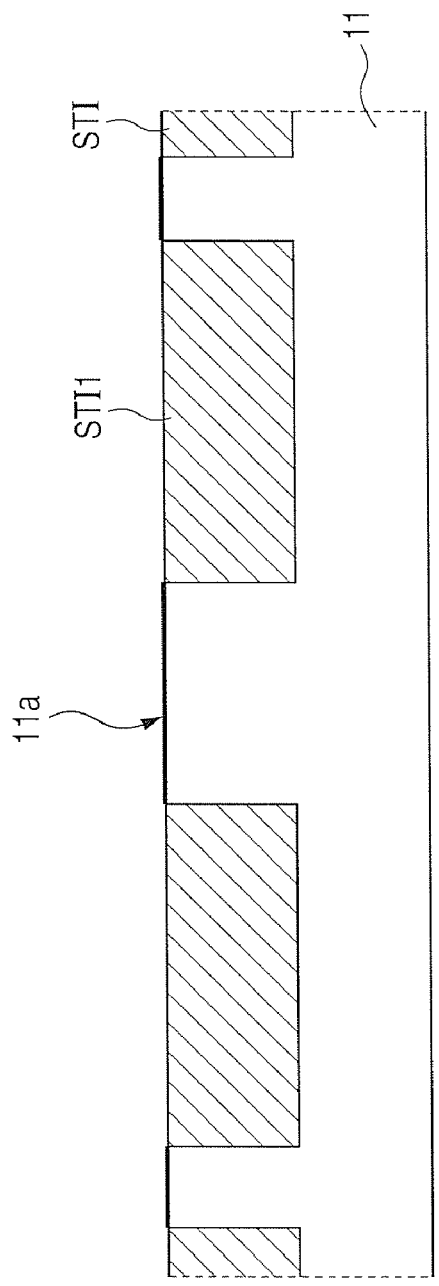
FIG. 34 is a device cross-sectional flow diagram (in the step of forming the isolation region in the high-breakdown-voltage portion) in the channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 35:
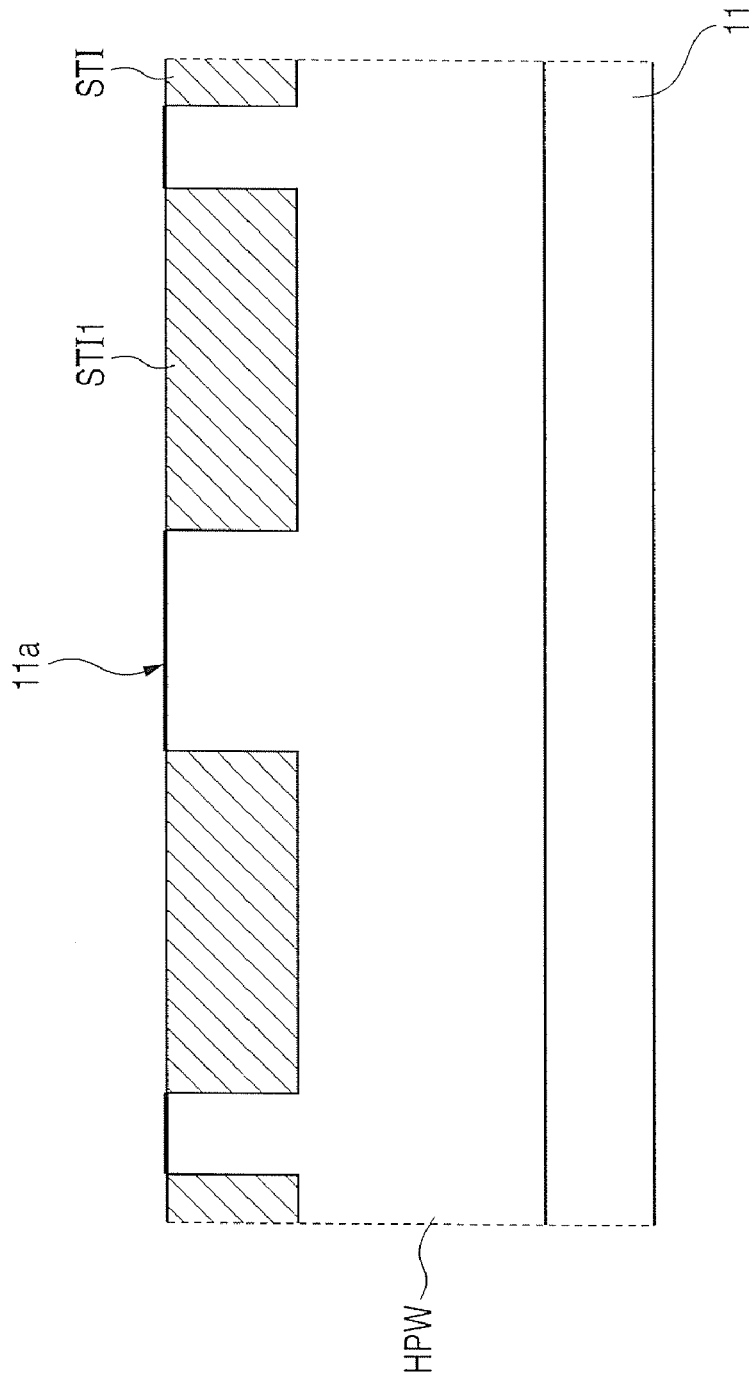
FIG. 35 is a device cross-sectional flow diagram (in a step of forming a deep P-well region in the high-breakdown-voltage portion) in the channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 36:
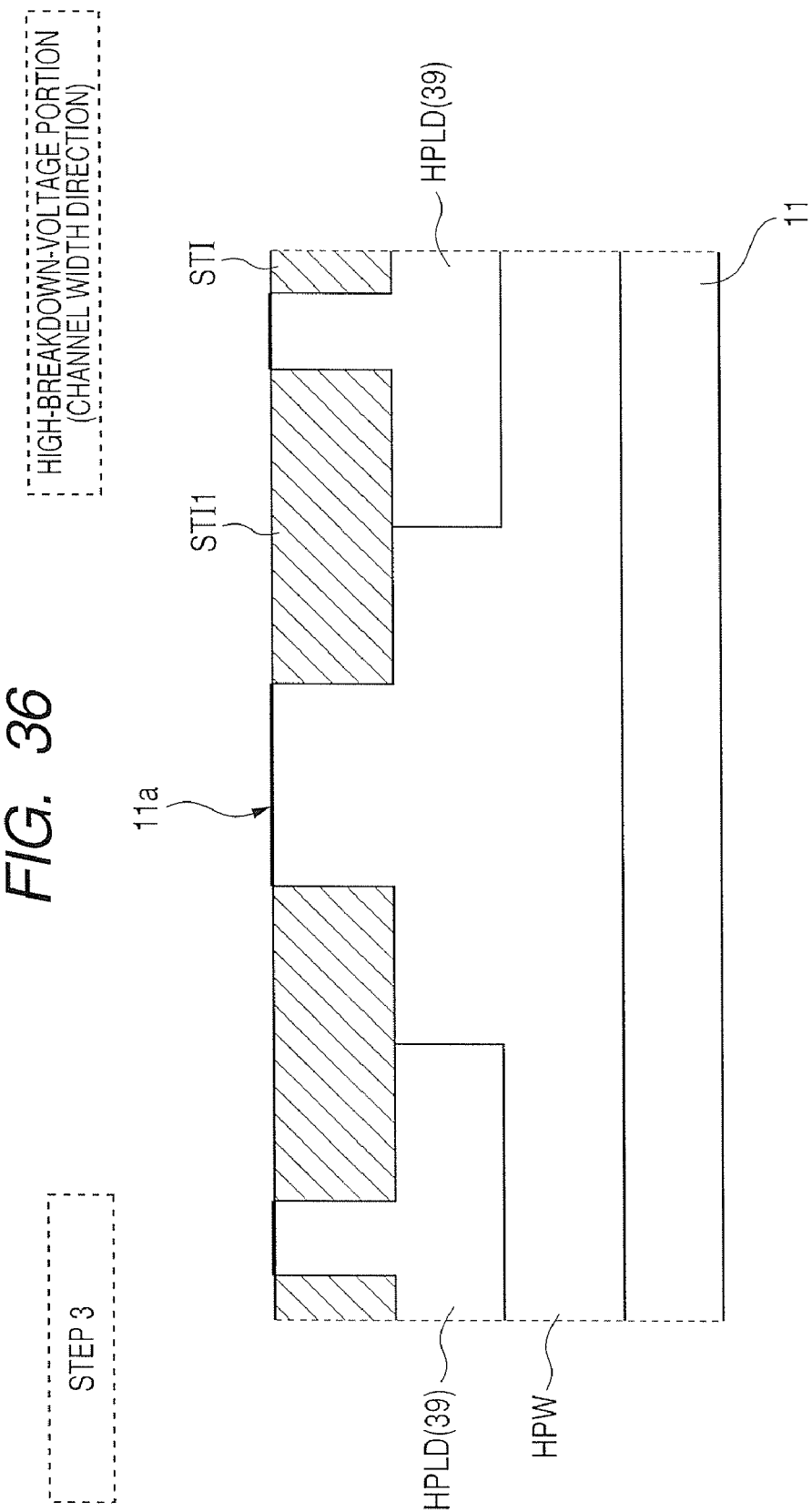
FIG. 36 is a device cross-sectional flow diagram (in a step of forming a guard ring region in the high-breakdown-voltage portion) in the channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 37:
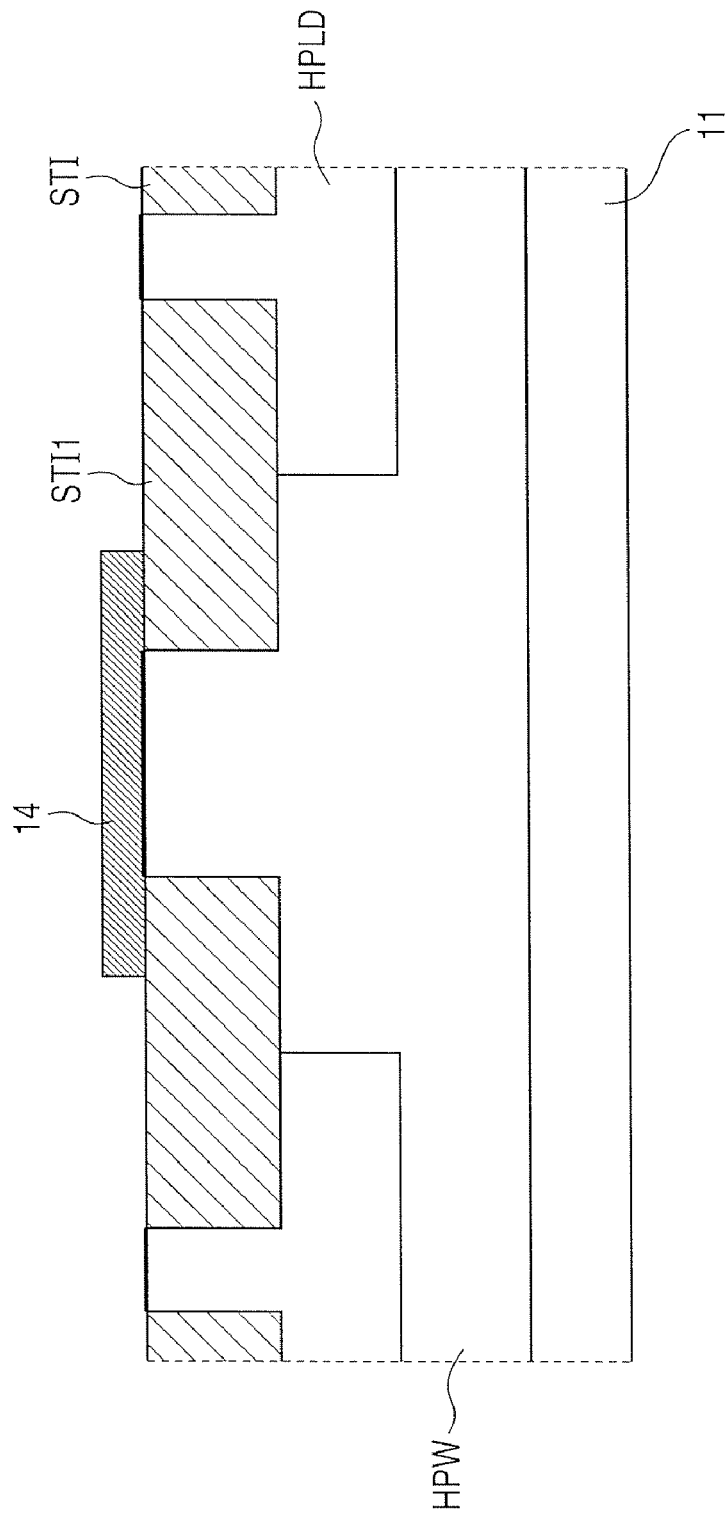
FIG. 37 is a device cross-sectional flow diagram (in the step of forming the CVD gate insulating film in the high-breakdown-voltage portion) in the channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 38:
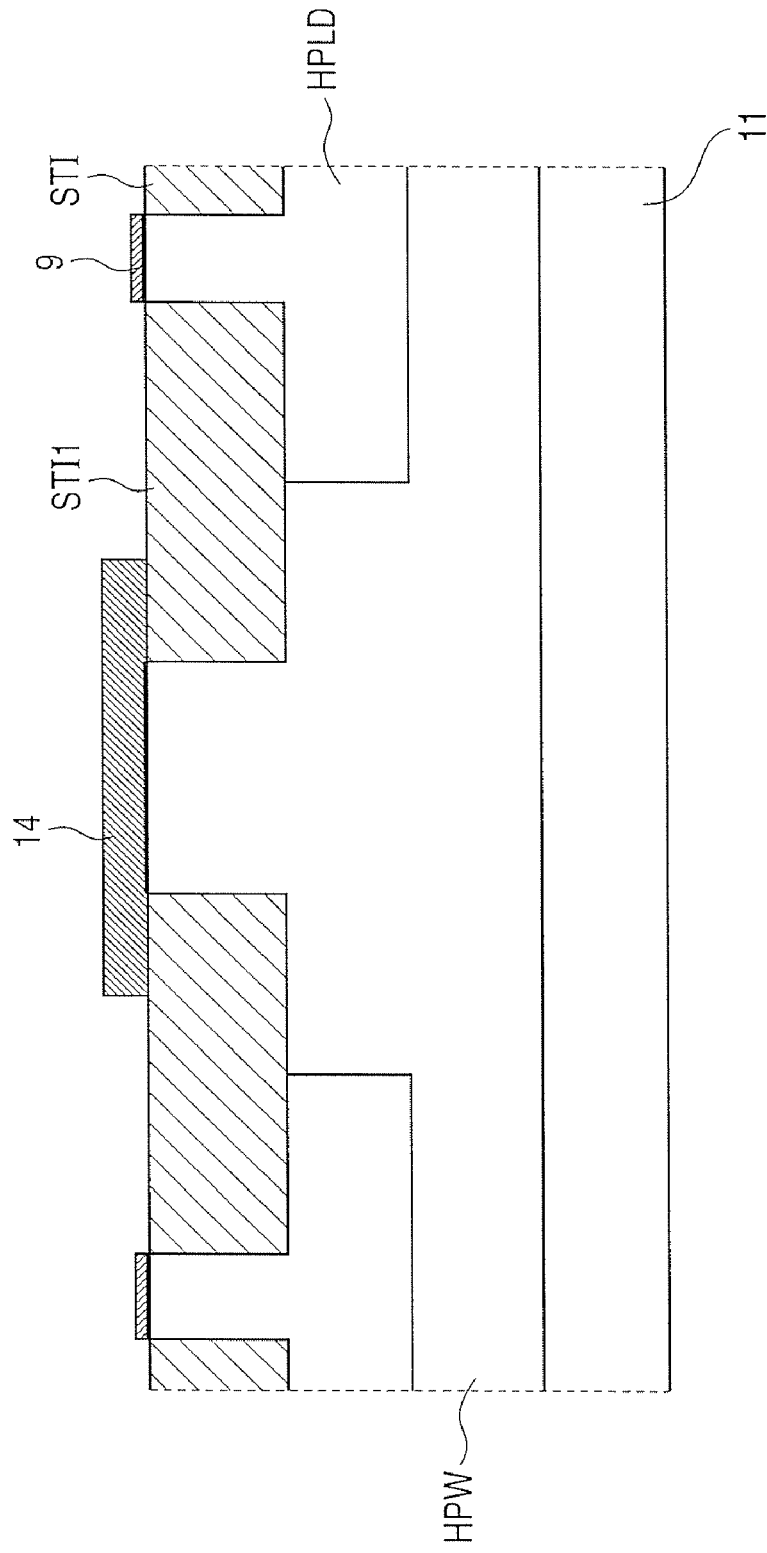
FIG. 38 is a device cross-sectional flow diagram (in a step 5 in the high-breakdown-voltage portion) in the channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 39:
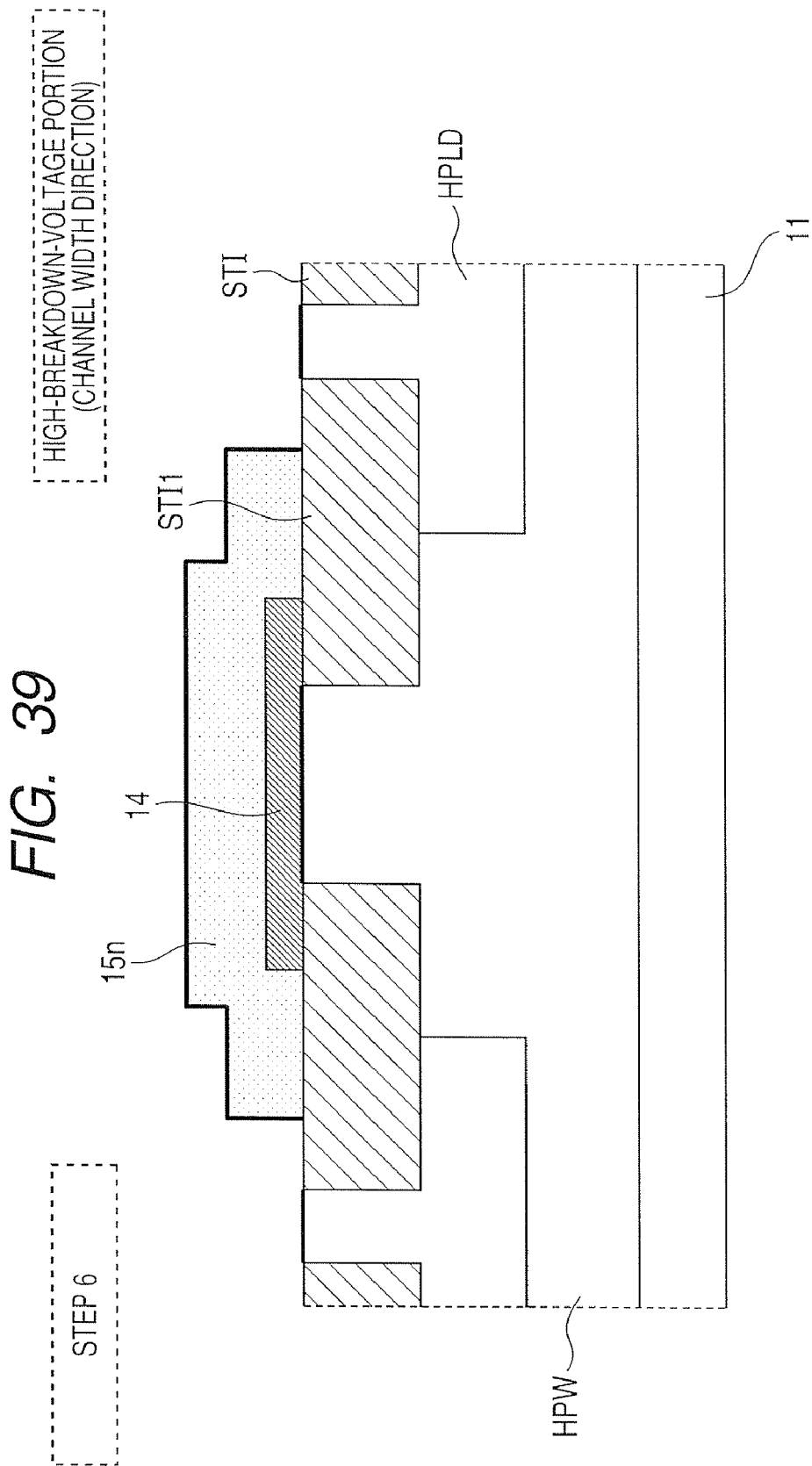
FIG. 39 is a device cross-sectional flow diagram (in the step of forming the gate electrode in the high-breakdown-voltage portion) in the channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 40:
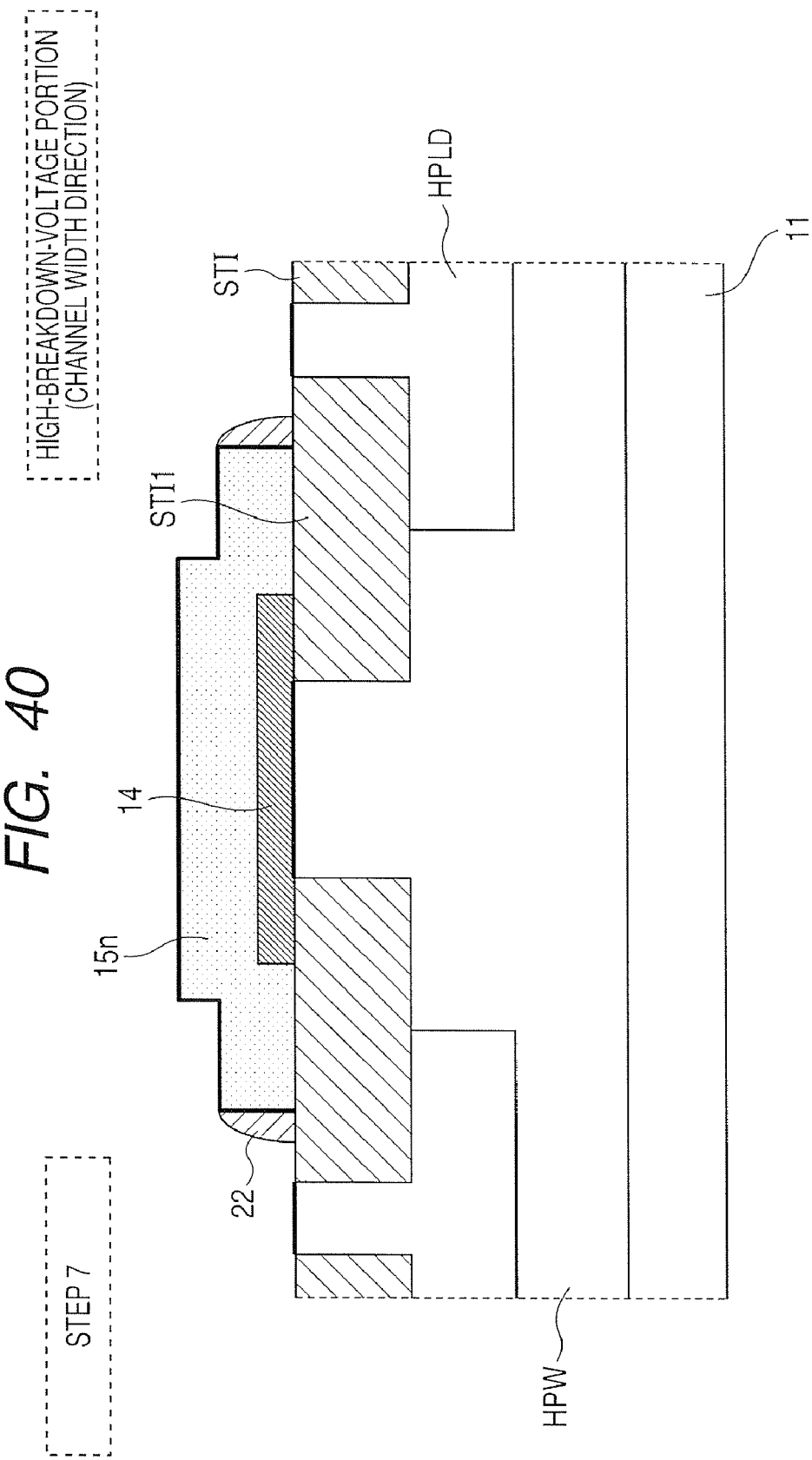
FIG. 40 is a device cross-sectional flow diagram (in the step of forming the sidewalls in the high-breakdown-voltage portion) in the channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 41:
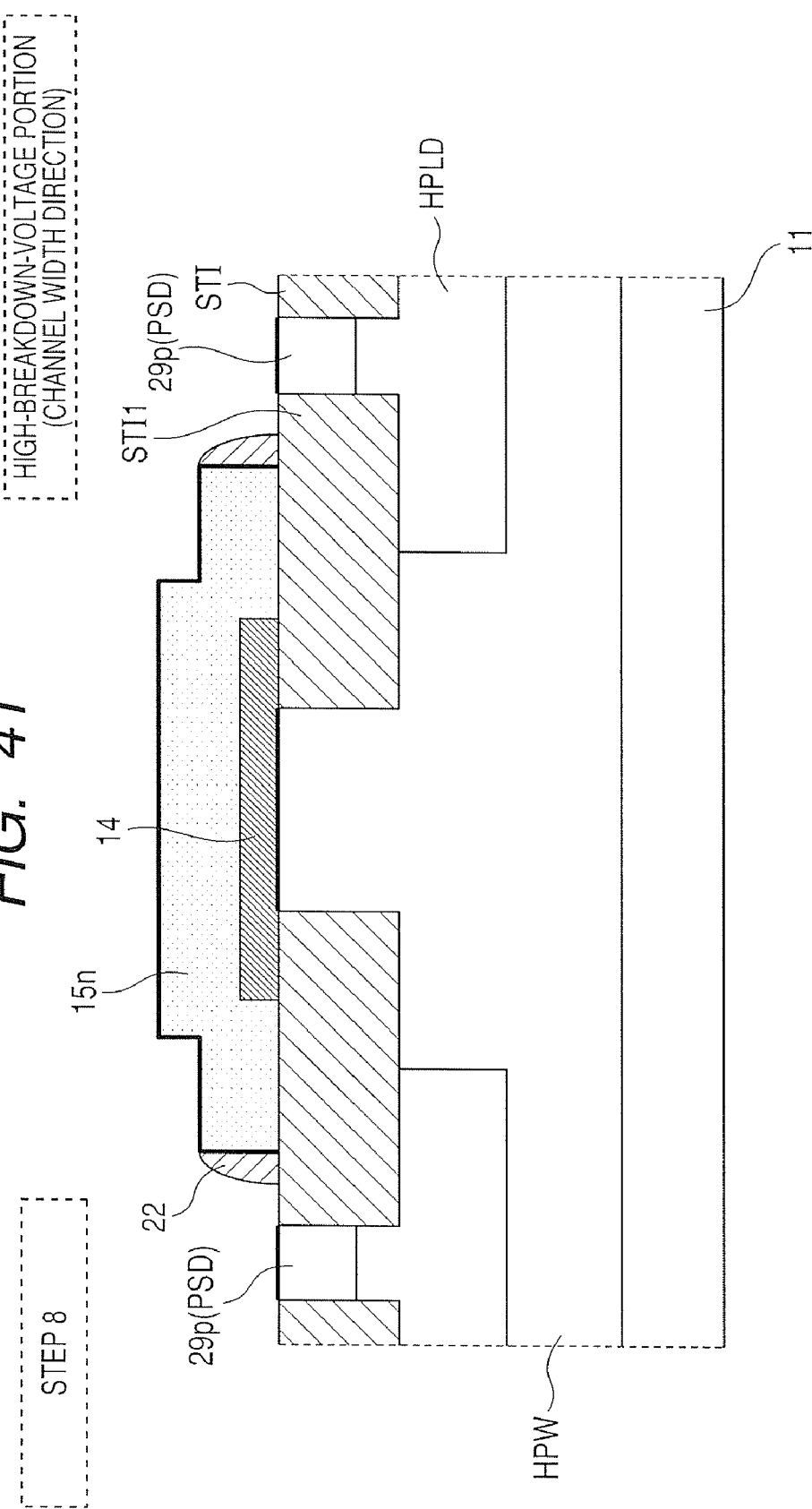
FIG. 41 is a device cross-sectional flow diagram (in a step of forming a high-concentration guard ring contact region in the high-breakdown-voltage portion) in the channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.
Figure 42:
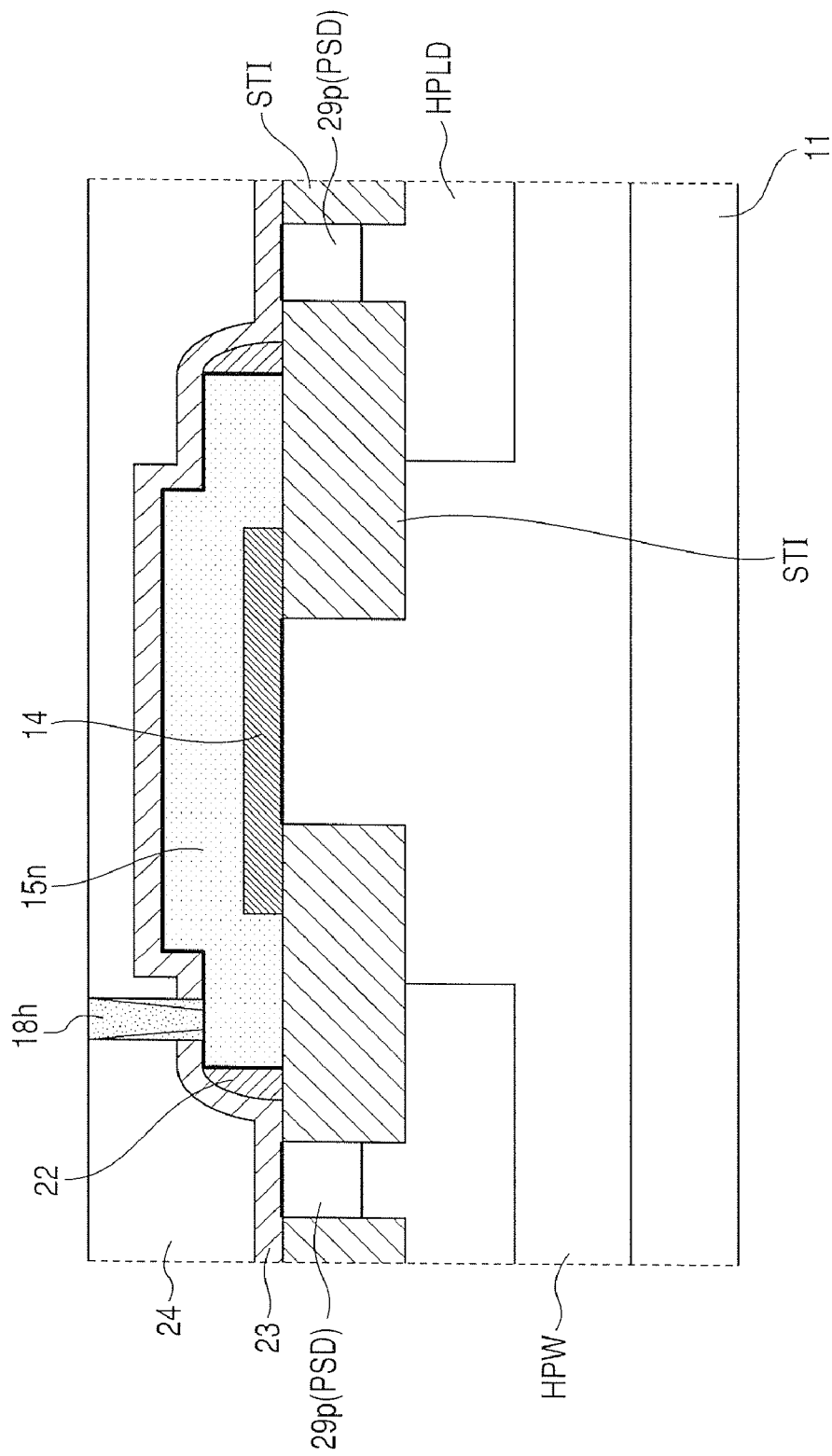
FIG. 42 is a device cross-sectional flow diagram (in the pre-metal step in the high-breakdown-voltage portion) in the channel width direction for illustrating the wafer process for the CMIS IC corresponding to the semiconductor integrated circuit device (using the basic structure 1 according to the CVD gate insulating film method in the high-breakdown-voltage portion) in the embodiment of the present invention.

As shown in FIG. 7, a low-breakdown-voltage portion 82 is divided into a low-breakdown-voltage P-channel device region 31 and a low-breakdown-voltage N-channel device region 32. Likewise, as shown in FIG. 16, a high-breakdown-voltage portion 81 is divided into a high-breakdown-voltage P-channel device region 33 and a high-breakdown-voltage N-channel device region 34.

Next, as shown in FIGS. 8, 17, 26, and 35, phosphorus ions are implanted at a concentration of, e.g., about $3 \times 10^{12}/\text{cm}^2$ from the device-side face 11a (first principal surface) of the semiconductor wafer 11 to form the N-type deep well region HNW in the low-breakdown-voltage portion 82 and in the high-breakdown-voltage P-channel device region 33. Likewise, boron ions are implanted at a concentration of, e.g., about $3 \times 10^{12}/\text{cm}^2$ from the device-side face 11a of the semiconductor wafer 11 to form the P-type deep well region HPW in the high-breakdown-voltage N-channel device region 34.

Next, as shown in FIGS. 9, 18, 27, and 36, phosphorus ions are implanted at a concentration of, e.g., about $6 \times 10^{12}/\text{cm}^2$ from the device-side face 11a of the semiconductor wafer 11 to form an N-type guard ring region 41 (which is an N-type intermediate-concentration region HNLD according to the classification of impurity doped regions) in the peripheral portion of the low-breakdown-voltage portion 82. Likewise, phosphorus ions are implanted at a concentration of, e.g., about $6 \times 10^{12}/\text{cm}^2$ from the device-side face 11a of the semiconductor wafer 11 to form an N-type guard ring region 40 (which is the N-type intermediate-concentration region HNLD according to the classification of impurity doped regions) in the peripheral portion of the high-breakdown-voltage P-channel device region 33. Further, from the device-side face 11a of the semiconductor wafer 11, phosphorus ions are implanted at a concentration of, e.g., about $6 \times 10^{12}/\text{cm}^2$ to form the N-type source region 36n and the N-type drain region 37n (which are the N-type intermediate-concentration regions HNLD according to the classification of impurity doped regions) in the center portion of the high-breakdown-voltage N-channel device region 34. Further, from the device-side face 11a of the semiconductor wafer 11, boron ions are implanted at a concentration of, e.g., about $6 \times 10^{12}/\text{cm}^2$ to form a P-type source region 36p and a P-type drain region 37p (which are P-type intermediate-concentration regions HPLD according to the classification of impurity doped regions) in the center portion of the high-breakdown-voltage P-channel device region 33. Further, from the device-side face 11a of the semiconductor wafer 11, boron ions are implanted at a concentration of, e.g., about $6 \times 10^{12}/\text{cm}^2$ to form the P-type guard ring region 39 (which is the P-type intermediate-concentration region HPLD according to the classification of impurity doped regions) in the peripheral portion of the high-breakdown-voltage N-channel device region 34.

Next, as shown in FIGS. 10, 19, 28, and 37, a CVD silicon dioxide film having a thickness of about 80 nm is formed over the entire surface of the device-side face 11a of the semiconductor wafer 11, and patterned by typical lithography to be left only in a predetermined part of the high-breakdown-voltage portion 81, thereby forming the high-breakdown-voltage gate insulating film 14. To stabilize the properties of the gate oxide film, it is preferable to lay, by thermal oxidation, a silicon dioxide film having a thickness of about 15 nm or the like as an underlie, and form a CVD silicon dioxide film having a thickness of about 65 nm thereon. As the CVD silicon dioxide film, a silicon dioxide film deposited by LP-CVD (Low Pressure-Chemical Vapor Deposition) using a high-temperature batch furnace (which may also be a single-wafer furnace) at about 700° C.) and thermal decomposition of TEOS (Tetra-ethyl-ortho-silicate) or the like is preferable. The gate insulating film 14 made of the thermal oxide film and the CVD film is formed also in the low-breakdown-voltage region, but removed by the patterning mentioned above.

Next, as shown in FIGS. 11, 20, 29, and 38, phosphorus ions are implanted at a concentration of, e.g., about $2 \times 10^{13}/\text{cm}^2$ from the device-side face 11a of the semiconductor wafer 11 to form the N-type well region NW in the principal portion of the low-breakdown-voltage P-channel device region 31. Likewise, boron ions are implanted at a concentration of, e.g., about $2 \times 10^{13}/\text{cm}^2$ from the device-side face 11a of the semiconductor wafer 11 to form the P-type well region PW in the principal portion of the low-breakdown-voltage N-channel device region 32. Further, by thermally oxidizing the silicon surface of the device-side face of the semiconductor wafer 11 in the low-breakdown-voltage portion 82, the gate insulting film 9 is formed. The thickness of the gate insulating film 9 is equivalent to that of a standard silicon dioxide film such as a silicon dioxide film, a silicon nitride film, a silicon oxynitride film, or a composite film thereof, which is, e.g., about 4 nm. As the gate insulating film 9, a High-k insulating film having a dielectric constant higher than that of silicon nitride may also be used.

Next, as shown in FIGS. 12, 21, 30, and 39, a polysilicon film having a thickness of, e.g., about 180 nm is deposited by CVD over the entire surface of the device-side face 11a of the semiconductor wafer 11. The upper surface of the polysilicon film corresponding to the low-breakdown-voltage P-channel device region 31 is covered with a resist film and, in this state, phosphorus ions are implanted at a concentration of, e.g., about $4 \times 10^{15}/\text{cm}^2$ from the device-side face 11a of the semiconductor wafer 11 to dope the polysilicon film over the high-breakdown-voltage N-channel device region 34, the high-breakdown-voltage P-channel device region, and the low-breakdown-voltage N-channel device region 32 with the N-type impurity. Subsequently, in contrast to the doping of the polysilicon film with the N-type impurity described above, the polysilicon film corresponding to the high-breakdown-voltage N-channel device region 34, the high-breakdown-voltage P-channel device region, and the low-breakdown-voltage N-channel device region 32 is covered with a resist film and, in this state, boron ions are implanted at a concentration of, e.g., about $4 \times 10^{15}/cm^2$ from the device-side face 11a of the semiconductor wafer 11 to dope the polysilicon film over the low-breakdown-voltage P-channel device region 31 with the P-type impurity. Further, by typical lithography, a resist film pattern for processing the gate electrode is formed over the polysilicon film. Then, using the resist film pattern as a mask, the polysilicon film is patterned into gate electrodes 15n, 15p, 25n, and 25p by dry etching.

Next, as shown in FIGS. 13, 22, 31, and 40, boron ions ($BF_2$) are implanted at a concentration of, e.g., about $2 \times 10^{14}/cm^2$ from the device-side face 11a of the semiconductor wafer 11 to form P-type source/drain extension regions PLD in the silicon surface region on both sides of the gate electrode 25p of the low-breakdown-voltage P-channel MISFET. Likewise, from the device-side face 11a of the semiconductor wafer 11, phosphorus ions are implanted at a concentration of, e.g., about $1 \times 10^{14}/cm^2$ to form N-type source/drain extension regions NLD in the silicon surface region on both sides of the gate electrode 25n of the low-breakdown-voltage N-channel MISFET. Further, a silicon nitride film is deposited by CVD over the entire surface of the device-side face 11a of the semiconductor wafer 11. Thereafter, the silicon nitride film is etched by anisotropic dry etching to form the sidewall insulating films 22 over the peripheral portions of the gate electrodes 15n, 15p, 25n, and 25p.

Next, as shown in FIGS. 14, 23, 32, and 41, boron ions ($BF_2$) are implanted at a concentration of, e.g., about $2 \times 10^{15}/cm^2$ from the device-side face 11a of the semiconductor wafer 11 (into a P-type high-concentration impurity region PSD) to form a P-well contact region 30p, a P-type high-concentration source contact region 26p, and a P-type high-concentration drain contact region 27p in the low-breakdown-voltage region 82, and a P-type high-concentration guard ring contact region 29p, a P-type high-concentration drain contact region 27p, and a P-type high-concentration source contact region 26p in the high-breakdown-voltage region 81. Likewise, arsenic ions are implanted at a concentration of, e.g., about $3 \times 10^{15}/cm^2$ from the device-side face 11a of the semiconductor wafer 11 (into an N-type high-concentration impurity region NSD) to form an N-type high-concentration guard ring contact region 29n, an N-well contact region 30n, an N-type high-concentration source contact region 26n, and an N-type high-concentration drain contact region 27n in the low-breakdown-voltage region 82, and an N-type high-concentration guard ring contact region 29n, an N-type high-concentration drain contact region 27n, and an N-type high-concentration source contact region 26n in the high-breakdown-voltage region 81. Further, by a salicide process, the single-crystal silicon surface of the device-side face 11a of the semiconductor wafer 11, and the upper surfaces of the gate electrodes 15n, 15p, 25n, and 25p are subjected to cobalt silicidation. In a product at a 65 nm or smaller process node, nickel silicidation is performed as necessary.

Next, as shown in FIGS. 15, 24, 33, and 42, a silicon nitride film 23 (having a thickness of, e.g., about 40 nm) as an etch stop film in a contact hole process is deposited by, e.g., plasma CVD over the entire surface of the device-side face 11a of the semiconductor wafer 11. Subsequently, the pre-metal interlayer insulating film 24 (a pre-metal main interlayer insulating film) which is sufficiently thicker than the etch stop film is deposited thereon. Preferably, the pre-metal interlayer insulating film 24 has a specific structure including a lower-layer silicon-dioxide-based insulating film (having a thickness of, e.g., about 200 nm at the completion thereof) using ozone-TEOS and deposited by thermal CVD, and an upper-layer silicon-dioxide-based insulating film (having a thickness of, e.g., about 500 nm at the completion thereof) deposited by plasma TEOS CVD or the like. Subsequently, the pre-metal interlayer insulating film 24 is planarized as necessary by oxide film CMP (Chemical Mechanical Polishing). Further, as a cap film thinner than the pre-metal main interlayer insulating film, a silicon dioxide film is deposited as necessary by plasma TEOS CVD over the pre-metal main interlayer insulating film processed by oxide-film CMP. In the steps subsequent thereto, the pre-metal interlayer insulating film 24 including the cap film is referred to as such in principle. The thickness of the interlayer insulating film 24 is, e.g., about 700 nm at the completion thereof.

Next, at the device-side face 11a of the semiconductor wafer 11, a resist film pattern for forming the contact holes is formed. Using the resist film pattern as a mask, anisotropic dry etching is performed in a gas mixture atmosphere containing, e.g., a fluorocarbon-based etching gas such as $C_4F_8$ or $C_5F_8$, oxygen, argon, and the like to first open the contact holes reaching the upper surface of the silicon nitride film 23. Subsequently, anisotropic dry etching is performed in a gas mixture atmosphere containing, e.g., a fluorocarbon-based etching gas such as $CF_4$ or $CHF_8$, oxygen, argon, and the like to extend the contact holes to the lower surface of the silicon nitride film 23.

Next, over the upper surface of the pre-metal interlayer insulating film 24 and in the contact holes, a barrier metal film which is relatively thin compared with the diameters of the contact holes is formed by sputtering or CVD. The barrier metal film is formed as a laminated film of, e.g., a lower-layer Ti film, and an upper-layer TiN film. Subsequently, a tungsten film which is sufficiently thick compared with the barrier metal film is deposited by CVD over the barrier metal film so as to bury the contact holes. Subsequently, the barrier metal film and the tungsten film each outside the contact holes are removed by metal CMP to form substrate contact plugs 19n, 20p, 16n, 17n, 16p, 17p, 20n, and 19n and the gate electrode contact plug 18 in the low-breakdown-voltage portion 82 (the low-breakdown-voltage MISFET group 52), and the substrate contact plugs 19hp, 16hn, 17hn, 19hp, 19hn, 17hp, 16hp, and 19hn and the gate electrode contact plug 18h in the high-breakdown-voltage portion 81 (high-breakdown-voltage MISFET group 51). At this stage, the wafer process up to the pre-metal process has been completed. The substrate contact plugs and the gate electrode contact plugs will be generally referred to as "tungsten plugs".

Next, the wafer process subsequent to the pre-metal process will be briefly described using the channel-width cross section of the high breakdown voltage portion 81 as an example. As shown in FIG. 95 (drawing subsequent to FIG. 42), an aluminum-based composite wiring layer is deposited by sputtering over the entire surface of the pre-metal interlayer insulating film 24. In the structure of the aluminum-based composite wiring layer, a main wiring layer contains aluminum as a main component, and about several percentage or less of Cu, Si, or the like is added as necessary. Upper and lower barrier films are made of, e.g., TiN or the like. By performing anisotropic dry etching of the aluminum-based composite wiring layer in a gas mixture atmosphere containing a chlorine-based etching gas containing $Cl_2$, $BCl_3$, or the like, the first-layer aluminum-based wiring M1 is formed. Thereafter, the silicon-dioxide-based interlayer insulating films 71 and 73 deposited by HDP-CVD (High Density Plasma-CVD), P-TEOS (Plasma-TEOS) CVD, or the like or by a combination thereof, and the tungsten plugs 72 and 74 buried in the through holes thereof are formed to similarly form an uppermost-layer aluminum-based wiring MP serving also as, e.g., a bonding pad or the like. As necessary, the silicon-dioxide-based interlayer insulating films 71 and 73 are planarized by a CMP method. Typically, the number of the aluminum-based wiring layers is about three to six. Over the interlayer insulating film 73 and the aluminum-based wiring MP, a final passivation film 75 is deposited by plasma CVD or the like. In the final passivation film 75, a pad opening is formed by dry etching. In the pad opening portion, a UBM (Under Bump Metal) film 76 is formed. For example, a titanium film (lower layer) having a thickness of about 175 μm, and a palladium film (upper layer) having a thickness of about 175 μm are formed in this order. These UBM materials are only illustrative, and are not intended to exclude other similar materials. For example, the palladium film may also be a gold film, but the use of the palladium film provides higher reliability. In addition, palladium has the advantage of material cost slightly lower than that of gold. Over the UBM film 76, a positive resist film having a thickness of, e.g., about 19 to 25 μm is formed. Preferably, a positive resist film having a thickness of 20 μm is formed. Examples of a resist solution used herein include a positive resist for a diazo-naphthoquinone-novolak-based thick film under the trade name of "PMER-P-LA900PM" commercially available from Tokyo Ohka Kogyo Co, LTD. Instead of a coating resist, a film resist may also be used. By exposing the resist to light, and developing it, the opening is formed. In the opening, a metal layer which is to form a bump electrode 7 having a thickness of, e.g., about 15 μm is buried by electric plating. Then, the resist film is removed. Finally, the unneeded UBM film 76 is selectively removed by wet etching using the gold bump 77 as a mask, whereby the bump electrode is completed.

4. Description of High-Breakdown-Voltage-Portion MISFET (Variation of Basic Structure 1 According to CVD Gate Insulating Film Method: Lg-Direction Contact Method) in Semiconductor Integrated Circuit Device in Embodiment of Present Invention (Primarily Using FIGS. 43 and 44)

Figure 43:
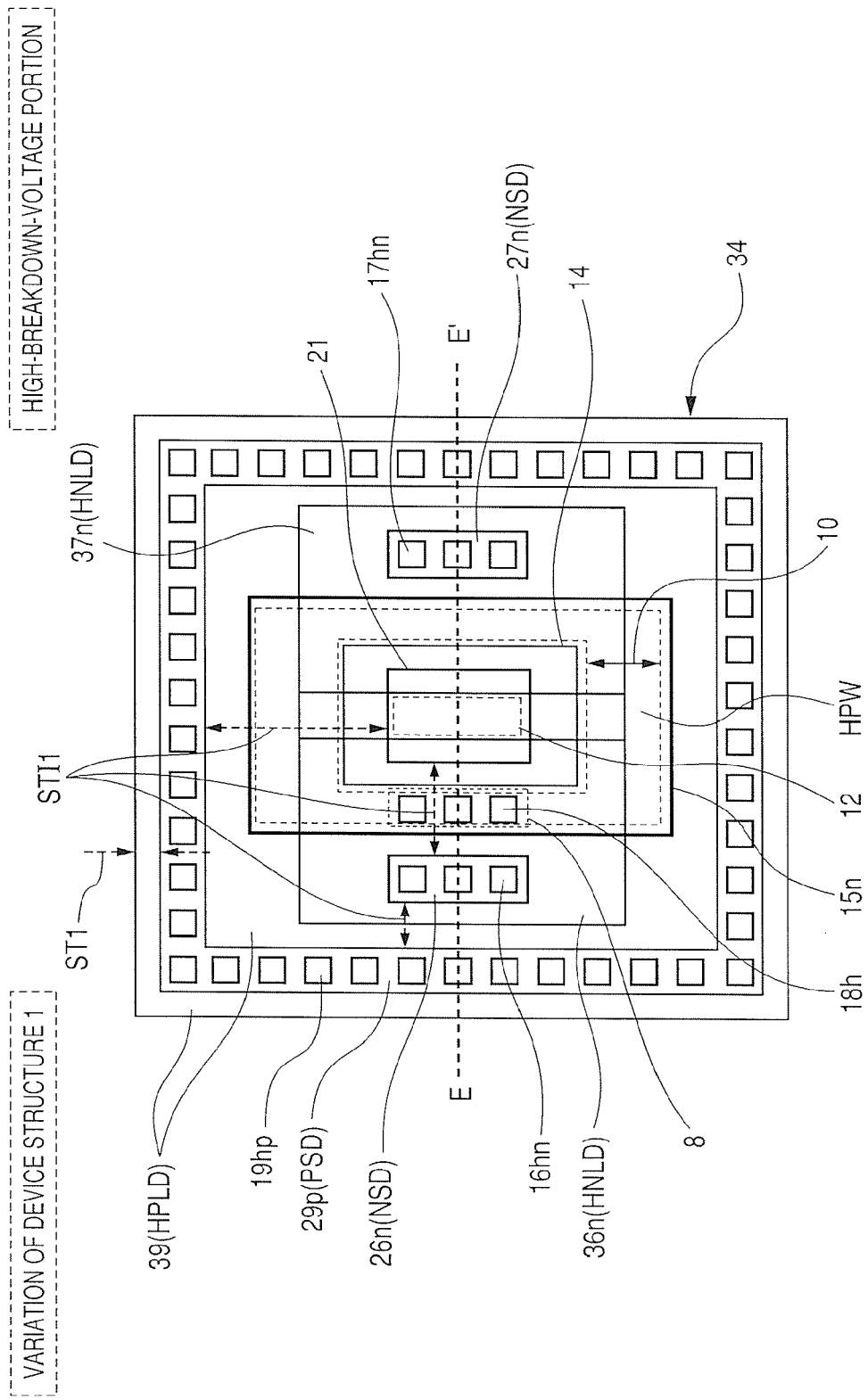
FIG. 43 is an upper-surface layout diagram of the high-breakdown-voltage-portion N-channel MISFET (a variation of the basic structure 1 according to the CVD gate insulating film method) in the semiconductor integrated circuit device in the embodiment of the present invention.
Figure 44:
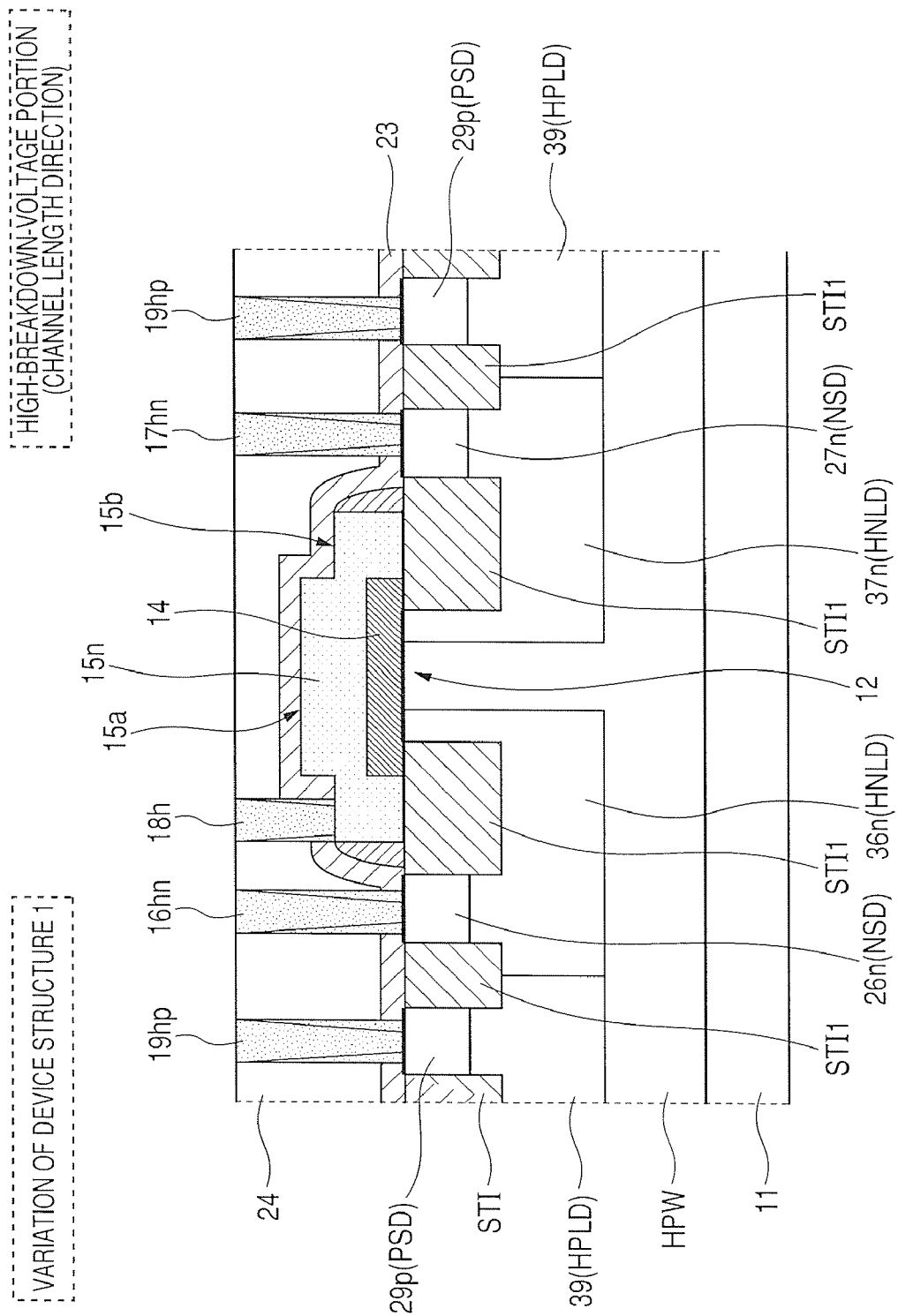
FIG. 44 is a cross-sectional view along the line E-E' of FIG. 43.

FIG. 43 is an upper-surface layout diagram of the high-breakdown-voltage-portion N-channel MISFET (a variation of the basic structure 1 according to the CVD gate insulating film method) in the semiconductor integrated circuit device in the embodiment of the present invention. FIG. 44 is a cross-sectional view along the line E-E' of FIG. 43.

As shown in FIGS. 43 and 44, this example is a variation of the structure of the high-breakdown-voltage MISFET. The difference between the structure of the variation and that of FIG. 6 (FIGS. 2 to 4) is that, in contrast to the gate contact portion 8 of the high-breakdown-voltage MISFET of FIG. 6 which is in the direction of the channel width Wg, the gate contact portion 8 of the high-breakdown-voltage MISFET of the variation is in the direction of the channel length Lg. That is, at the upper surface (lower level) 15b of the polysilicon gate electrode of the high-breakdown-voltage MISFET, a contact is provided between the gate electrode 15n and the gate contact electrode 18h of the high-breakdown-voltage MISFET.

As described above, the high-breakdown-voltage N-channel MISFET (which substantially corresponds to the high-breakdown-voltage P-channel MISFET hereinafter) in the present embodiment has the structure in which the end portion of the high-breakdown-voltage gate insulating film 14 (CVD gate insulating film) is located inwardly of the end portion of the gate electrode 15n in the channel width direction, and the gate contact portion 8 is not present. That is, in the channel length direction, the length of the gate insulating film 14 is smaller than the length of the gate electrode 15n, and larger than the length of the channel formation portion as the region interposed in the field insulating film STI1. In addition, the gate contact portion 8 is located between the end portion of the gate insulating film 14 and the gate electrode 15n. As a result, there is an advantage that the high-breakdown-voltage-portion P-type guard ring region 39 (P-type isolation well) can be reduced.

Moreover, in the channel length direction, the end portion of the high-breakdown-voltage gate insulating film 14 (CVD gate insulating film) is located inwardly of the end portion of the gate electrode 15n and between the gate contact portion 8 and the channel end portion. As a result, an allowance for the distance between the end portion of the gate electrode and the N-well power supply ring 29n can be reduced and, since the CVD gate insulating film is not present therebetween, higher integration is allowed.

As described above, the high-breakdown-voltage N-channel MISFET (which substantially corresponds also to the high-breakdown-voltage P-channel MISFET hereinafter) also has the structure in which the end portion of the high-breakdown-voltage gate insulating film (CVD gate insulating film) 14 is located inwardly of the end portion of the gate electrode 15n and between the gate contact portion 8 and the opening 21 of the field insulating film which substantially corresponds to the channel region. Accordingly, the depth of the gate contact in the high-breakdown-voltage portion is equal to the depth of the gate contact in the low-breakdown-voltage portion to allow easy manufacturing. As a result, the diameter of the gate contact (diameter of the lower end portion) in the high-breakdown-voltage portion decreases equally to the diameter (diameter of the lower end portion) of the gate contact in the low-breakdown-voltage portion, and the layout margin for the gate contact in the high-breakdown-voltage portion increases.

Moreover, in the channel length direction, the end portion of the high-breakdown-voltage gate insulating film (CVD gate insulating film) 14 is located inwardly of the end portion of the gate electrode 15n and between the gate contact portion 8 and the opening 21 of the field insulating film which substantially corresponds to the channel region. As a result, the allowance for the distance between the end portion of the gate electrode and the source/drain contact regions 26n and 27n can be reduced and, since the CVD gate insulating film is not present therebetween, higher integration is allowed.

5. Description of Cross-Sectional Flow of Each Device Portion in Manufacturing Process of Semiconductor Integrated Circuit Device Including High-Breakdown-Voltage-Portion MISFET (Device Structure 2 According to Thermal Oxide Gate Insulating Film Method: Wg-Direction Contact Method) in Embodiment of Present Invention (Primarily Using FIGS. 45, 90, 46-89, 96, and 93)

Figure 45:
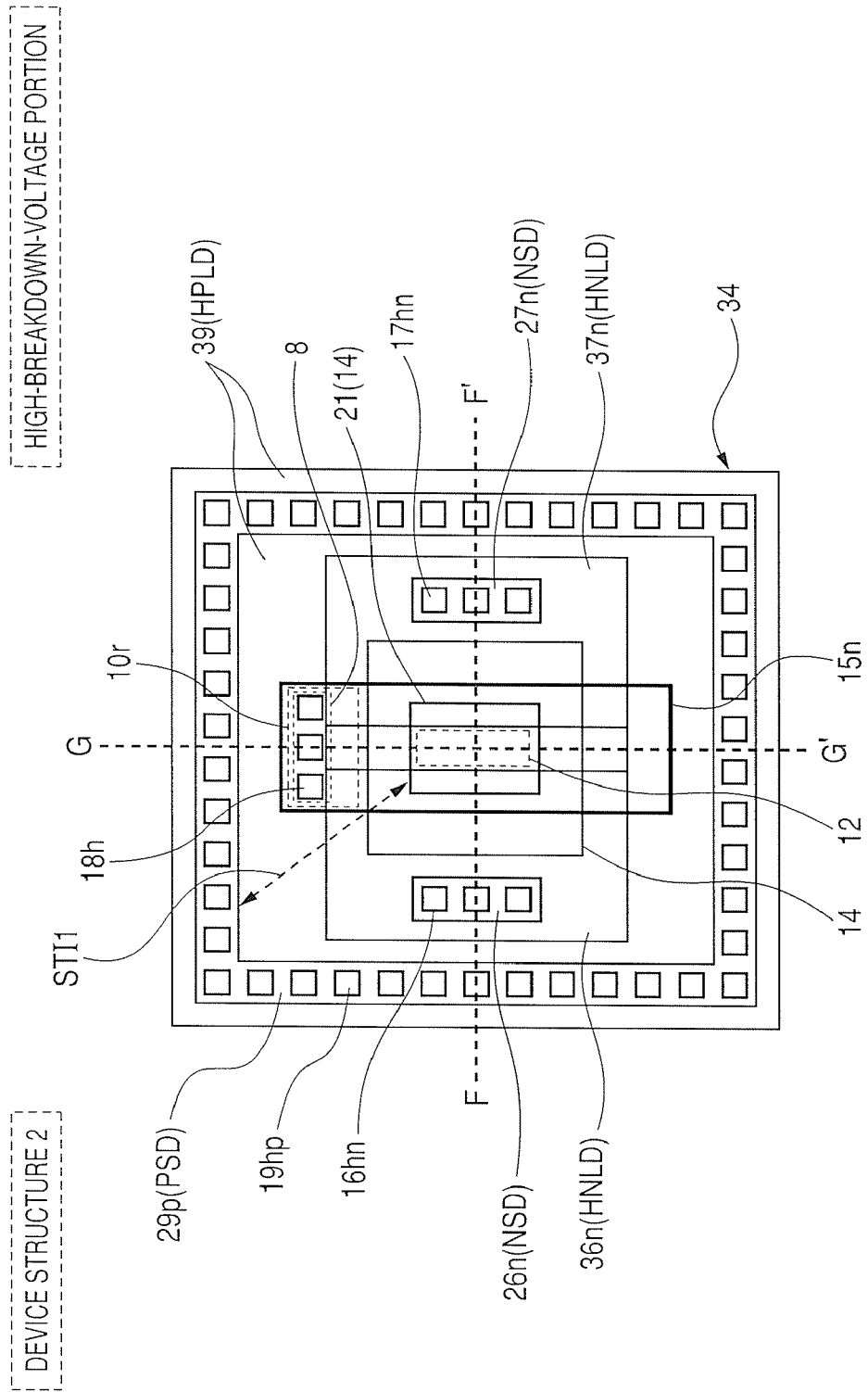
FIG. 45 is an upper-surface layout diagram of the high-breakdown-voltage-portion N-channel MISFET (a device structure 2 according to a thermal oxide gate insulating film method) in the semiconductor integrated circuit device in another embodiment of the present invention.
Figure 90:
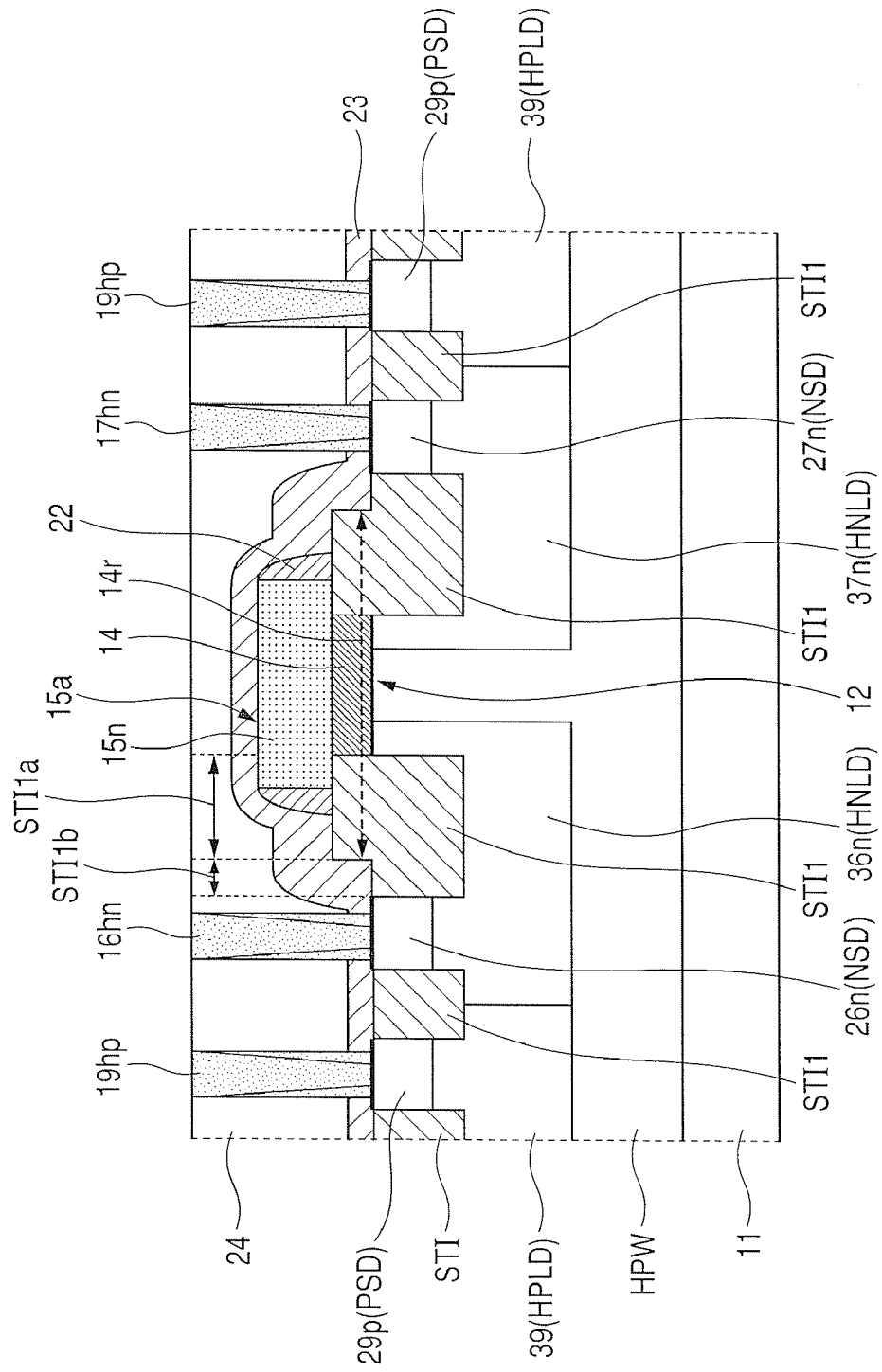
FIG. 90 is a device cross-sectional view corresponding to the cross section along the line F-F' of FIG. 45.

FIG. 45 is an upper-surface layout diagram of the high-breakdown-voltage-portion N-channel MISFET (a device structure 2 according to a thermal oxide gate insulating film method) in the semiconductor integrated circuit device in another embodiment of the present invention. FIG. 90 is a device cross-sectional view corresponding to a cross section along the line F-F' of FIG. 45.

Figure 57:
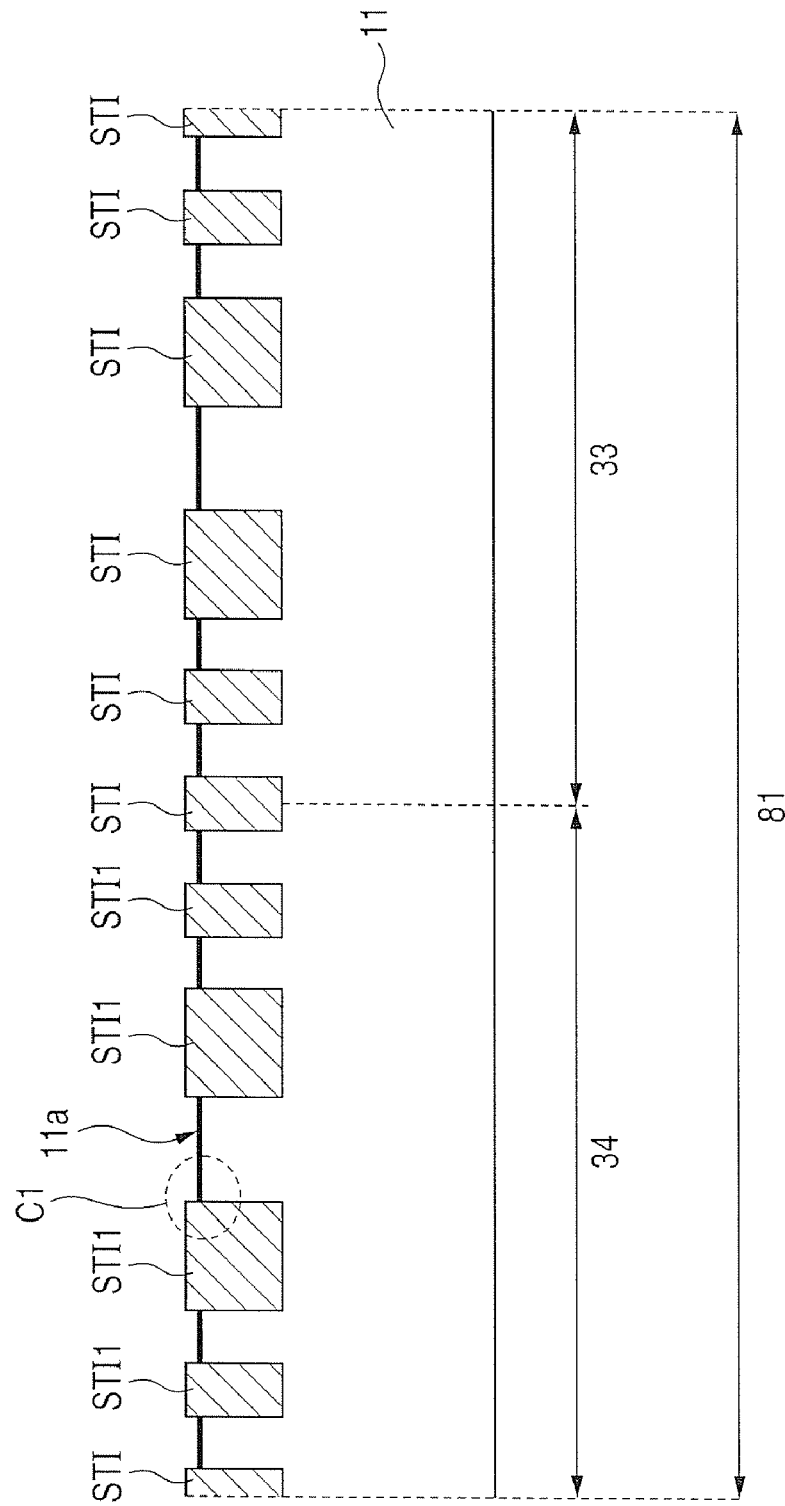
FIG. 57 is a device cross-sectional flow diagram (in the step of forming the isolation region in the high-breakdown-voltage portion) in the channel length direction (corresponding to a cross section along the line F-F' of FIG. 45, which holds true hereinafter) for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 58:
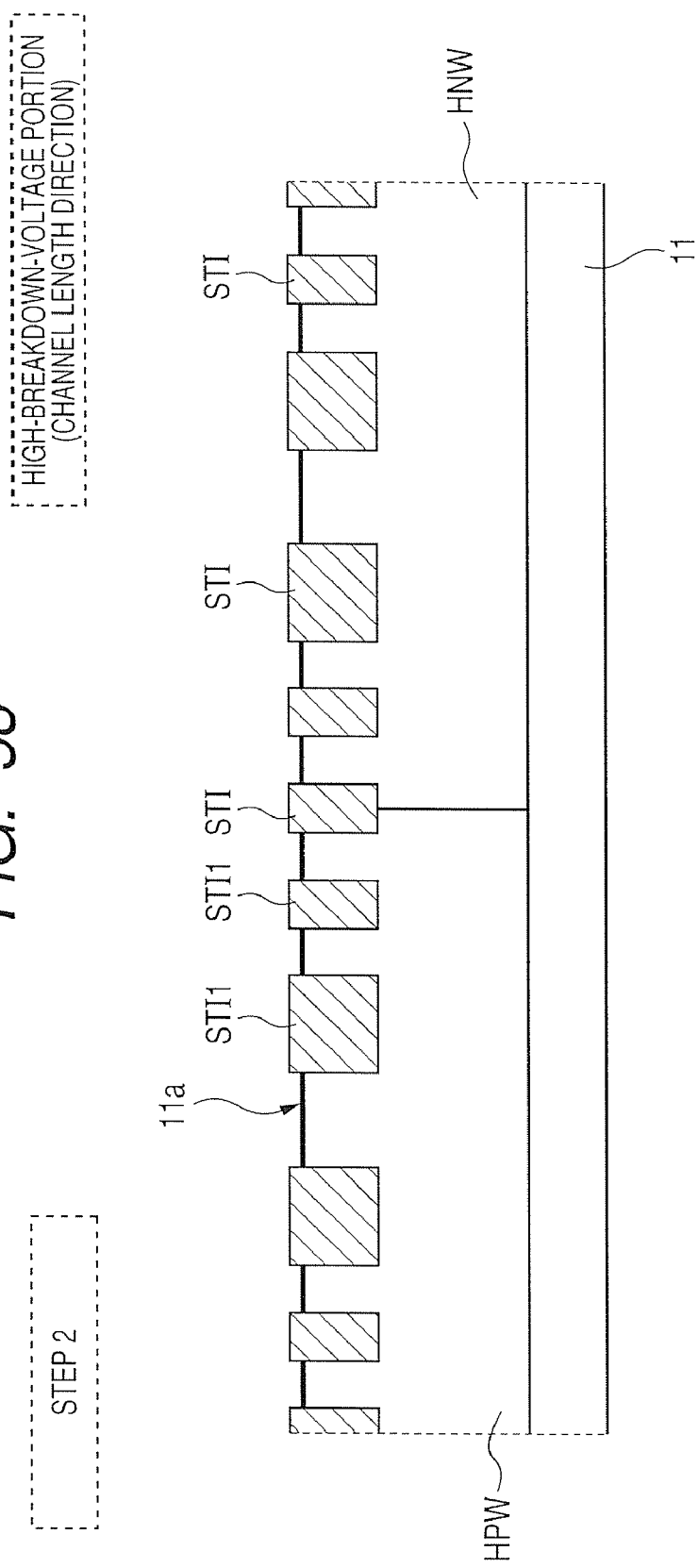
FIG. 58 is a device cross-sectional flow diagram (in the step of forming the both deep well regions in the high-breakdown-voltage portion) in the channel length direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 59:
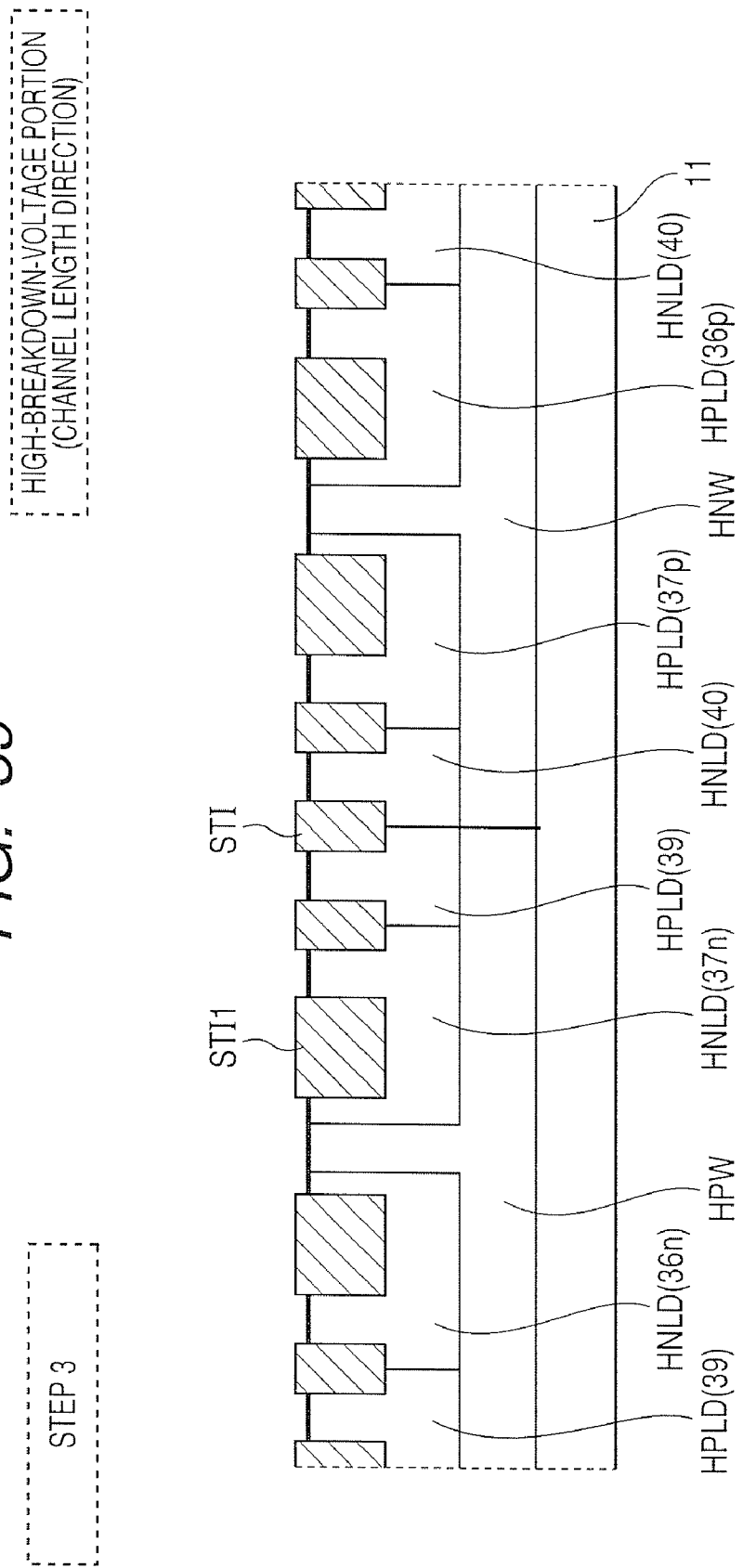
FIG. 59 is a device cross-sectional flow diagram (in the step of forming the source/drain regions in the high-breakdown-voltage portion) in the channel length direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 60:
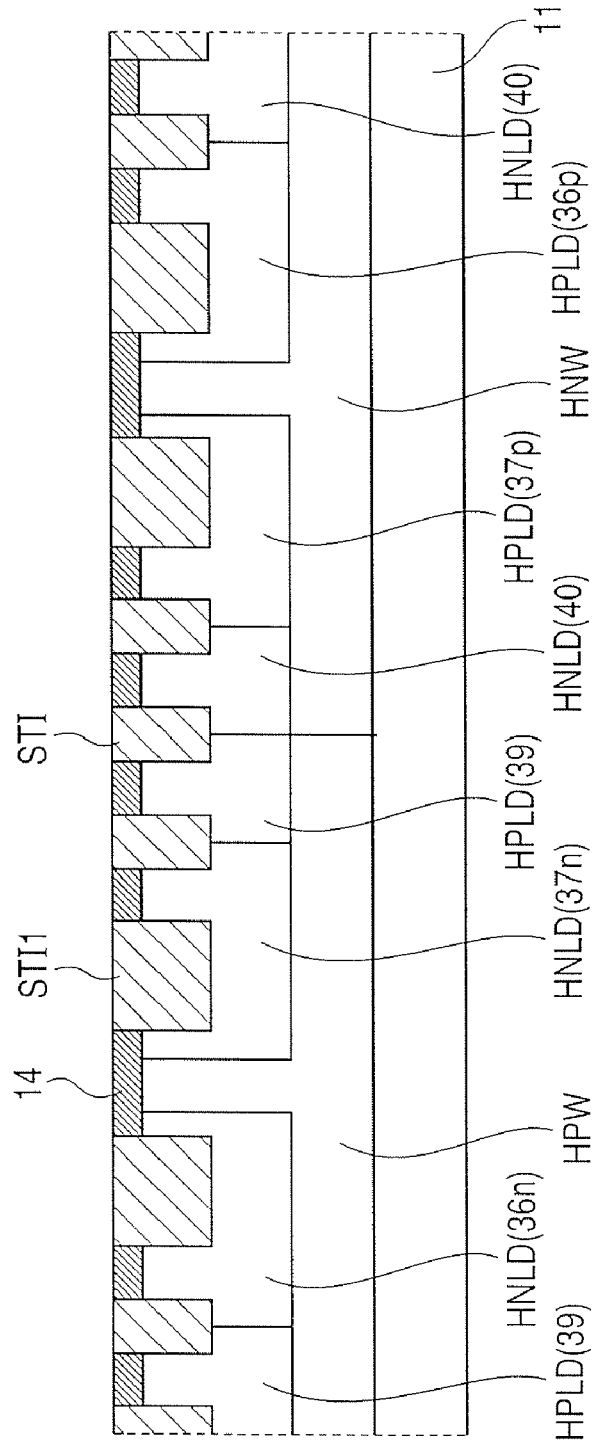
FIG. 60 is a device cross-sectional flow diagram (in a step of forming a gate oxide film in the high-breakdown-voltage portion) in the channel length direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 61:
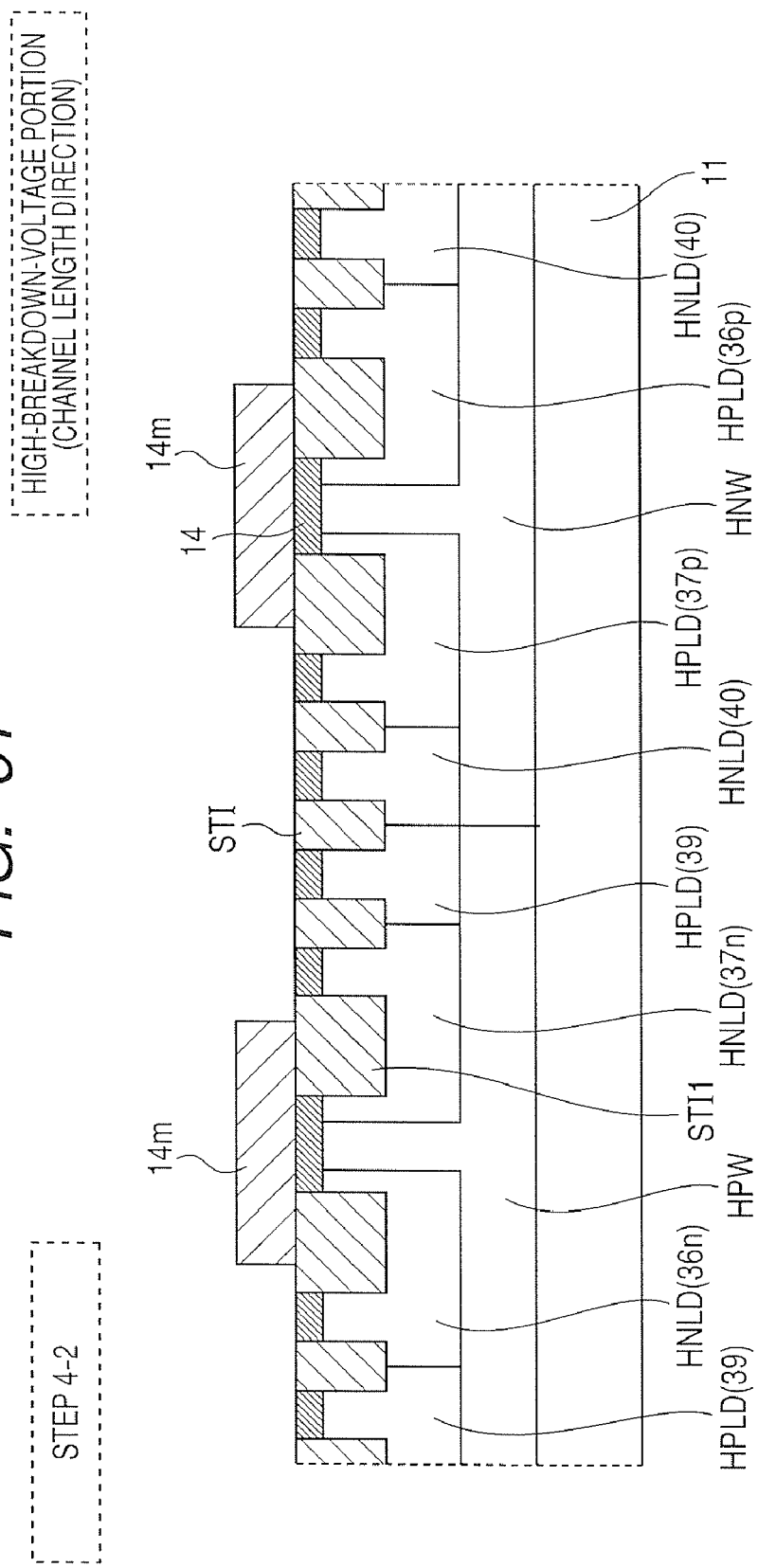
FIG. 61 is a device cross-sectional flow diagram (in a gate-oxide-film-covering-resist-film patterning step in the high-breakdown-voltage portion) in the channel length direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 62:
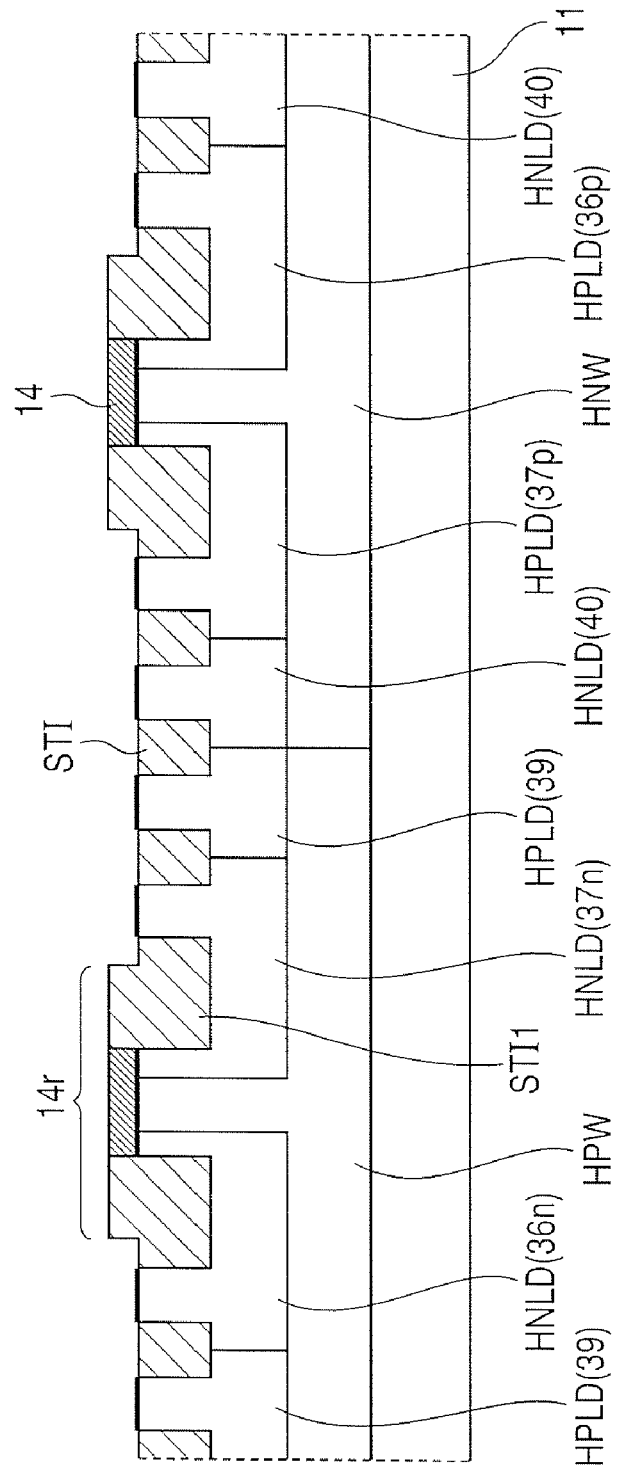
FIG. 62 is a device cross-sectional flow diagram (in a gate-oxide-film patterning step in the high-breakdown-voltage portion) in the channel length direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 63:
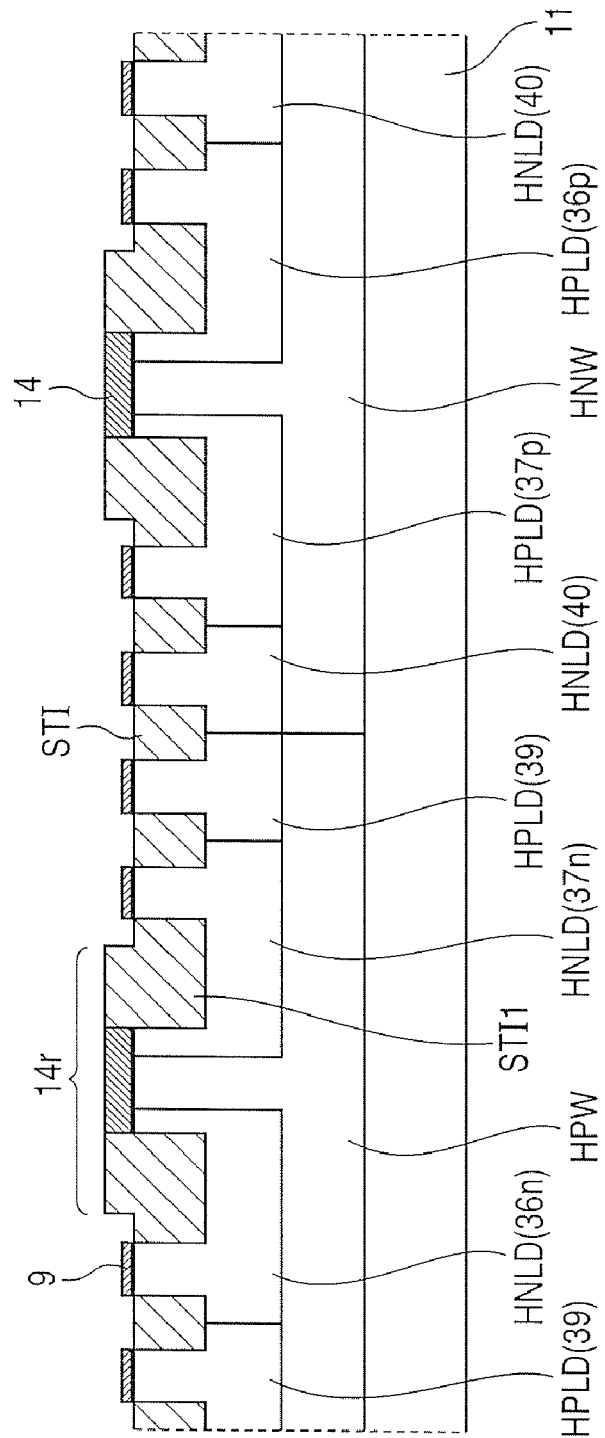
FIG. 63 is a device cross-sectional flow diagram (in the step 5 in the high-breakdown-voltage portion) in the channel length direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 64:
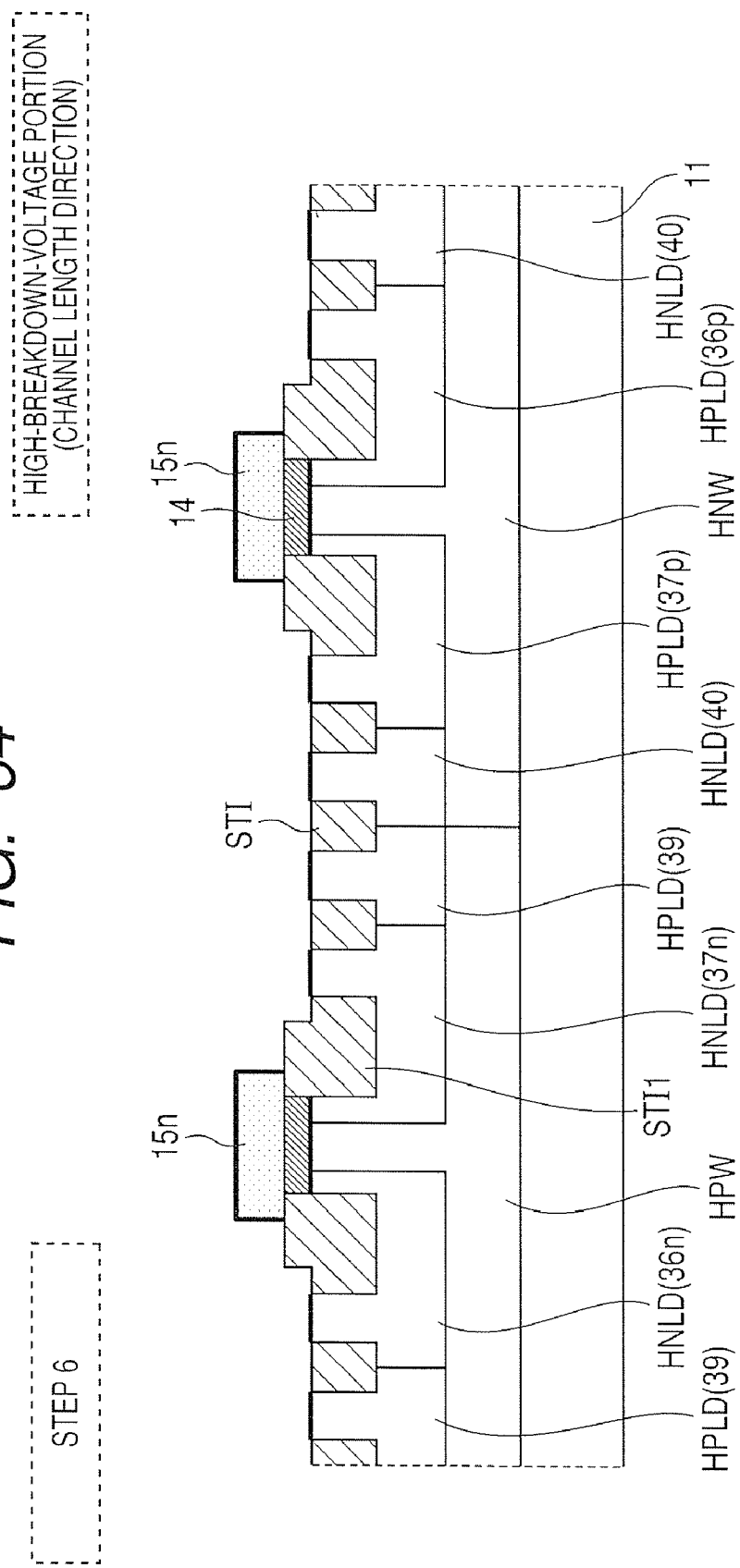
FIG. 64 is a device cross-sectional flow diagram (in a gate-electrode patterning step in the high-breakdown-voltage portion) in the channel length direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 65:
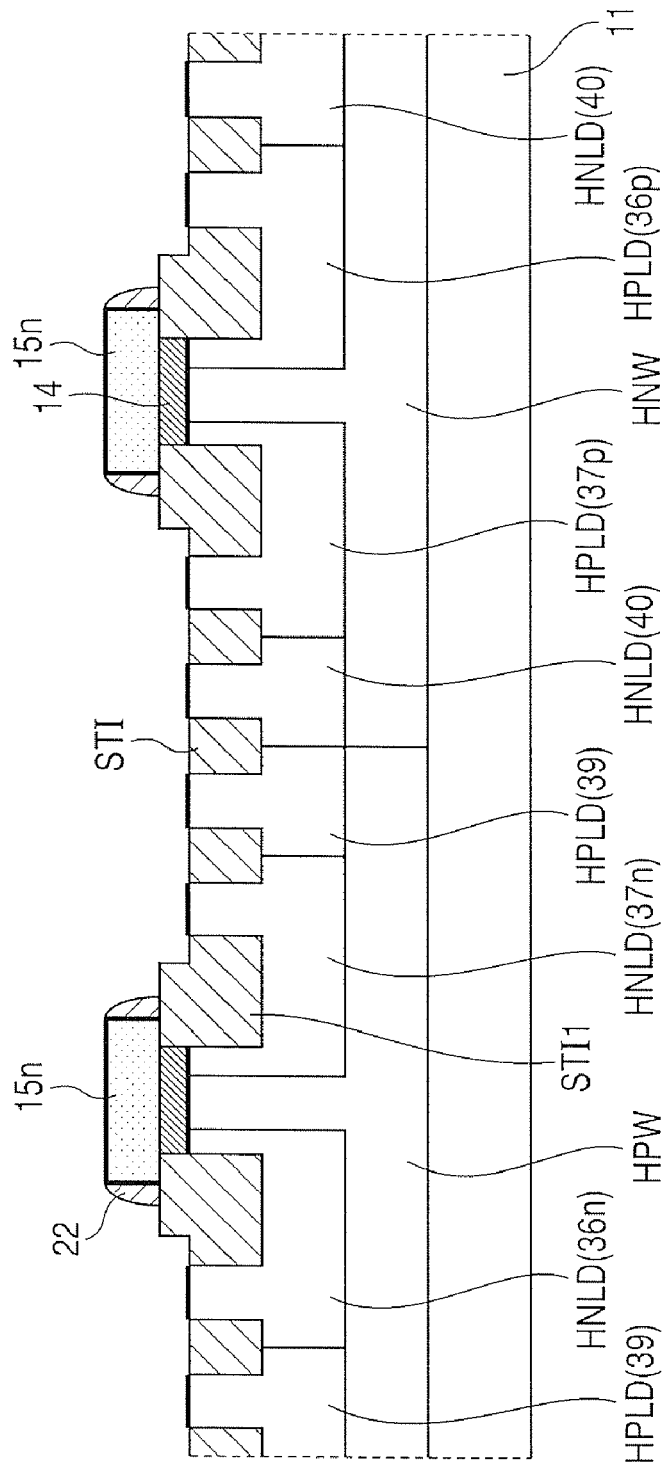
FIG. 65 is a device cross-sectional flow diagram (in the step of forming the sidewalls in the high-breakdown-voltage portion) in the channel length direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 66:
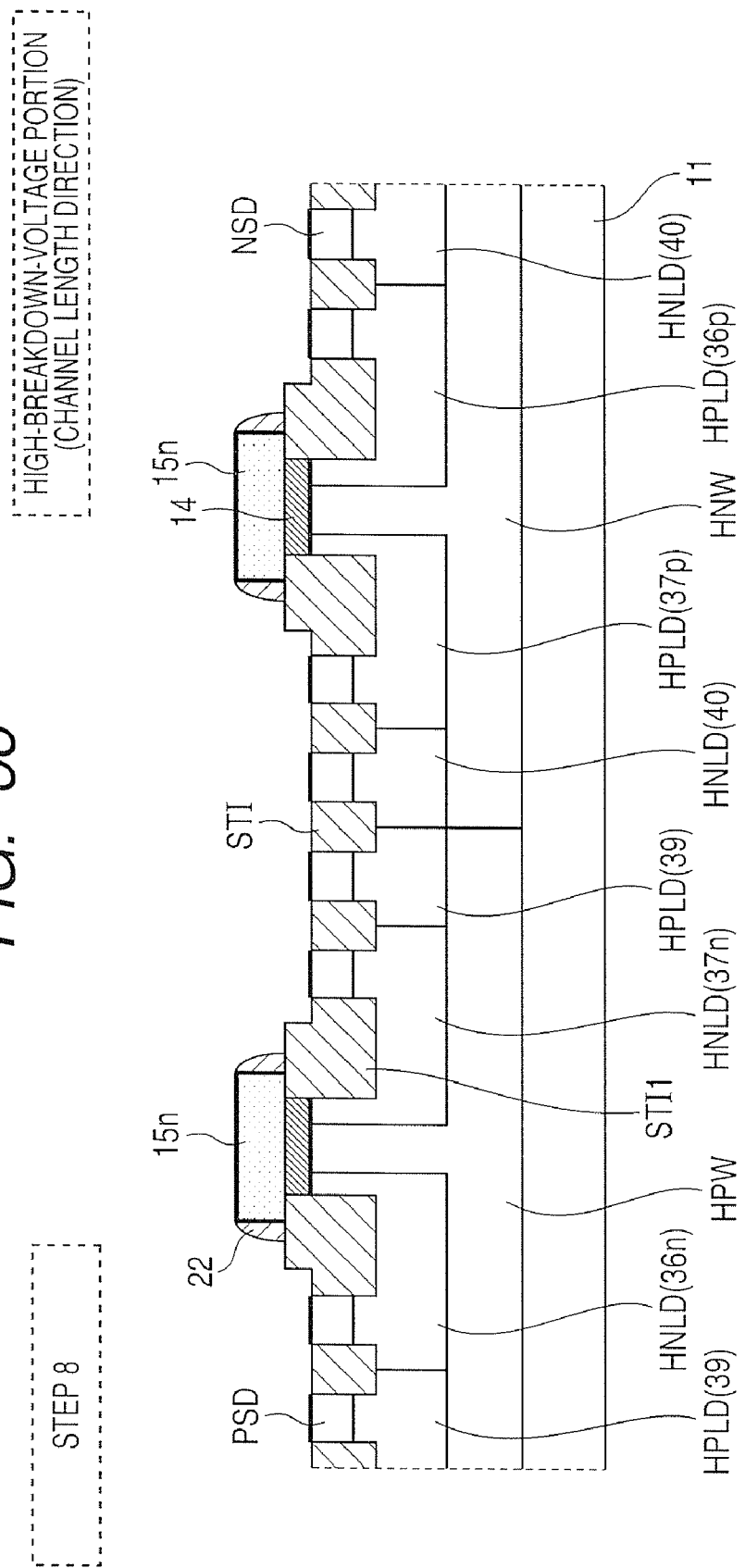
FIG. 66 is a device cross-sectional flow diagram (in the step of forming the high-concentration contact regions in the high-breakdown-voltage portion) in the channel length direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 67:
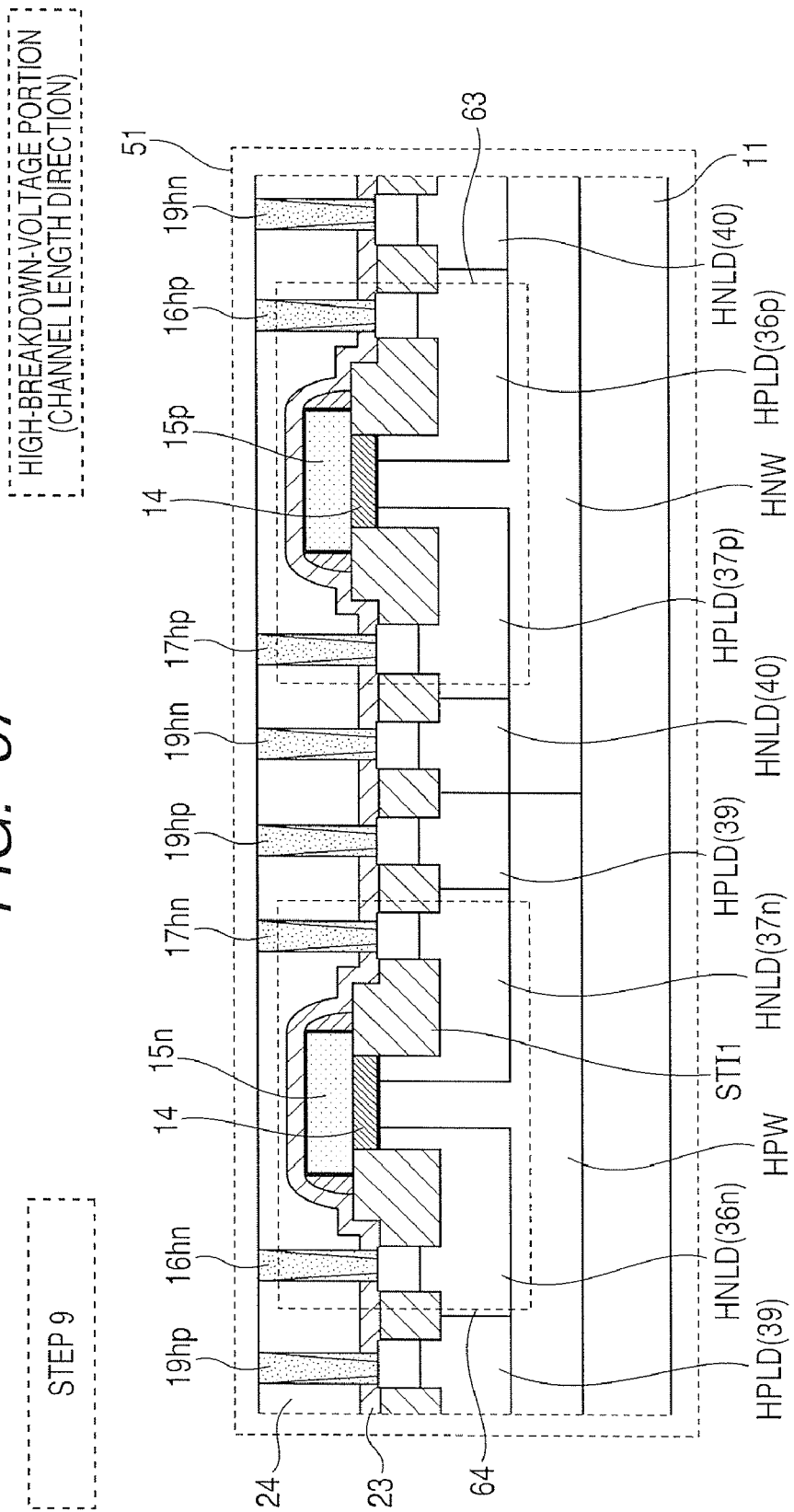
FIG. 67 is a device cross-sectional flow diagram (in the pre-metal step in the high-breakdown-voltage portion) in the channel length direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 68:
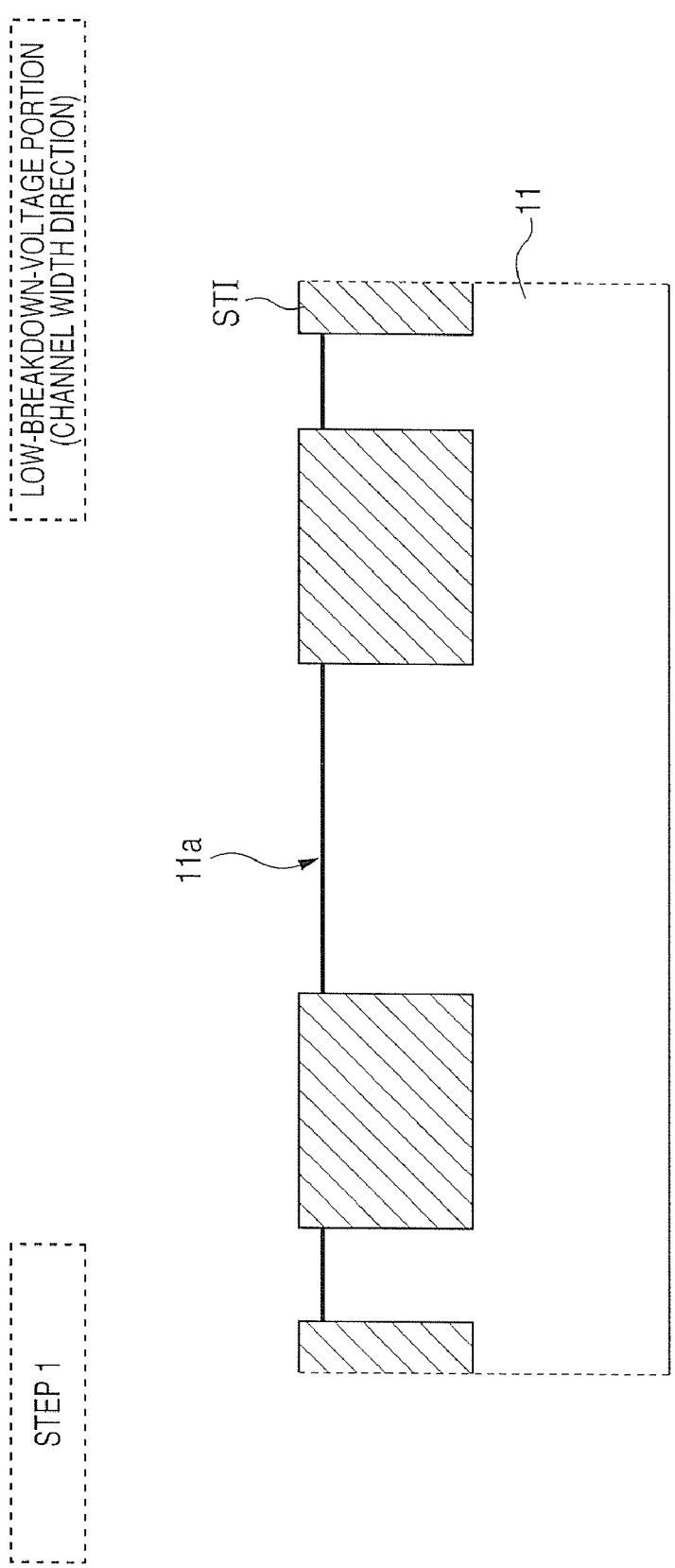
FIG. 68 is a device cross-sectional flow diagram (in the step of forming the isolation region in the low-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 69:
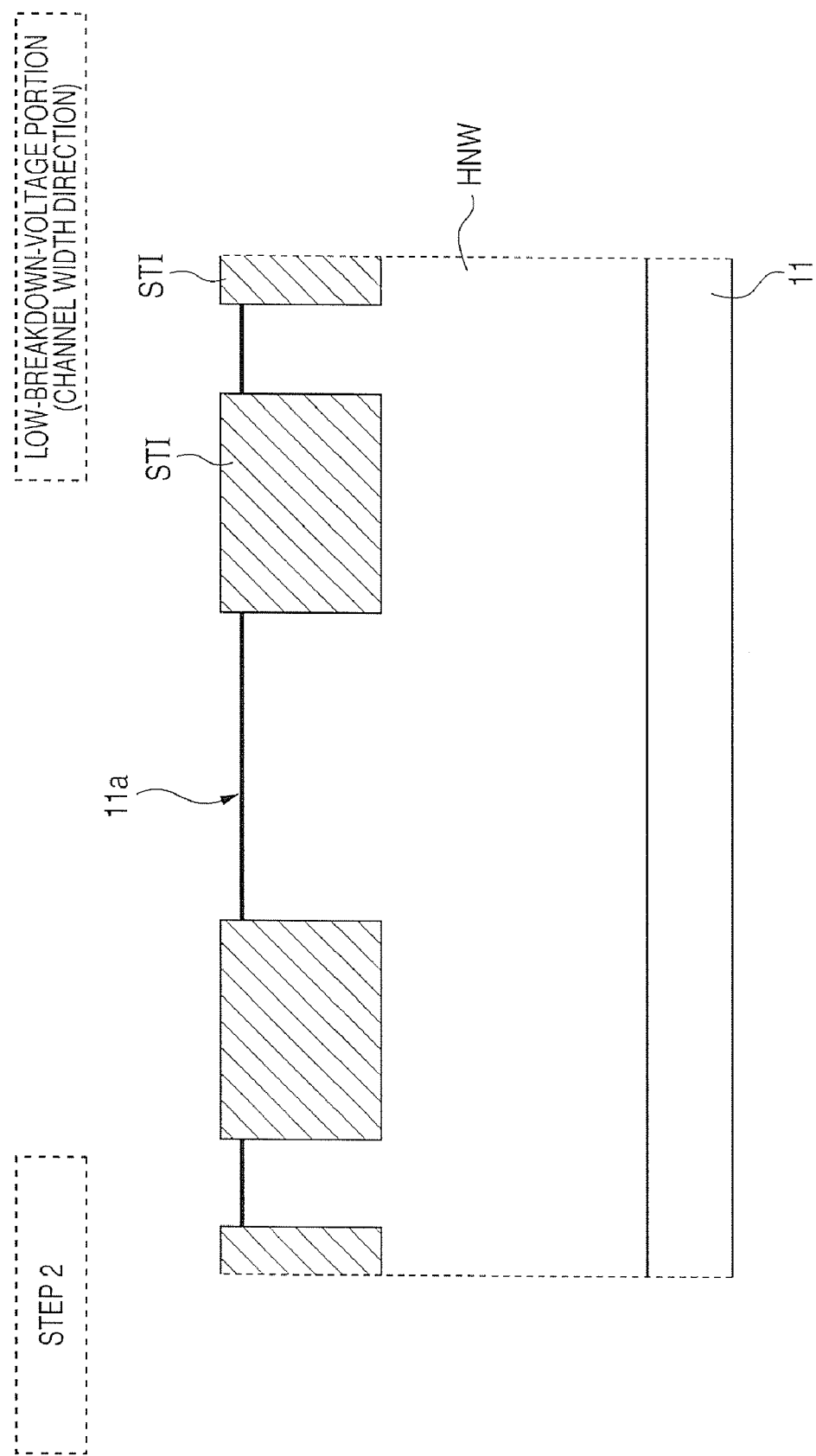
FIG. 69 is a device cross-sectional flow diagram (in the step of forming the deep N-well region in the low-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 70:
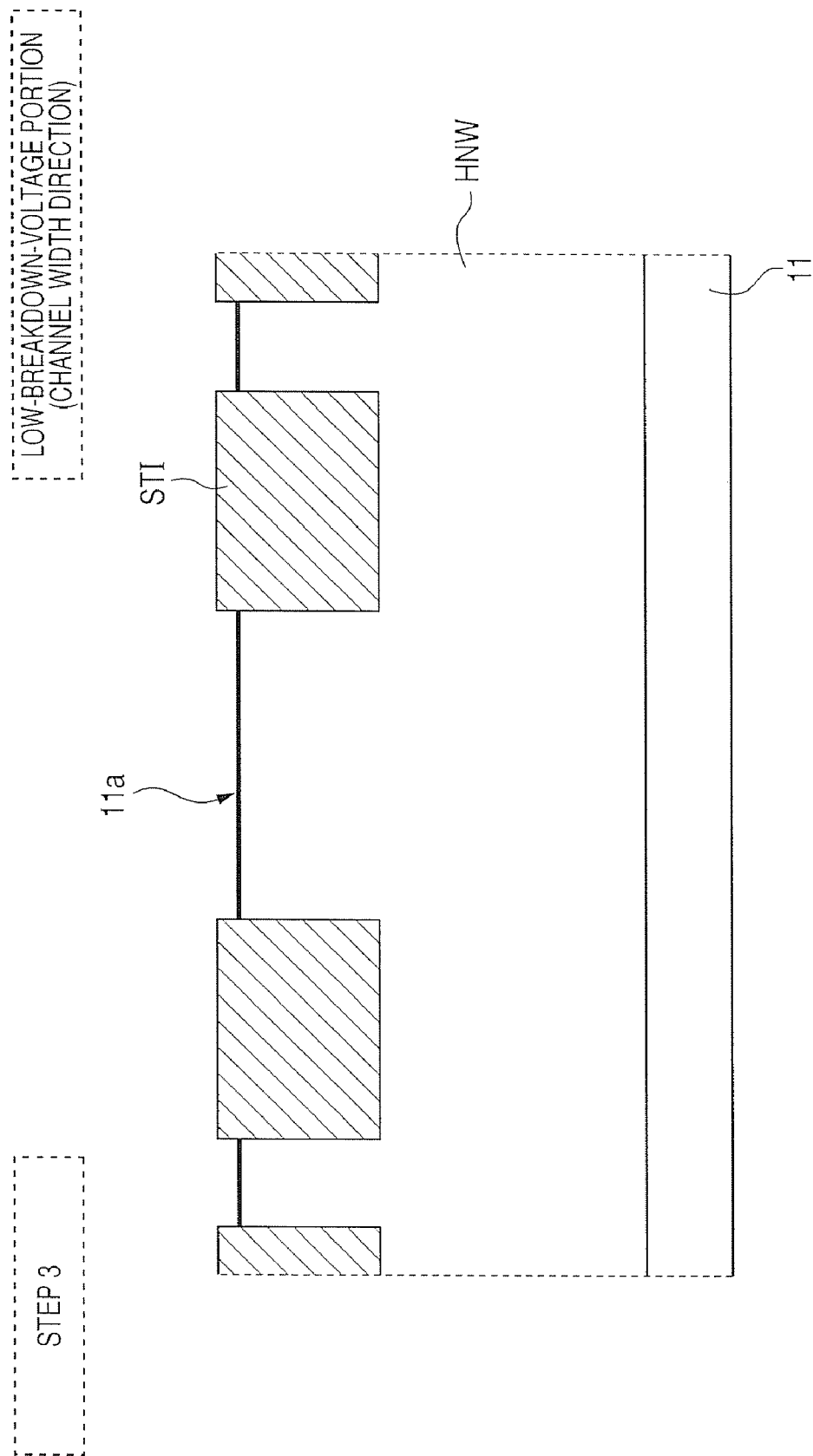
FIG. 70 is a device cross-sectional flow diagram (in the step of forming the deep N-well region in the low-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 71:
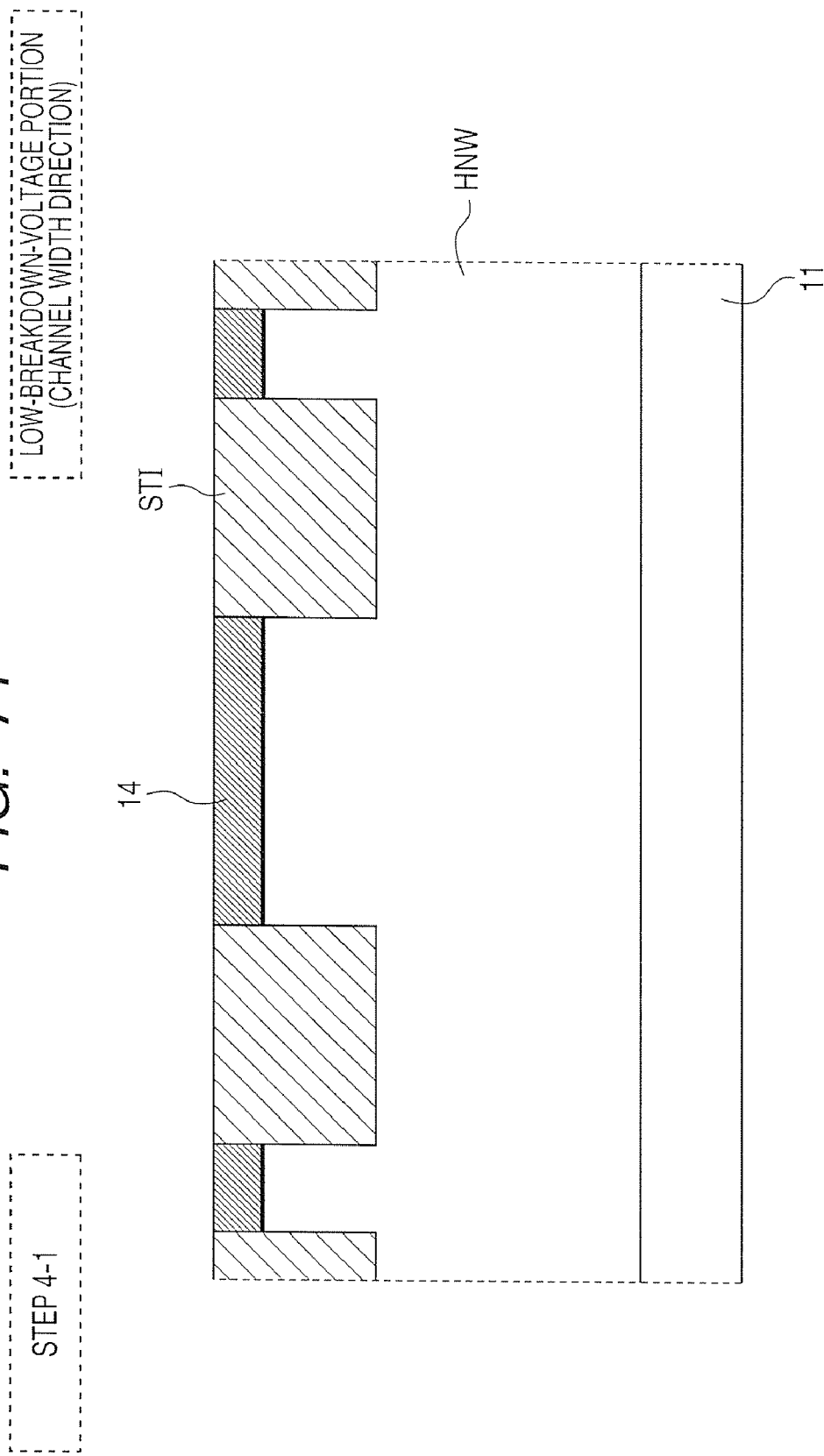
FIG. 71 is a device cross-sectional flow diagram (in the step 4-1 in the low-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 72:
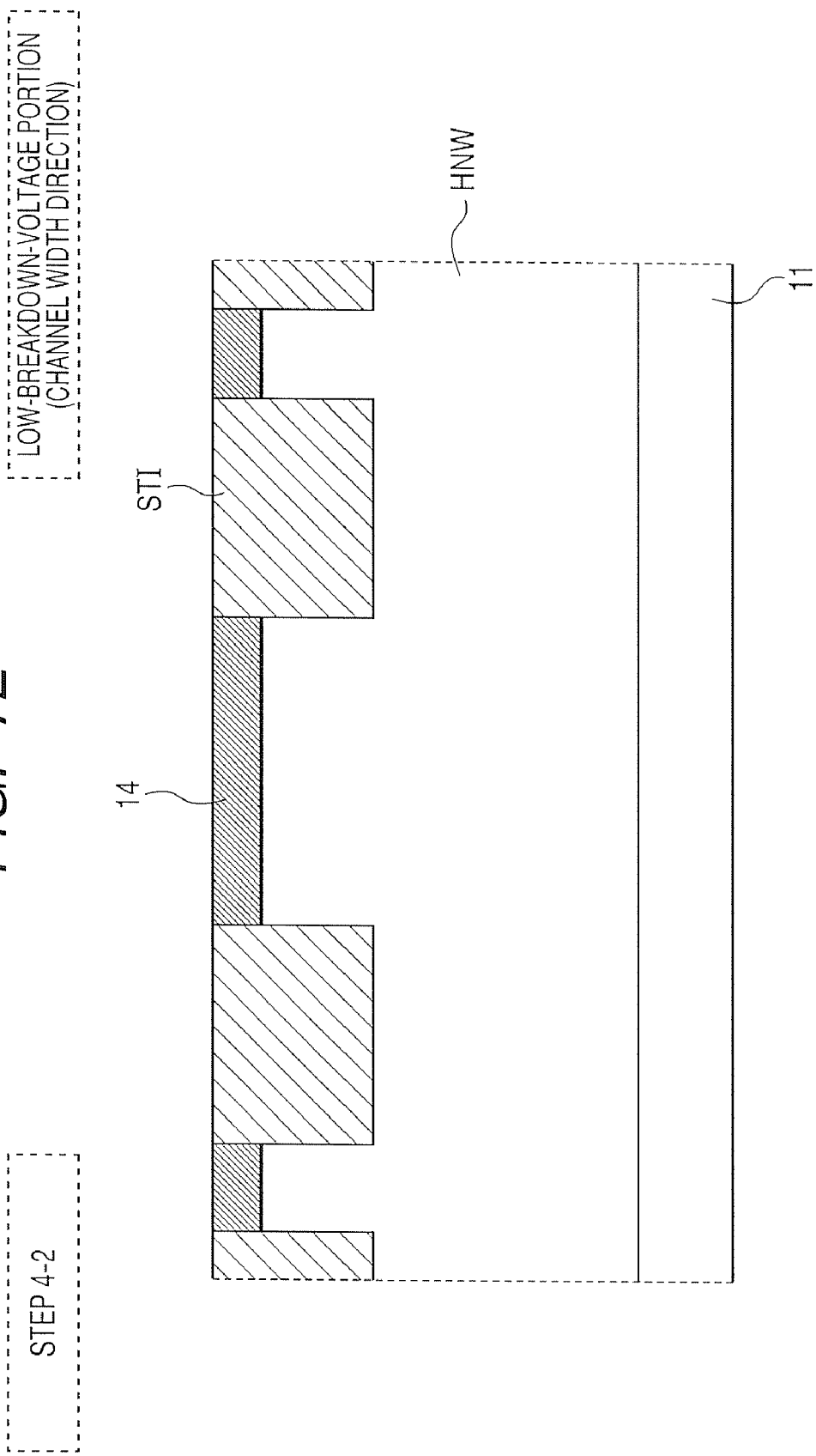
FIG. 72 is a device cross-sectional flow diagram (in the step 4-2 in the low-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 73:
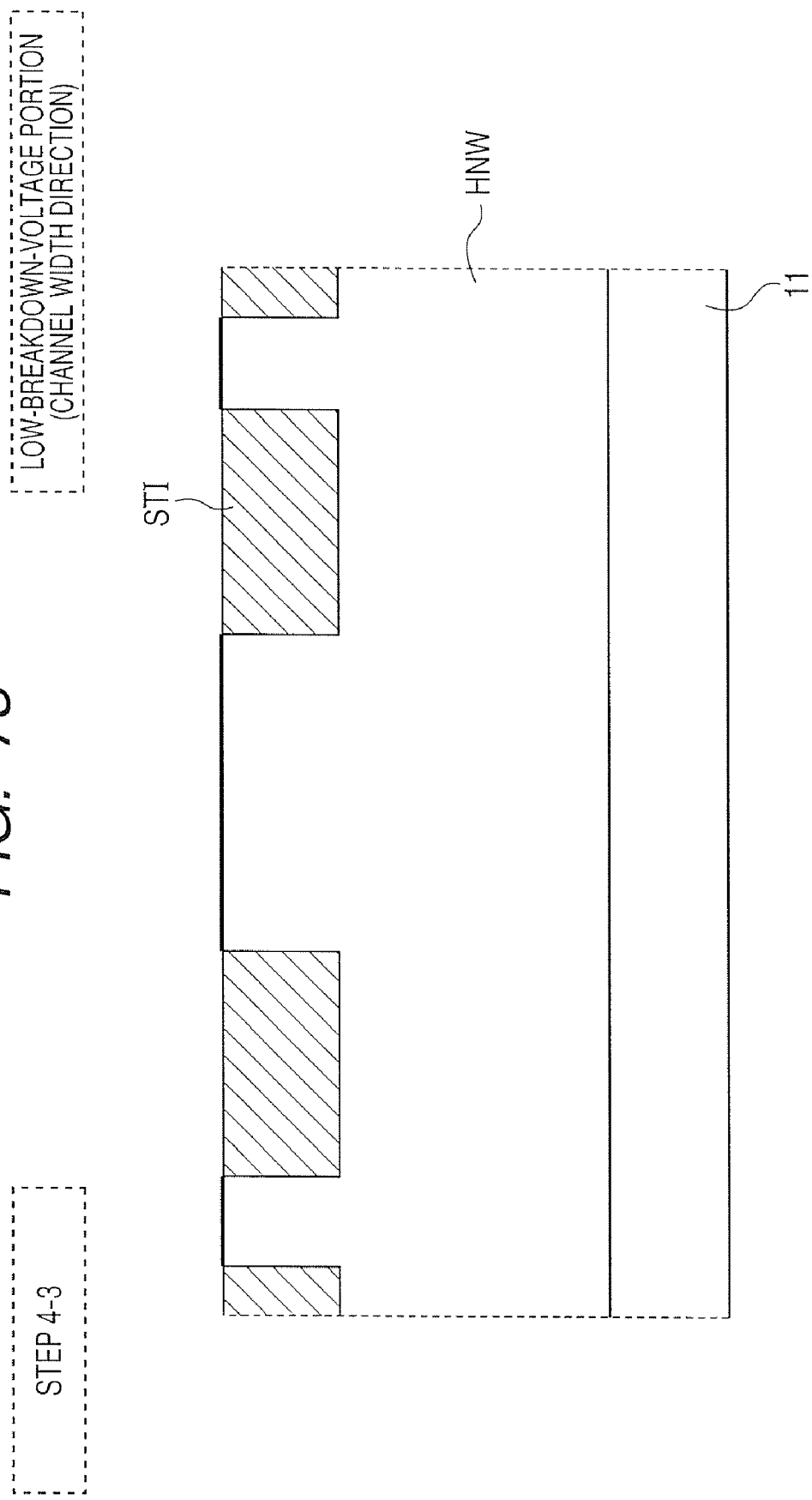
FIG. 73 is a device cross-sectional flow diagram (in the step of etching the oxide film in the low-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 74:
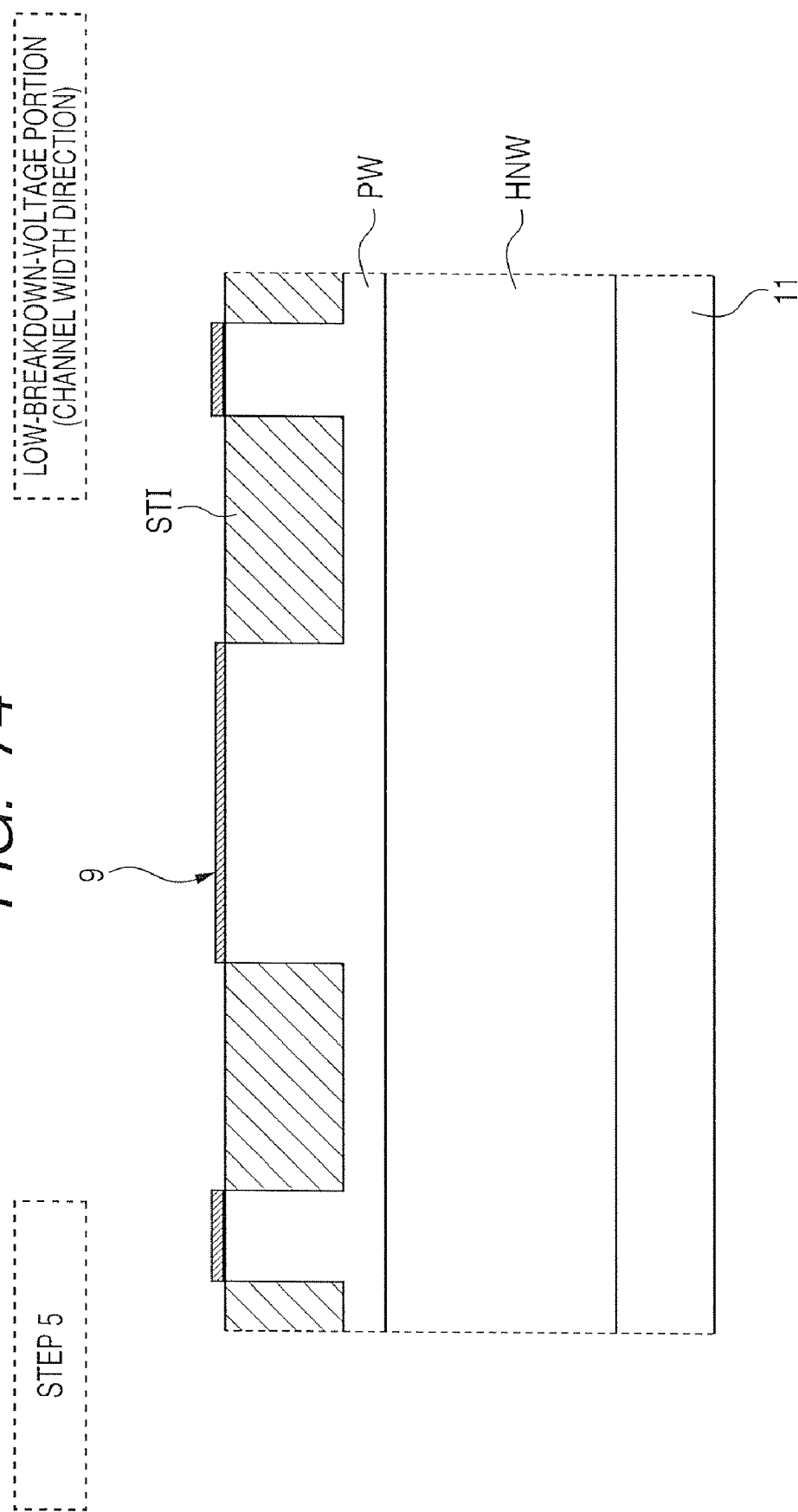
FIG. 74 is a device cross-sectional flow diagram (in the step of forming the both wells and the gate oxide film in the low-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 75:
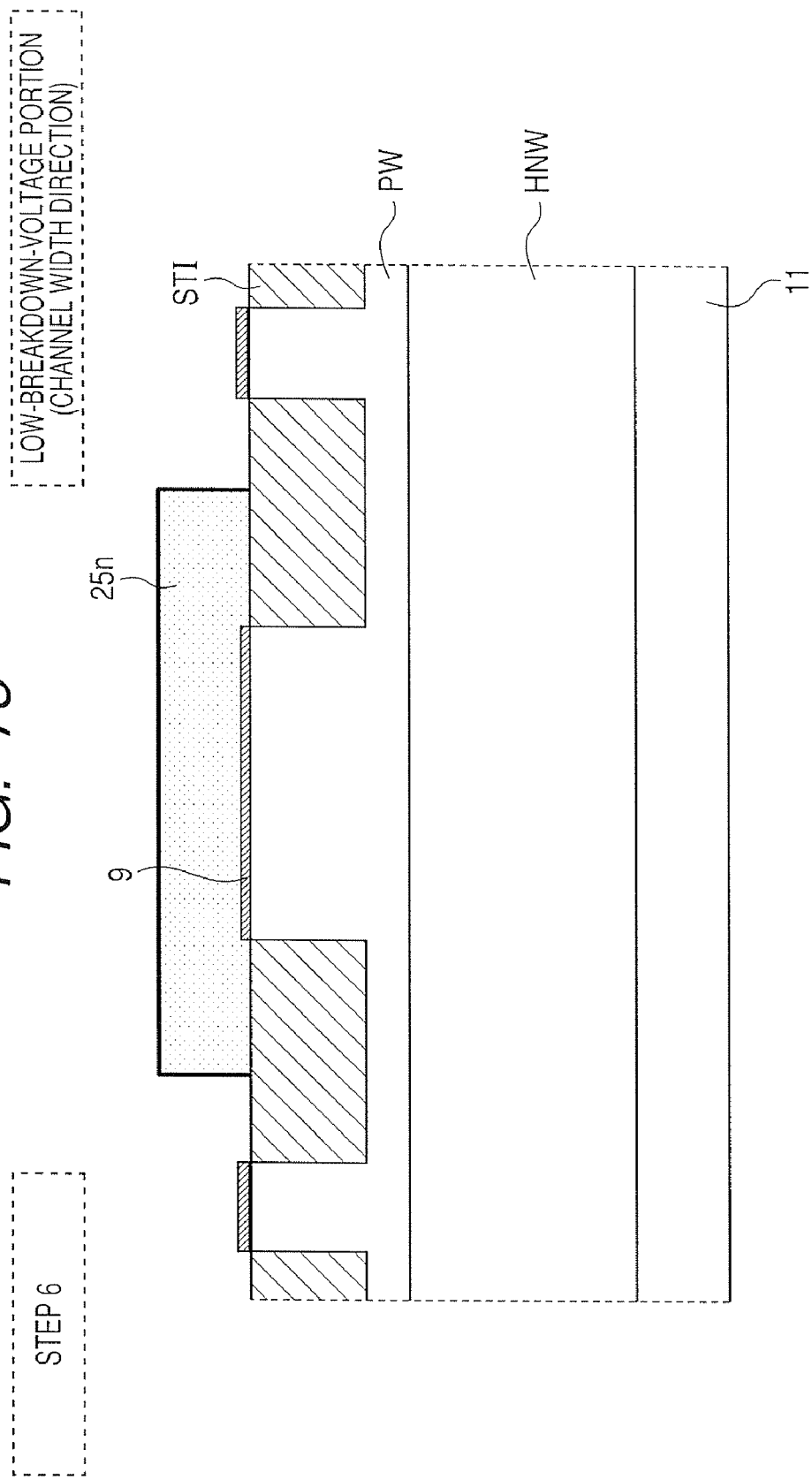
FIG. 75 is a device cross-sectional flow diagram (in the gate-electrode patterning step in the low-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 76:
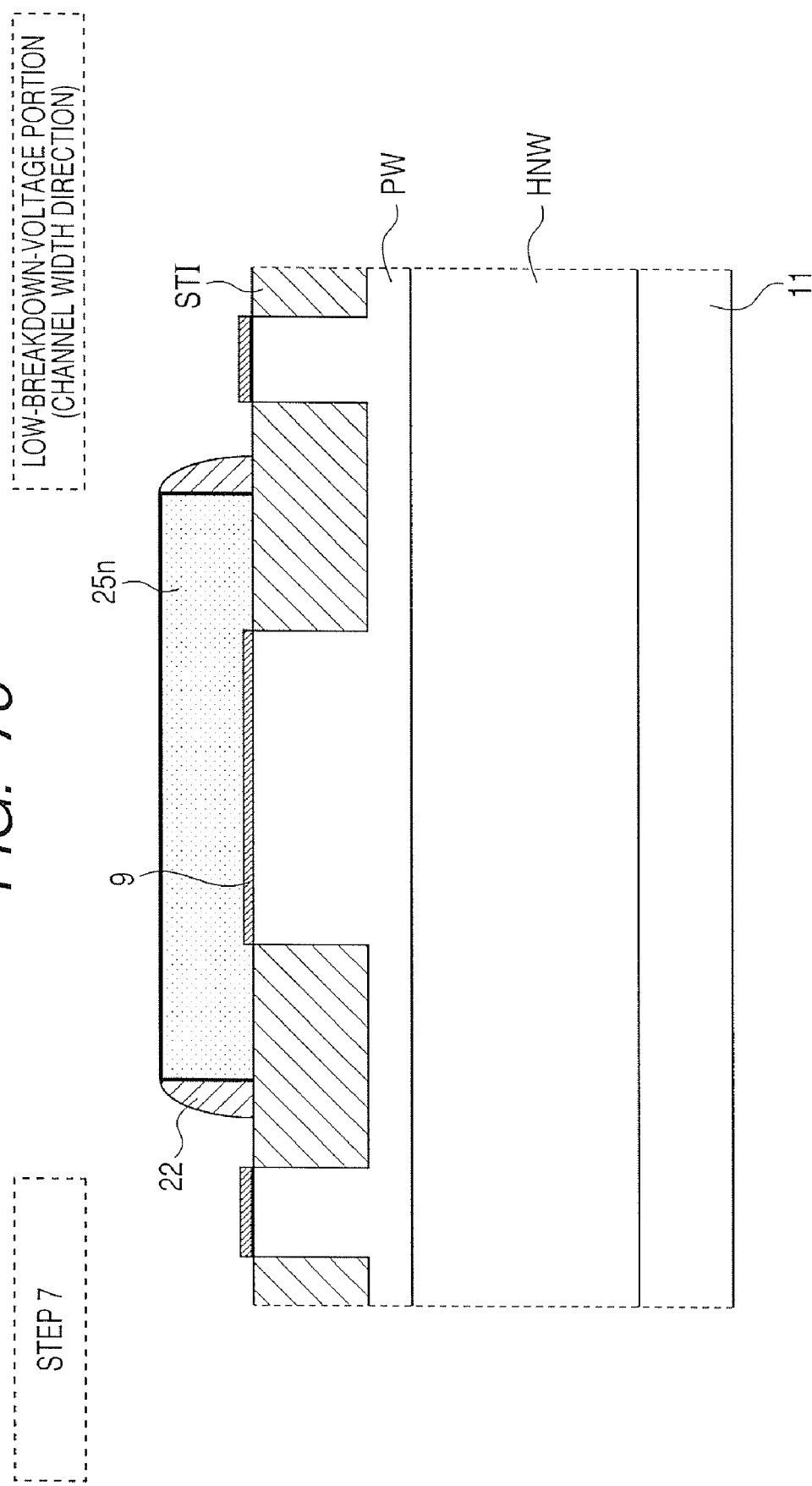
FIG. 76 is a device cross-sectional flow diagram (in the step of forming the sidewalls in the low-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 77:
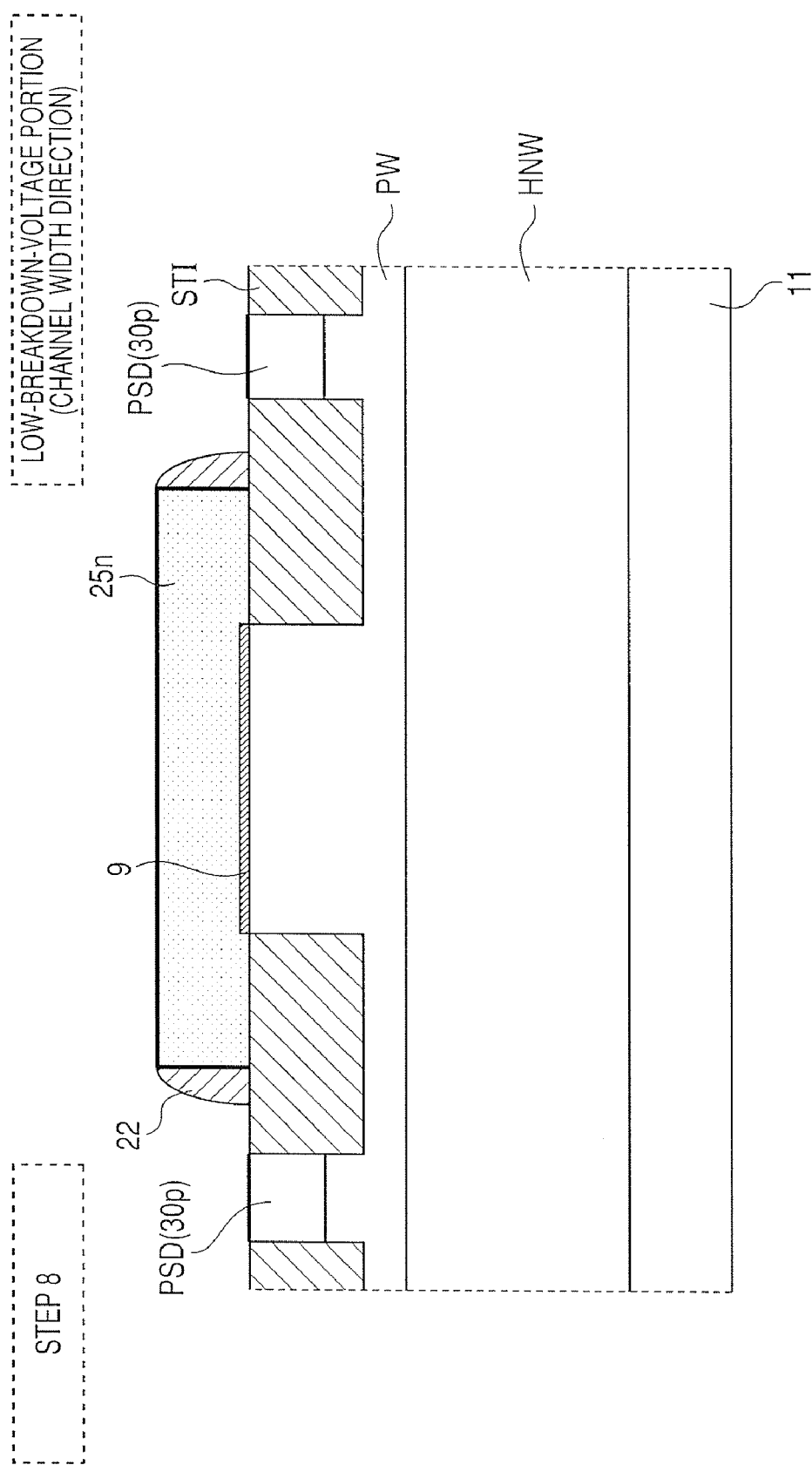
FIG. 77 is a device cross-sectional flow diagram (in the step of forming the well contact regions in the low-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 78:
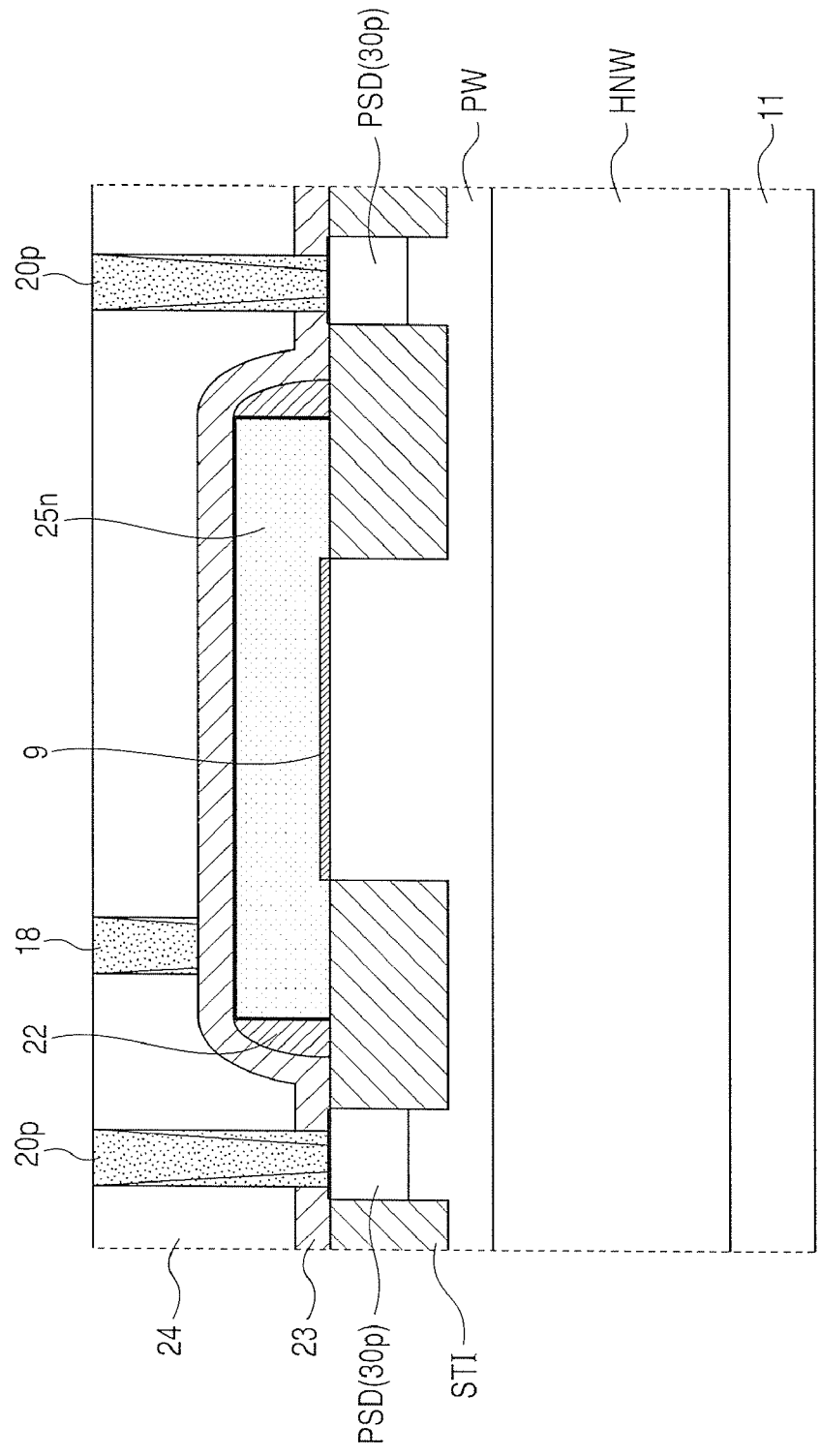
FIG. 78 is a device cross-sectional flow diagram (in the pre-metal step in the low-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 79:
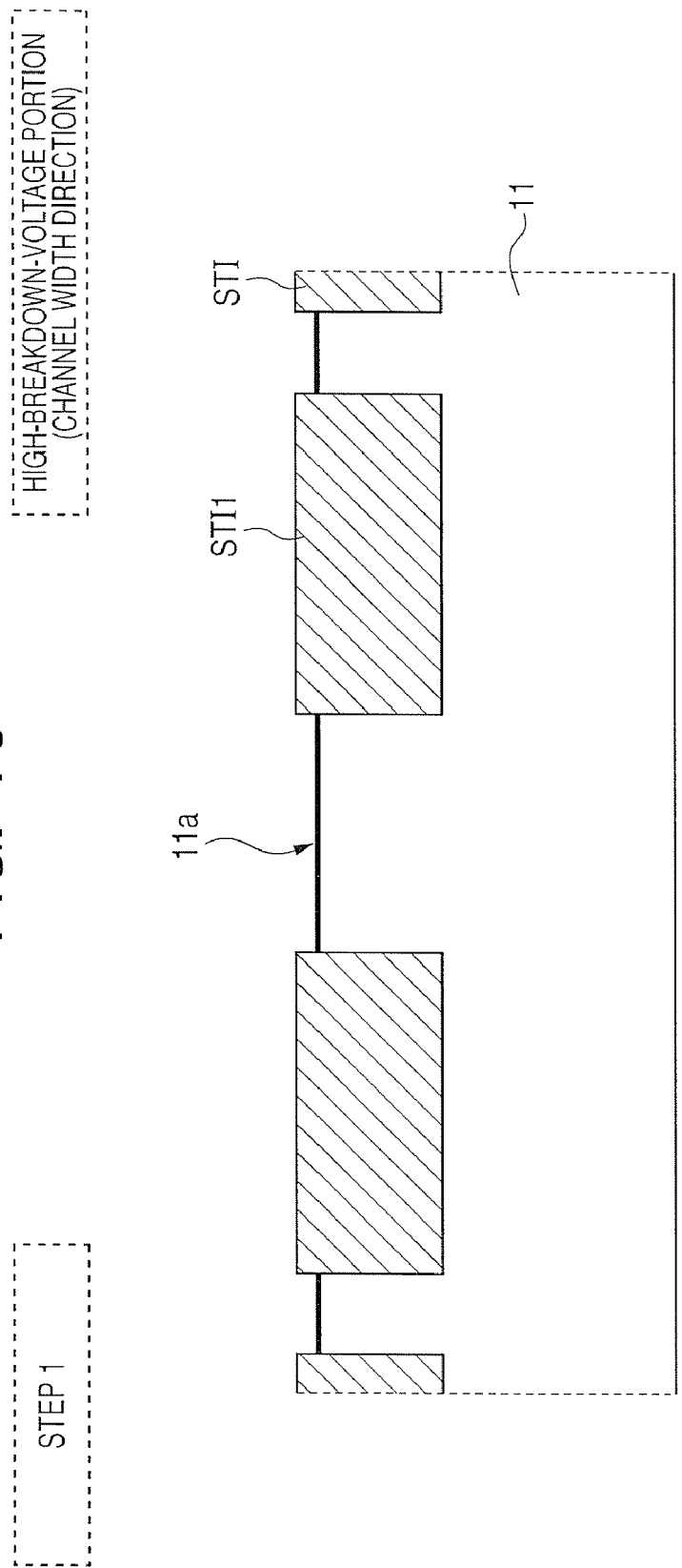
FIG. 79 is a device cross-sectional flow diagram (in the step of forming the isolation region in the high-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 80:
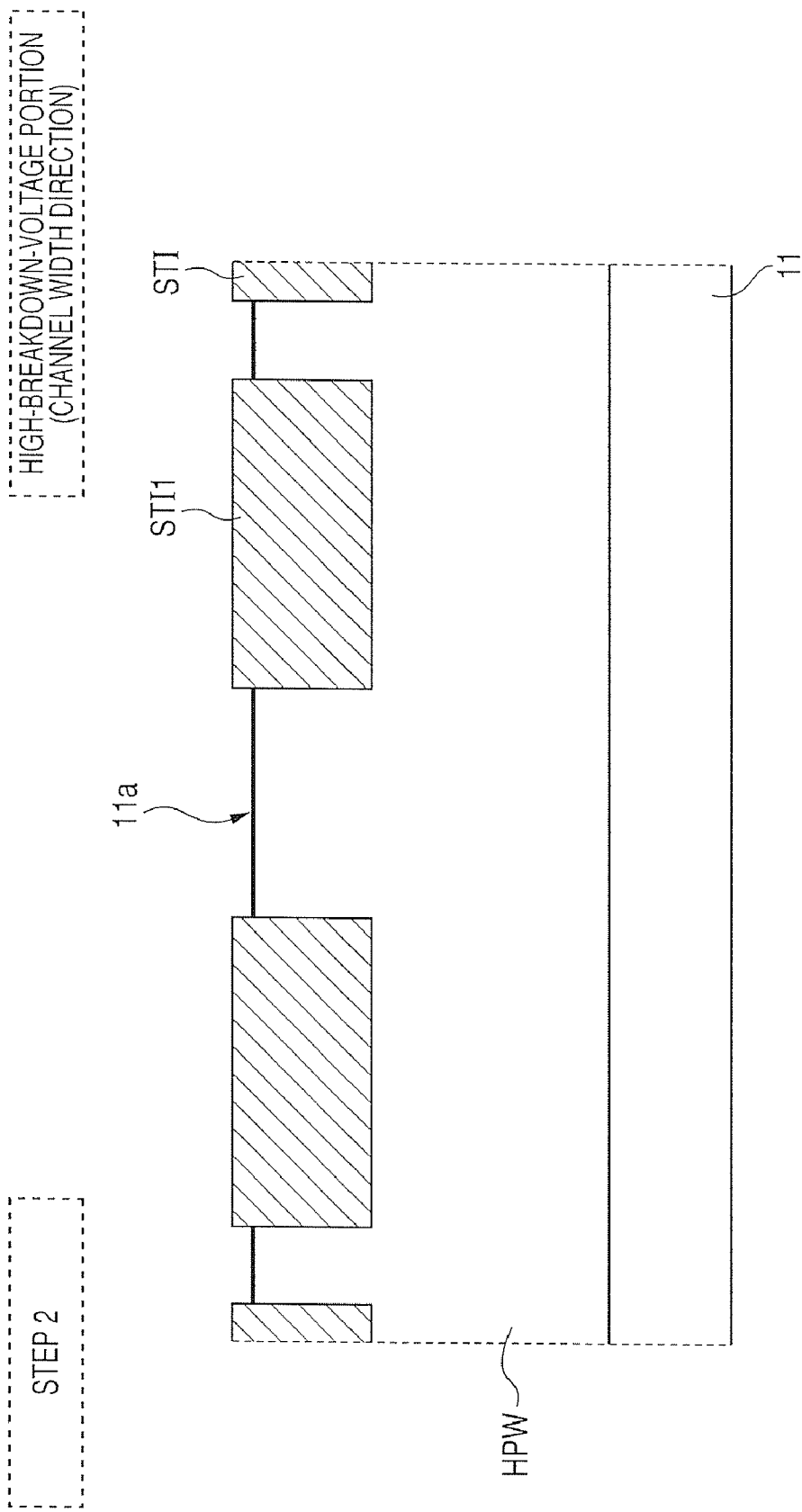
FIG. 80 is a device cross-sectional flow diagram (in the step of forming the deep P-well region in the high-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 81:
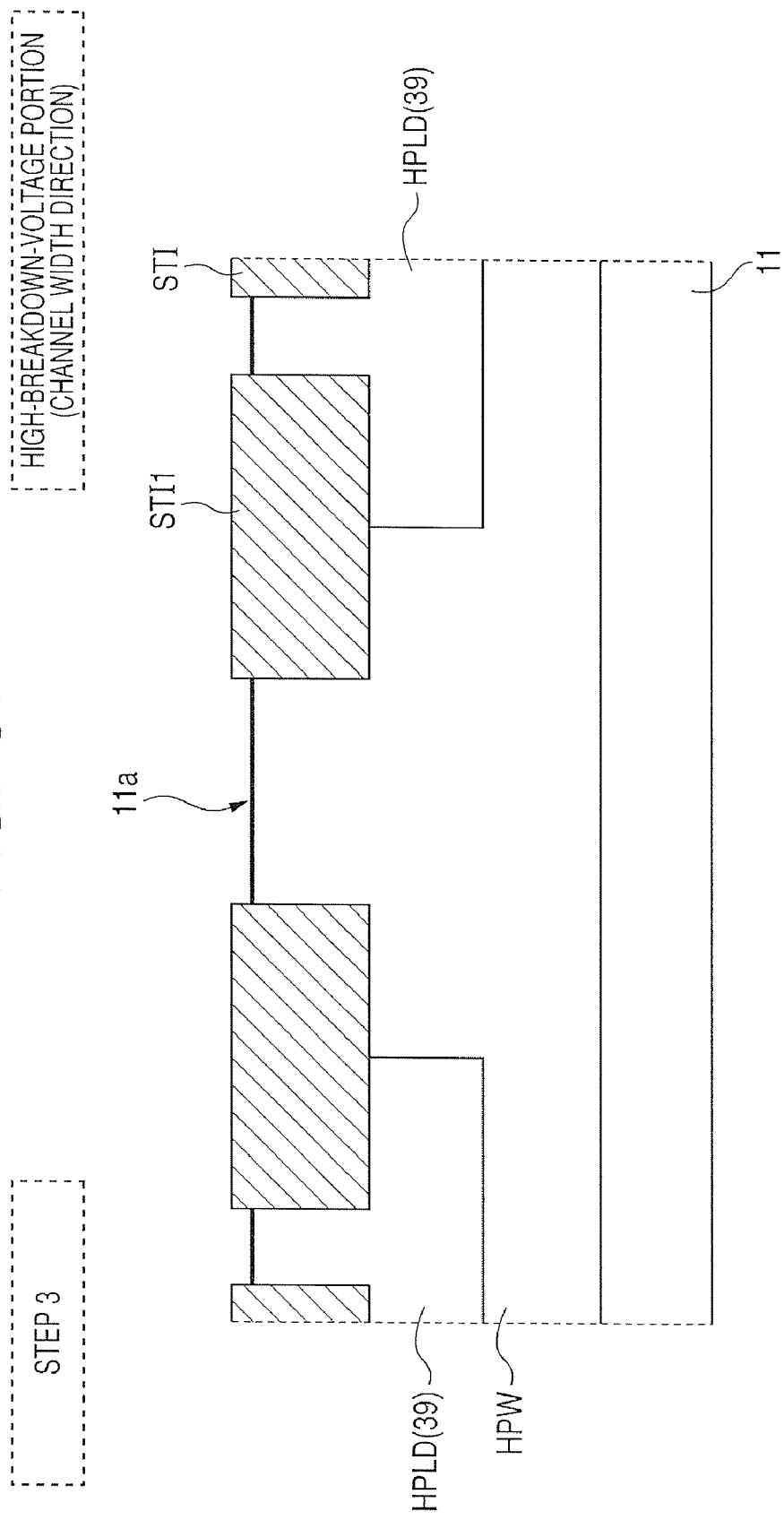
FIG. 81 is a device cross-sectional flow diagram (in the step of forming the guard ring region in the high-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 82:
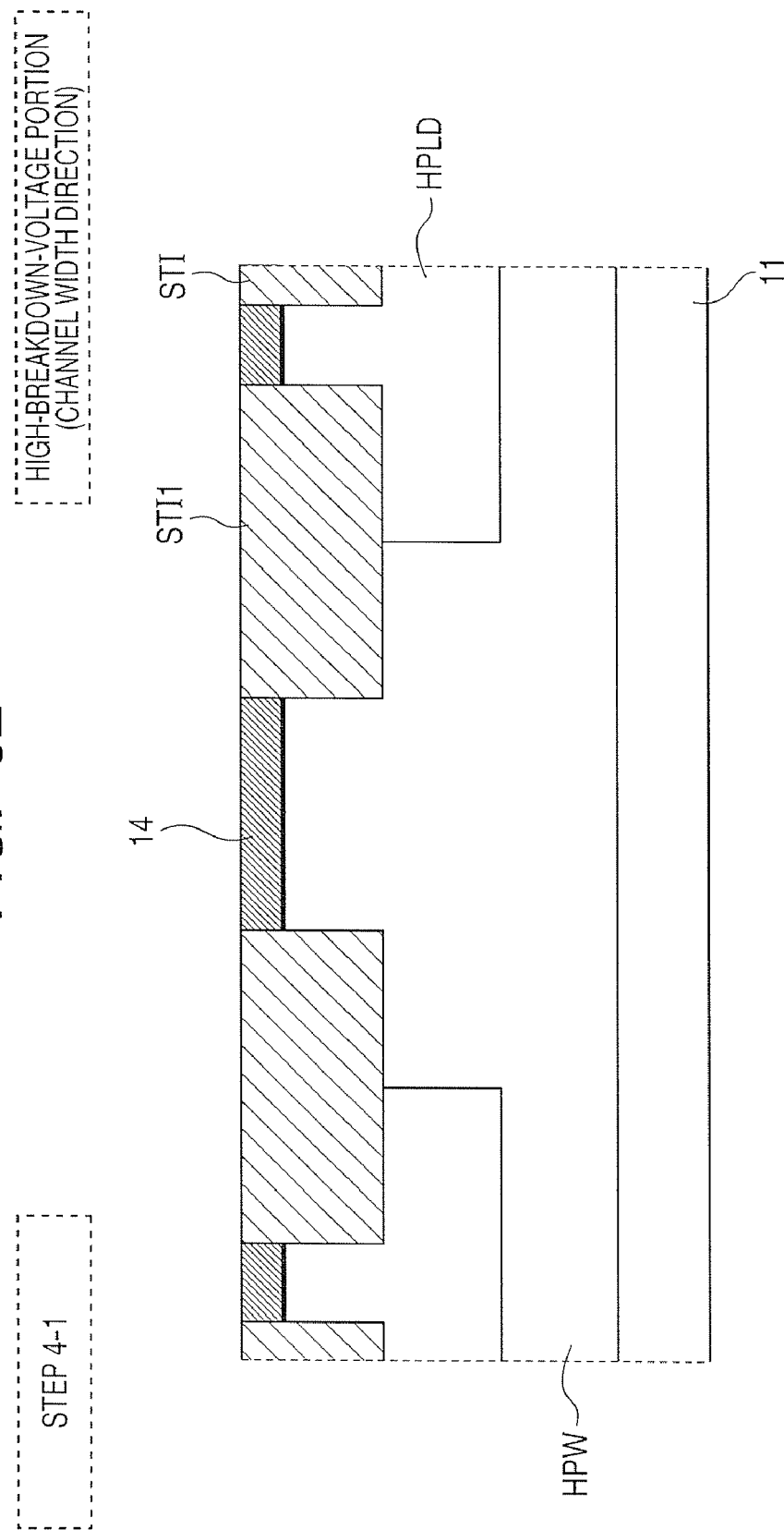
FIG. 82 is a device cross-sectional flow diagram (in a step of forming a gate insulating film in the high-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 83:
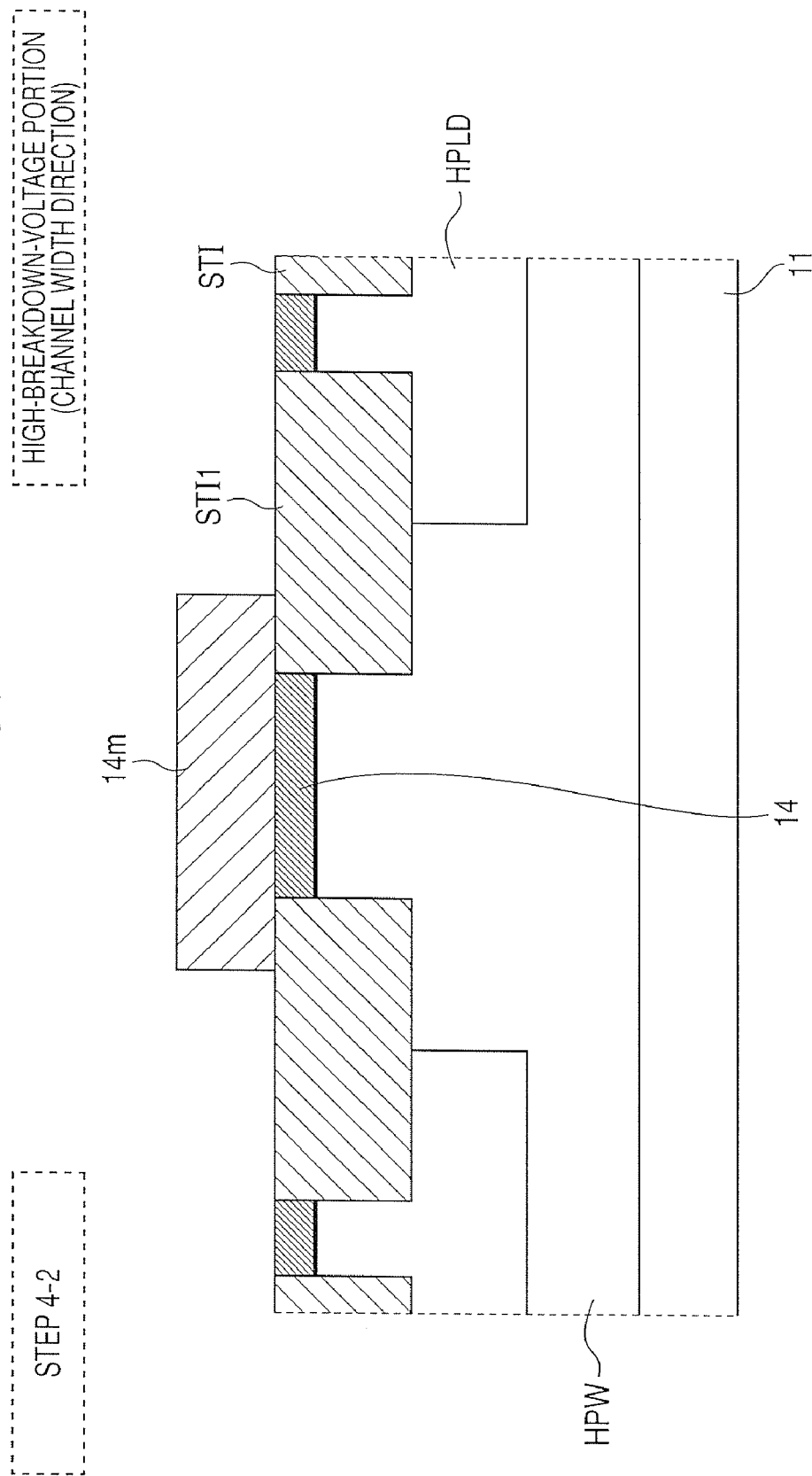
FIG. 83 is a device cross-sectional flow diagram (in a gate-insulating-film-covering-resist-film patterning step in the high-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 84:
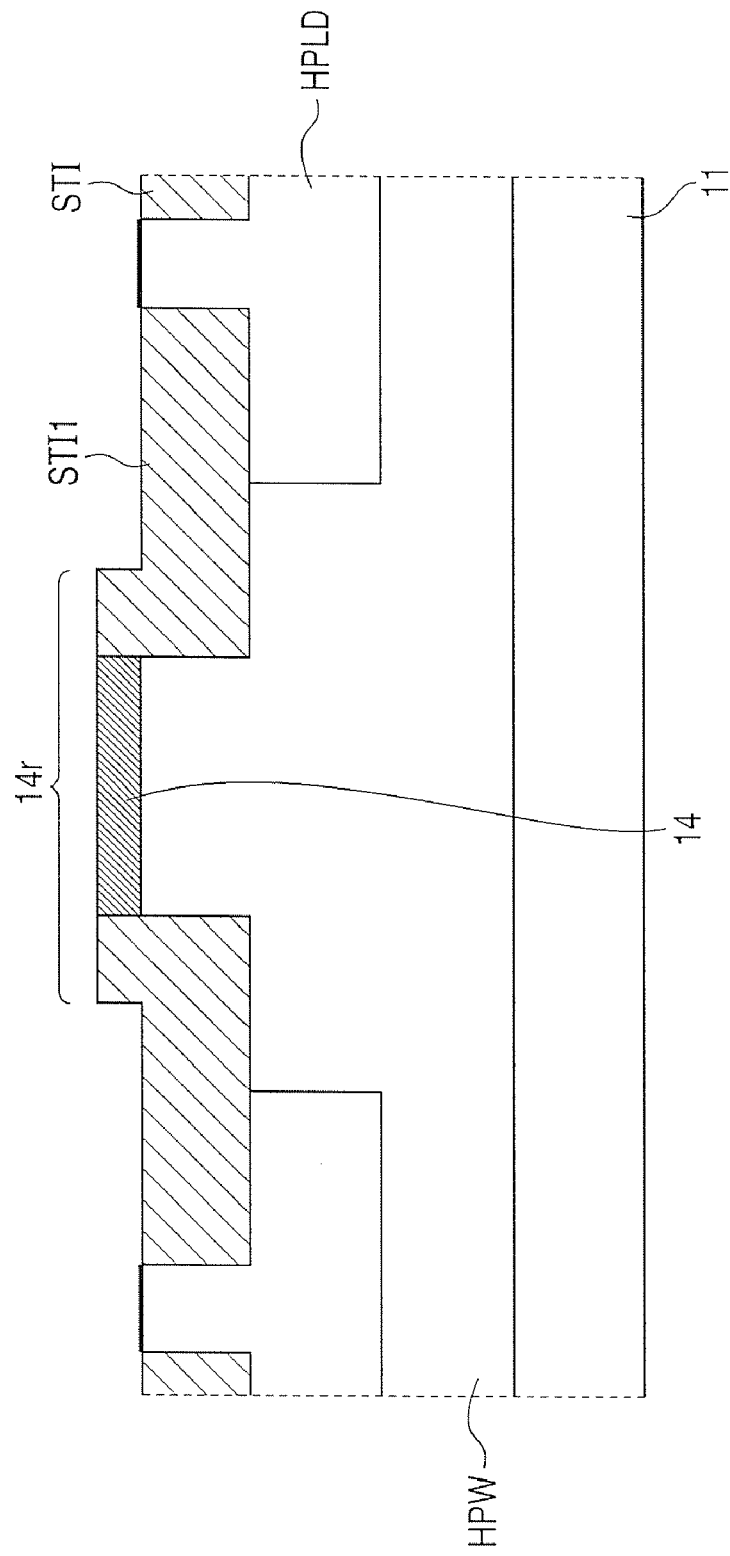
FIG. 84 is a device cross-sectional flow diagram (in a gate-insulating-film patterning step in the high-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 85:
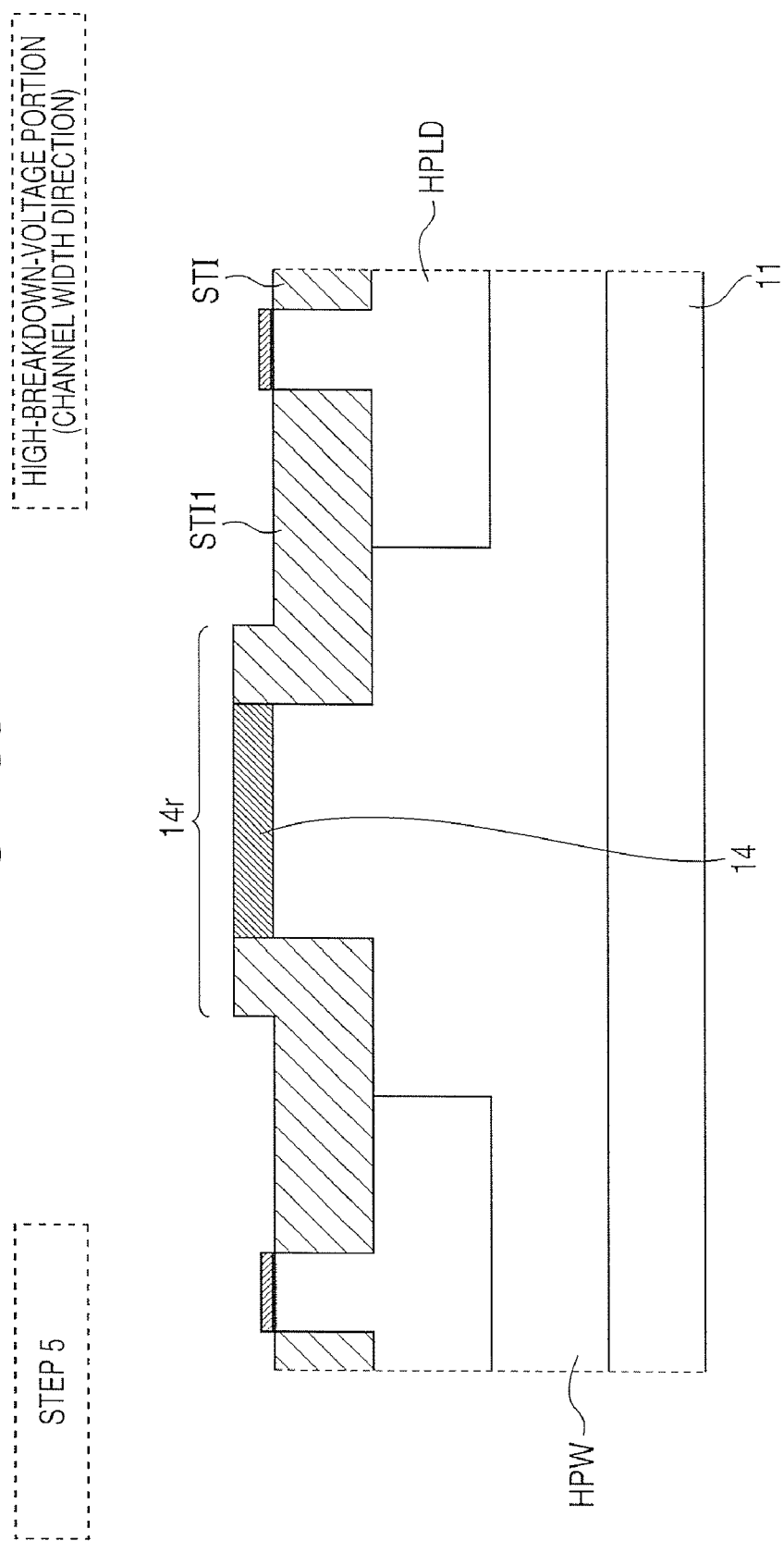
FIG. 85 is a device cross-sectional flow diagram (in the step 5 in the high-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 86:
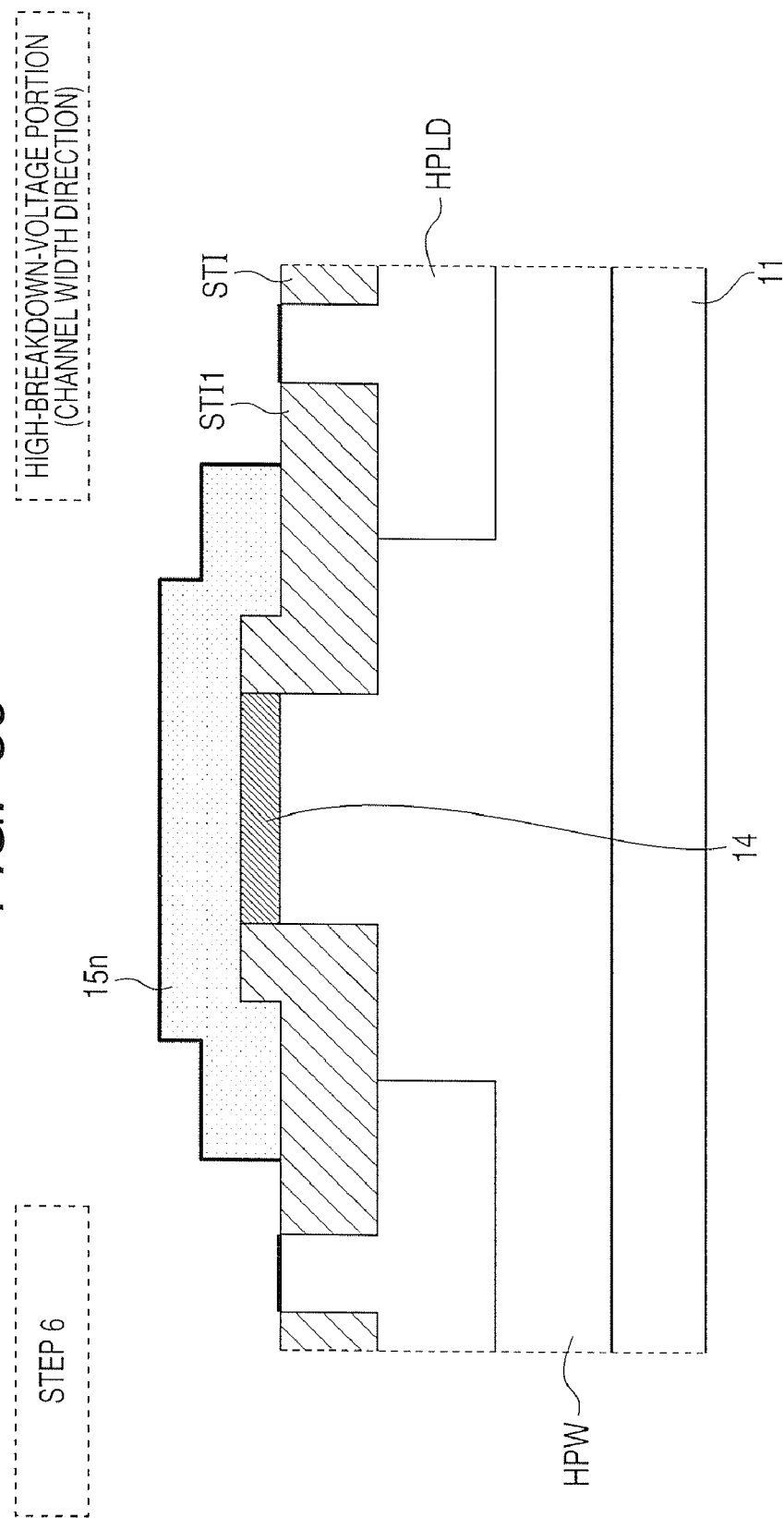
FIG. 86 is a device cross-sectional flow diagram (in the gate-electrode patterning step in the high-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 87:
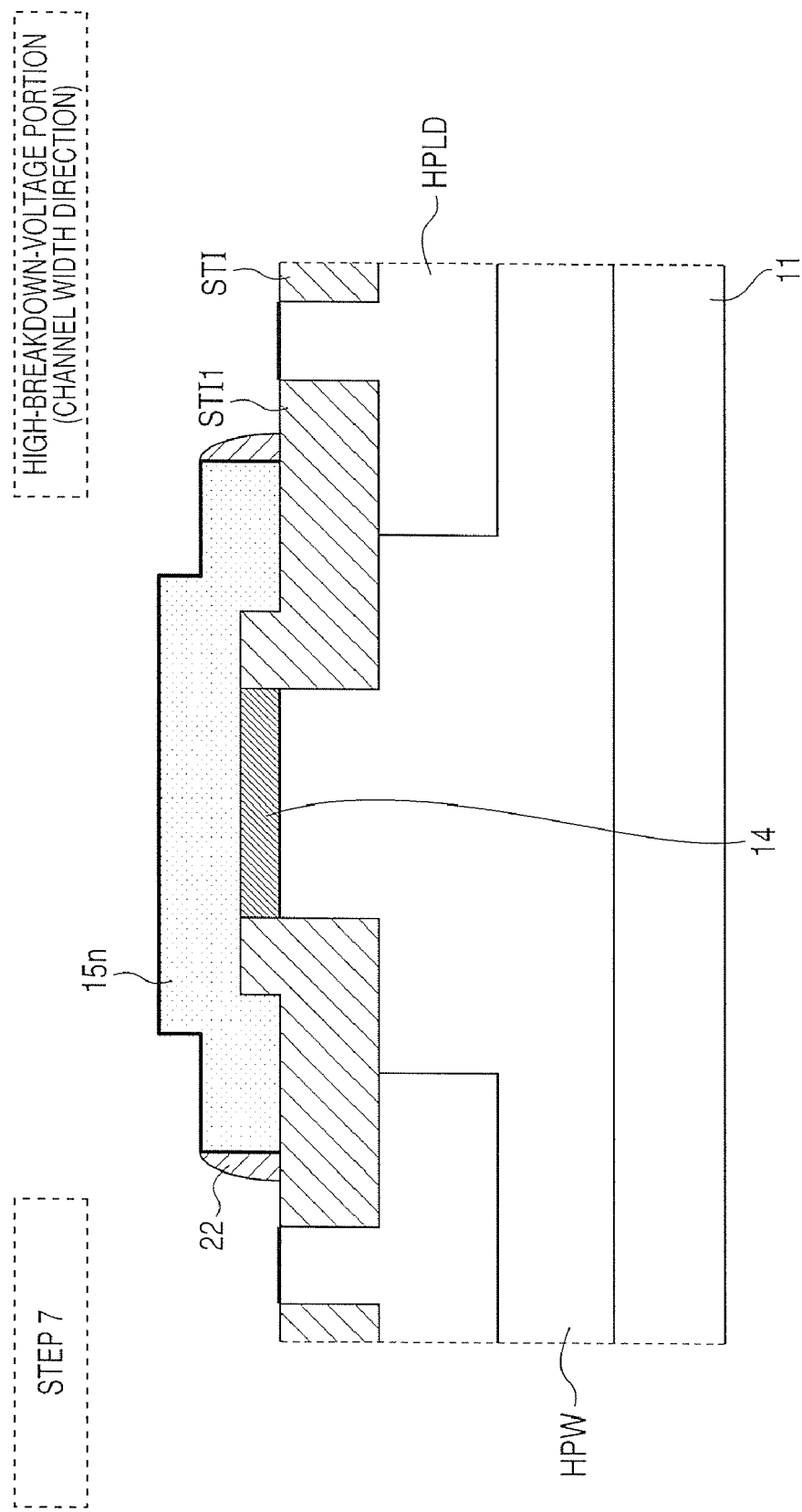
FIG. 87 is a device cross-sectional flow diagram (in the step of forming the sidewalls in the high-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 88:
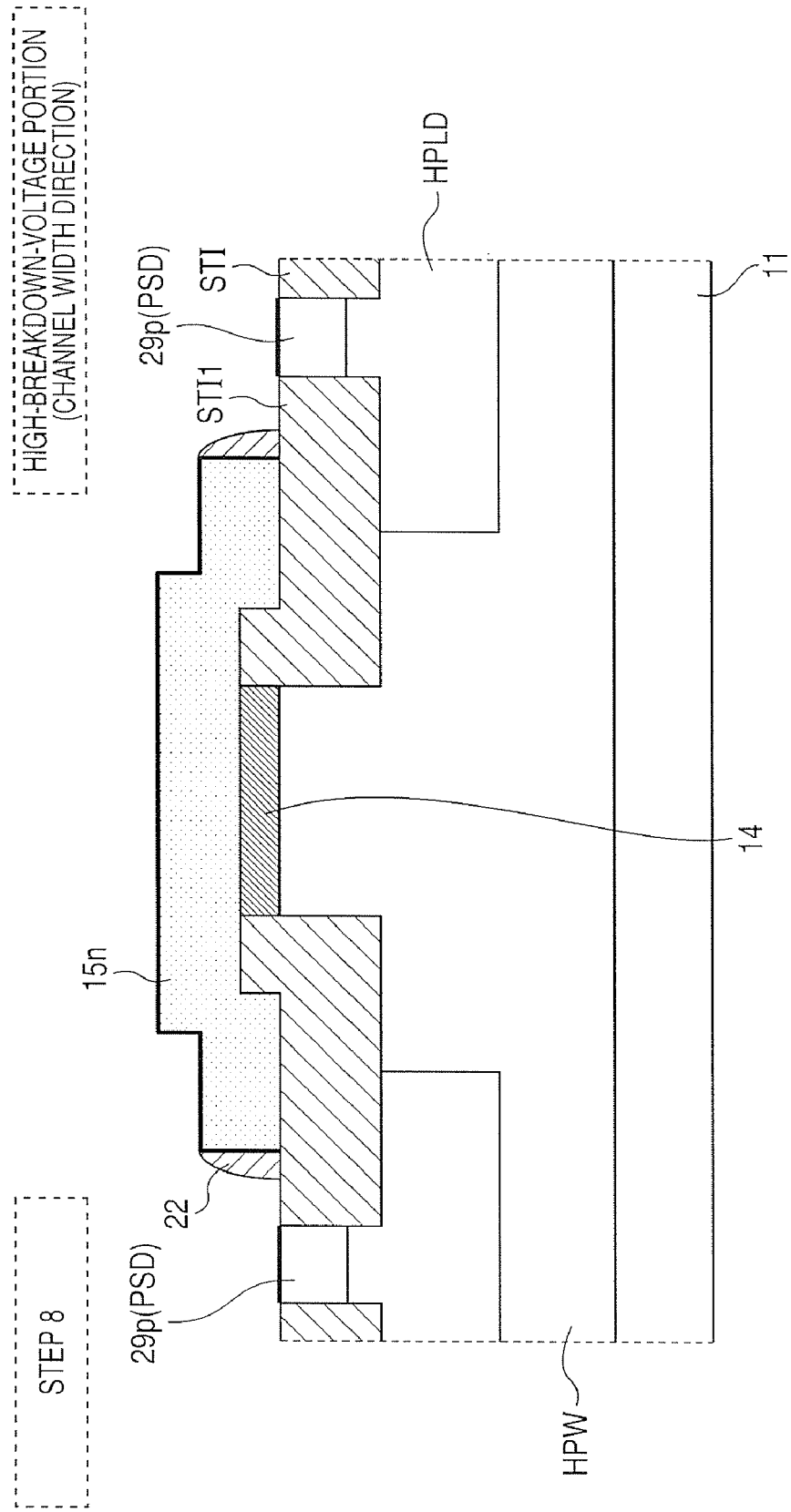
FIG. 88 is a device cross-sectional flow diagram (in a step of forming a guard ring contact region in the high-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.
Figure 89:
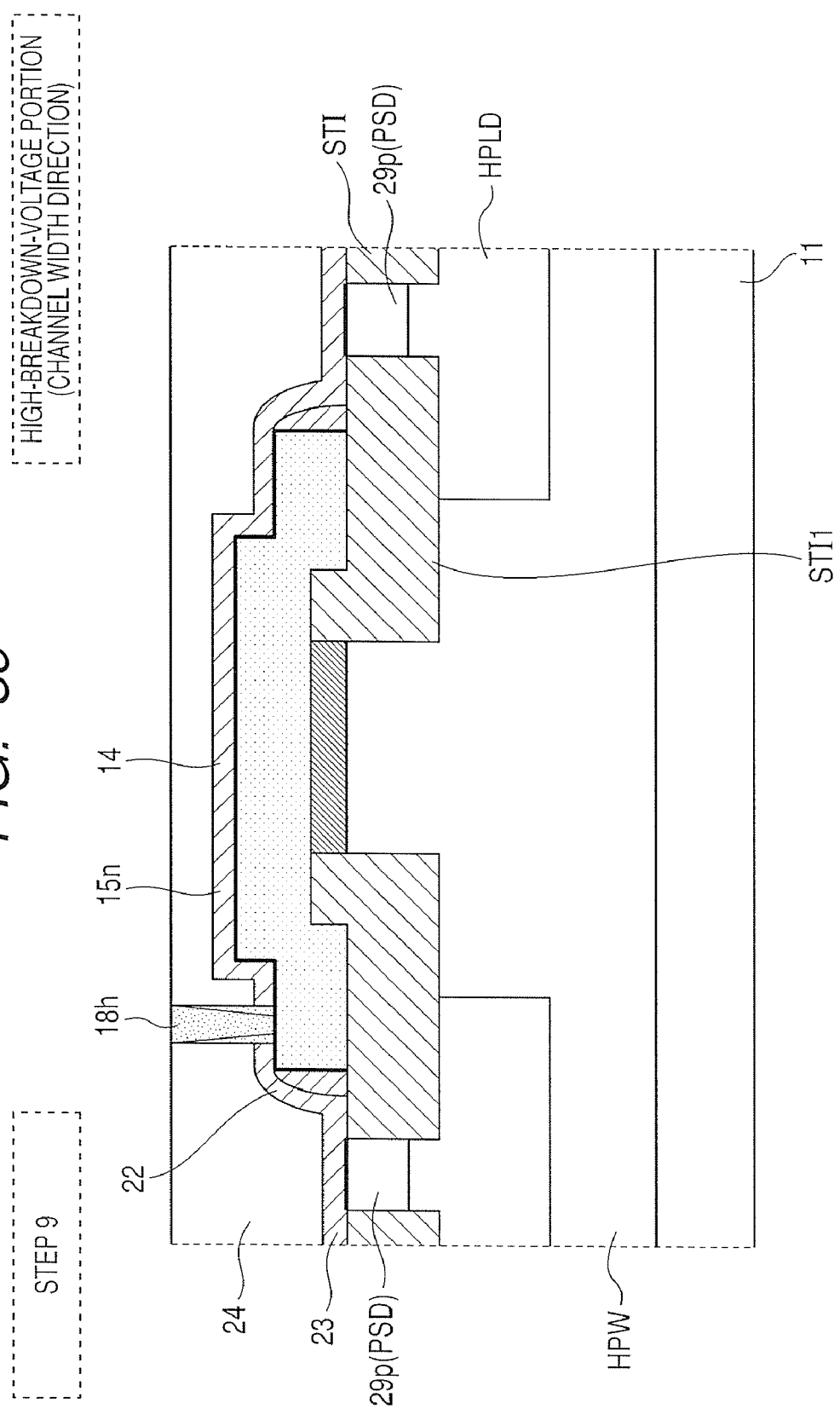
FIG. 89 is a device cross-sectional flow diagram (in the pre-metal step in the high-breakdown-voltage portion) in the channel width direction for illustrating the wafer process for the CMIS IC corresponding to the semiconductor integrated circuit device (using the device structure 2 according to the thermal oxide gate insulating film method in the high-breakdown-voltage portion) in the another embodiment of the present invention.

FIGS. 96(a) to 96(d) are partially enlarged device cross-sectional flow diagrams (in the step of forming the isolation region in the high-breakdown-voltage portion, which is previous to FIG. 57) in the channel length direction (corresponding to the cross section along the line F-F' of FIG. 45, which holds true hereinafter) corresponding to C1 (a STI end portion) of FIG. 57, which illustrate the wafer process for the CMIS IC corresponding to the semiconductor integrated circuit device (in which the device structure 2 using the thermal oxide gate insulating film method is used in the high-breakdown-voltage portion) in the another embodiment of the present invention. FIGS. 46, 57, 68, and 79 illustrate a STI forming step. FIGS. 47, 58, 69, and 80 illustrate the deep well step. FIGS. 48, 59, 70, and 81 illustrate the step of forming the source/drain regions of the high-breakdown-voltage MISFET. FIGS. 49, 60, 71, and 82 illustrate a thermal oxidation step for forming the gate insulating film of the high-breakdown-voltage MISFET. FIGS. 50, 61, 72, and 83 illustrate a step of forming a resist film pattern for the formation of an insulating film mesa region including the gate insulating film and the periphery thereof. FIGS. 51, 62, 73, and 84 illustrate a step of forming the insulating film mesa region. FIGS. 52, 63, 74, and 85 illustrate a step of forming the well regions. FIGS. 53, 64, 75, and 86 illustrate the gate electrode patterning step. FIGS. 54, 65, 76, and 87 illustrate a step of forming LDD regions (source/drain extension regions) and the sidewalls. FIGS. 55, 66, 77, and 88 illustrate the step of forming the high-concentration source/drain contact regions. FIGS. 56, 67, 78, and 89 illustrate the pre-metal step. The subsequent metal-wiring formation step and the like are the same as in FIG. 95, and the description thereof will not be repeated.

The device upper-surface diagram of FIG. 45 is basically the same as in FIG. 6, but is characterized in that a silicon dioxide film deposited by thermal oxidation is used as the gate oxide film of the high-breakdown-voltage MISFET. That is, as shown in FIGS. 45 and 90, FIG. 45 is common to FIG. 6 in that the gate contact portion 8 of the high-breakdown-voltage MISFET is formed in a region 10r over the polysilicon gate electrode where a thick insulating film (an insulating film mesa region 14r including the gate insulating film, and the field insulating film on the periphery thereof) projecting from the upper surface of the substrate, such as the high-breakdown-voltage gate insulating film, is not present.

Figure 46:
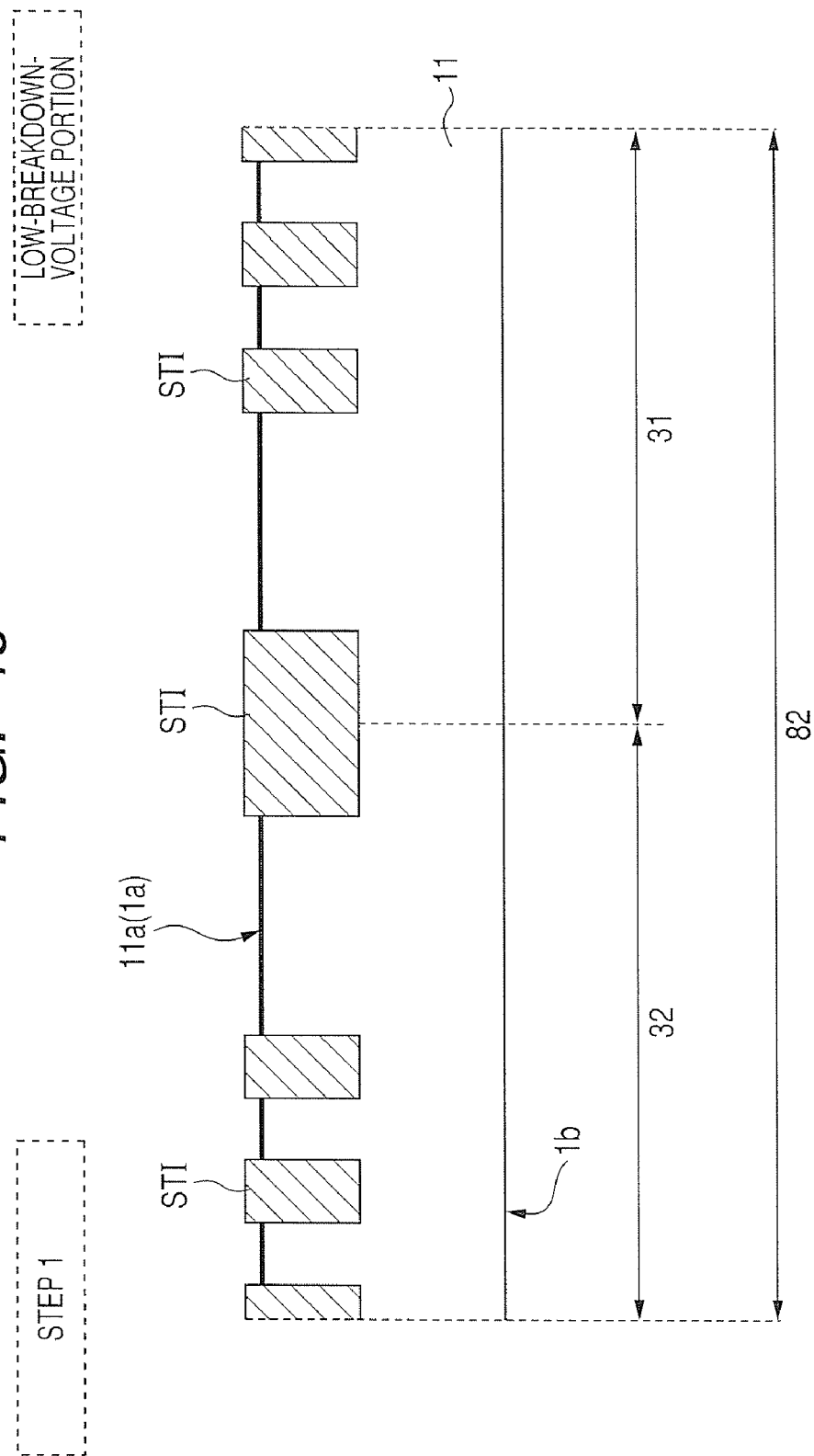
FIG. 46 is a device cross-sectional flow diagram (in the step of forming the isolation region in the low-breakdown-voltage portion) in the channel length direction for illustrating a wafer process for a CMIS IC corresponding to the semiconductor integrated circuit device (using the device structure 2 according to a gate insulating film method based on thermal oxidation in the high-breakdown-voltage portion) in the another embodiment of the present invention.
Figure 47:
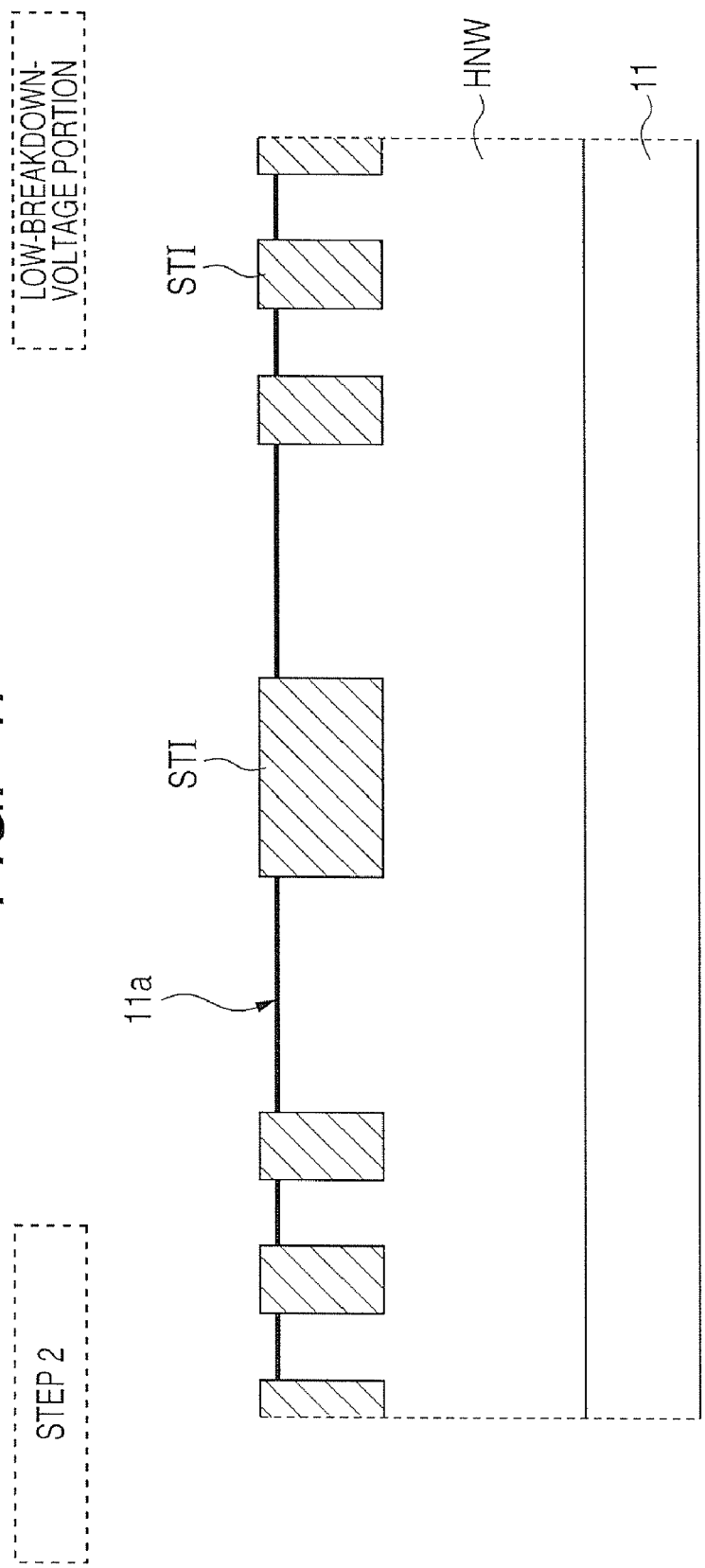
FIG. 47 is a device cross-sectional flow diagram (in a step of forming a deep N-well region in the low-breakdown-voltage portion) in the channel length direction for illustrating the wafer process for the CMIS IC corresponding to the semiconductor integrated circuit device (using the device structure 2 according to the gate insulating film method based on thermal oxidation in the high-breakdown-voltage portion) in the another embodiment of the present invention.
Figure 48:
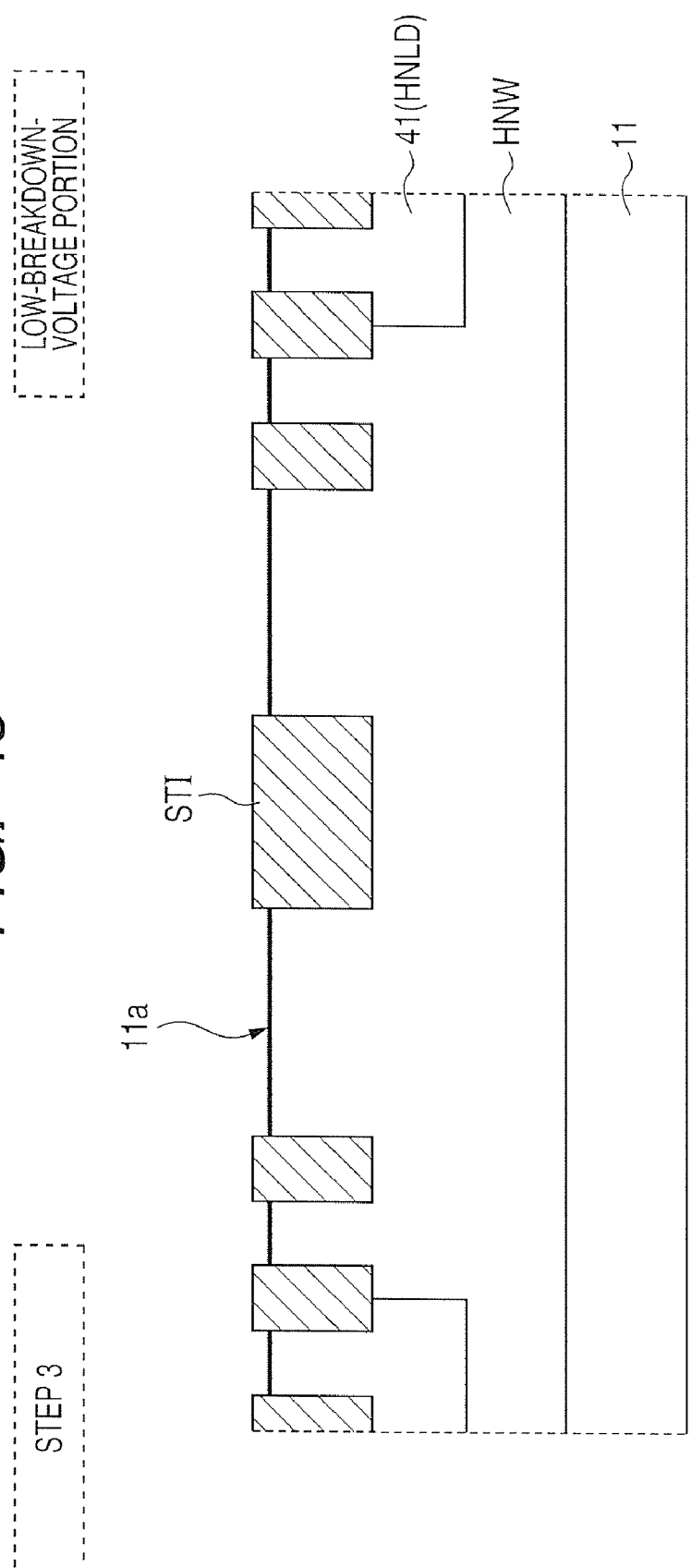
FIG. 48 is a device cross-sectional flow diagram (in the step of forming the N-type guard ring region in the low-breakdown-voltage portion) in the channel length direction for illustrating the wafer process for the CMIS IC corresponding to the semiconductor integrated circuit device (using the device structure 2 according to the gate insulating film method based on thermal oxidation in the high-breakdown-voltage portion) in the another embodiment of the present invention.
Figure 49:
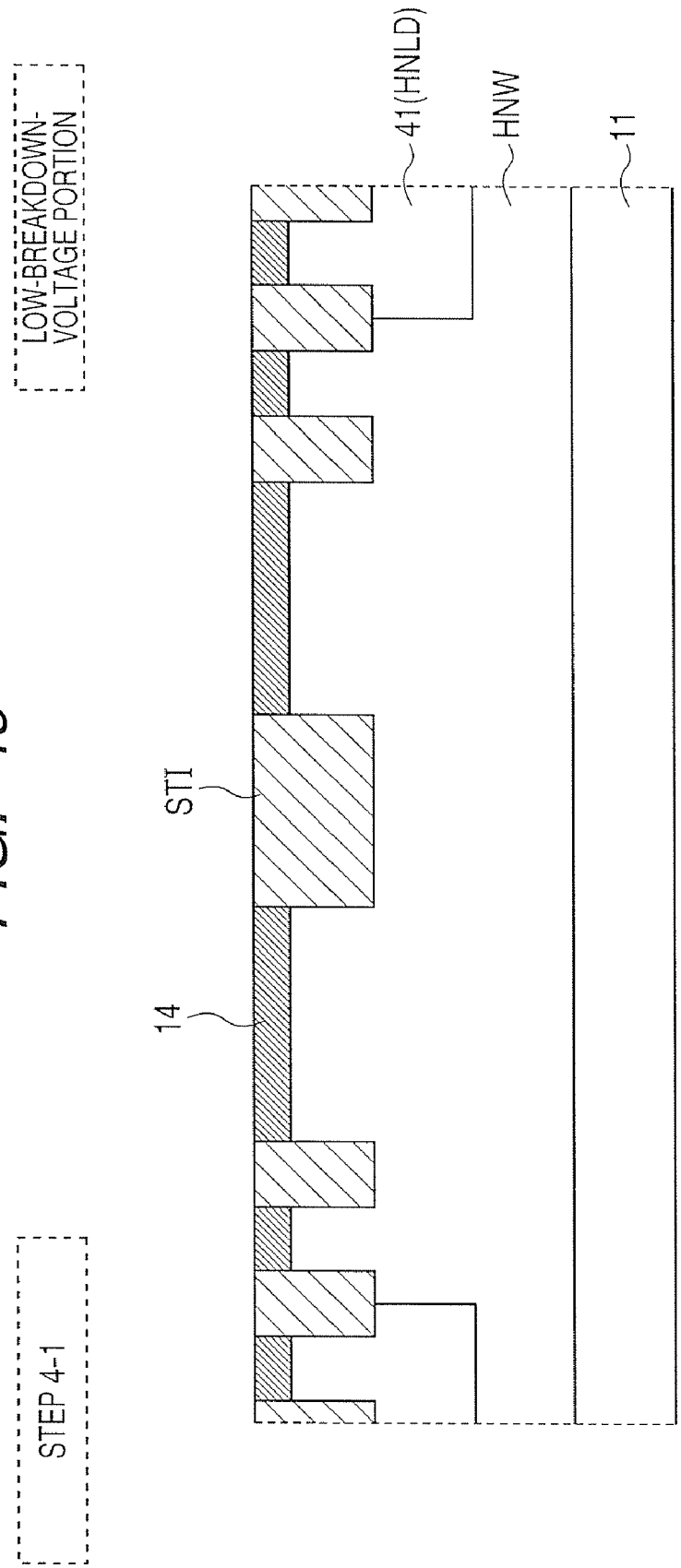
FIG. 49 is a device cross-sectional flow diagram (in a step 4-1 in the low-breakdown-voltage portion) in the channel length direction for illustrating the wafer process for the CMIS IC corresponding to the semiconductor integrated circuit device (using the device structure 2 according to the gate insulating film method based on thermal oxidation in the high-breakdown-voltage portion) in the another embodiment of the present invention.
Figure 50:
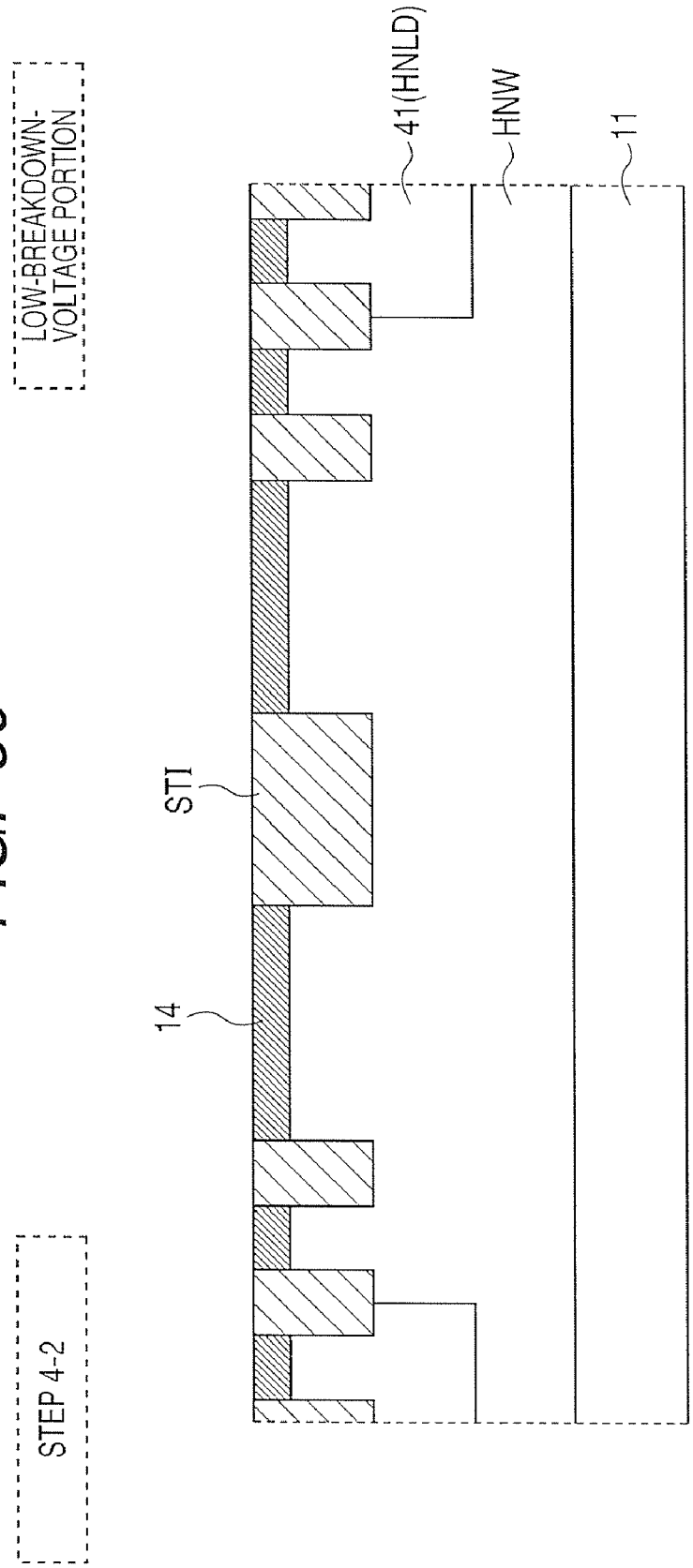
FIG. 50 is a device cross-sectional flow diagram (in a step 4-2 in the low-breakdown-voltage portion) in the channel length direction for illustrating the wafer process for the CMIS IC corresponding to the semiconductor integrated circuit device (using the device structure 2 according to the gate insulating film method based on thermal oxidation in the high-breakdown-voltage portion) in the another embodiment of the present invention.
Figure 51:
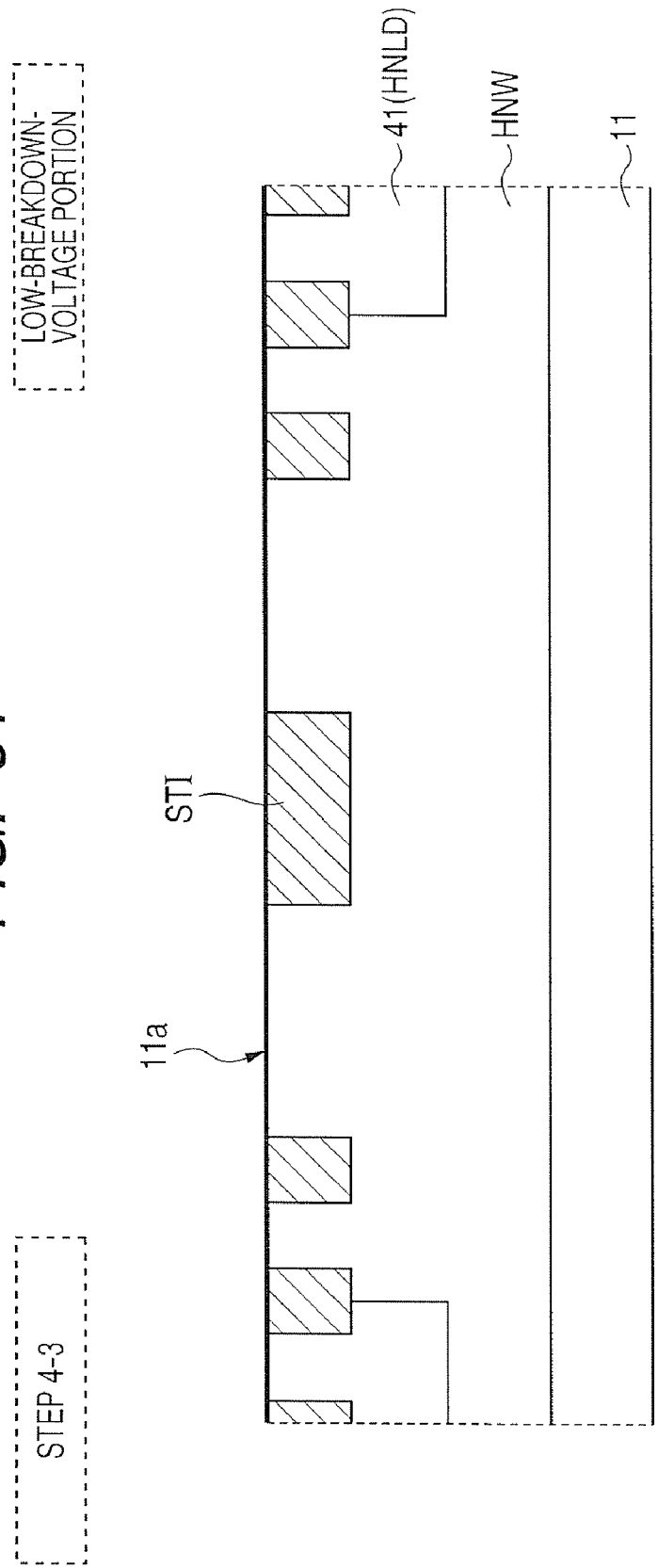
FIG. 51 is a device cross-sectional flow diagram (in a step of etching an oxide film in the low-breakdown-voltage portion) in the channel length direction for illustrating the wafer process for the CMIS IC corresponding to the semiconductor integrated circuit device (using the device structure 2 according to the gate insulating film method based on thermal oxidation in the high-breakdown-voltage portion) in the another embodiment of the present invention.
Figure 52:
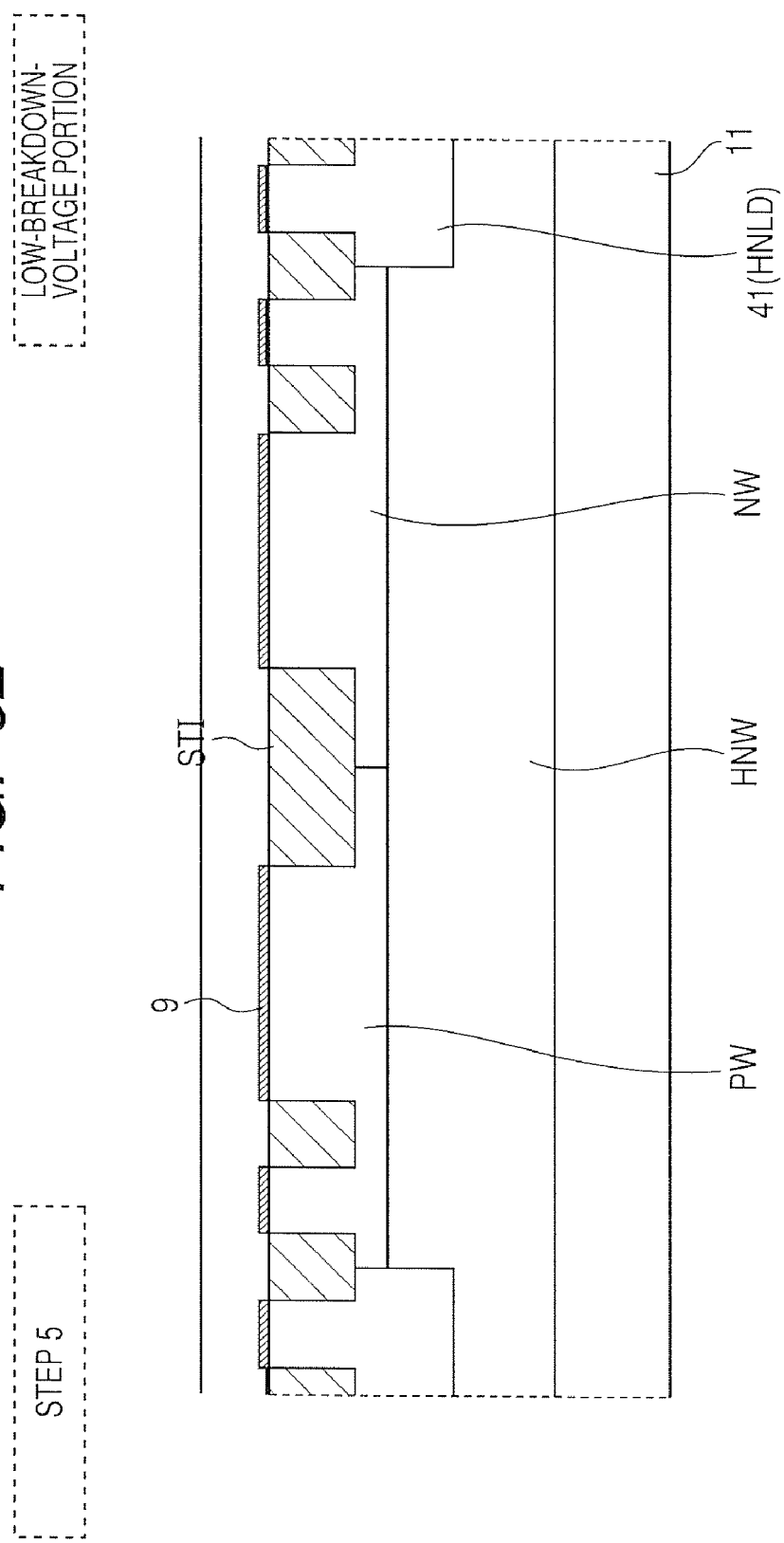
FIG. 52 is a device cross-sectional flow diagram (in a step of forming the both wells and a gate insulating film in the low-breakdown-voltage portion) in the channel length direction for illustrating the wafer process for the CMIS IC corresponding to the semiconductor integrated circuit device (using the device structure 2 according to the gate insulating film method based on thermal oxidation in the high-breakdown-voltage portion) in the another embodiment of the present invention.
Figure 53:
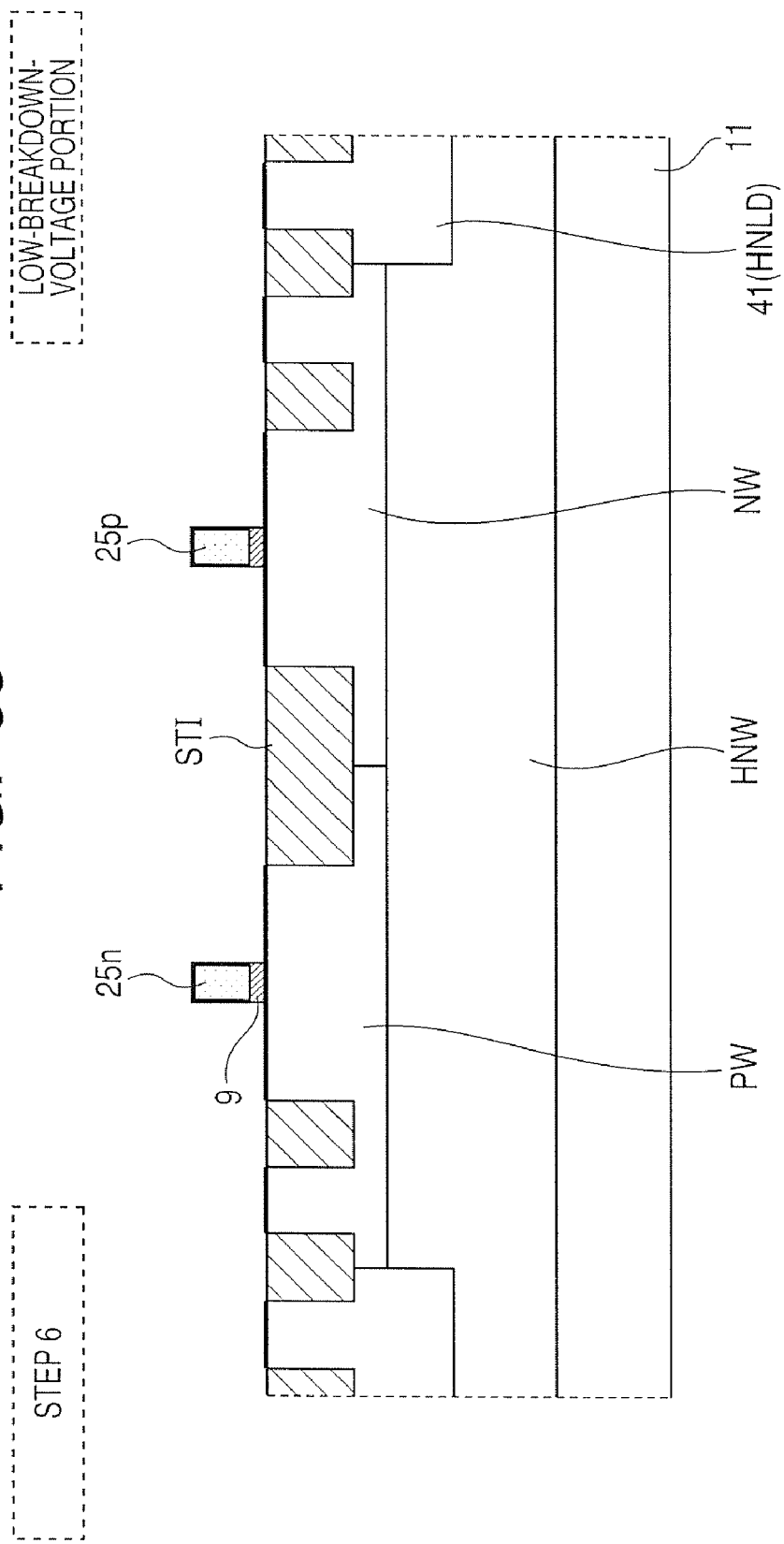
FIG. 53 is a device cross-sectional flow diagram (in the gate-electrode patterning step in the low-breakdown-voltage portion) in the channel length direction for illustrating the wafer process for the CMIS IC corresponding to the semiconductor integrated circuit device (using the device structure 2 according to the gate insulating film method based on thermal oxidation in the high-breakdown-voltage portion) in the another embodiment of the present invention.
Figure 54:
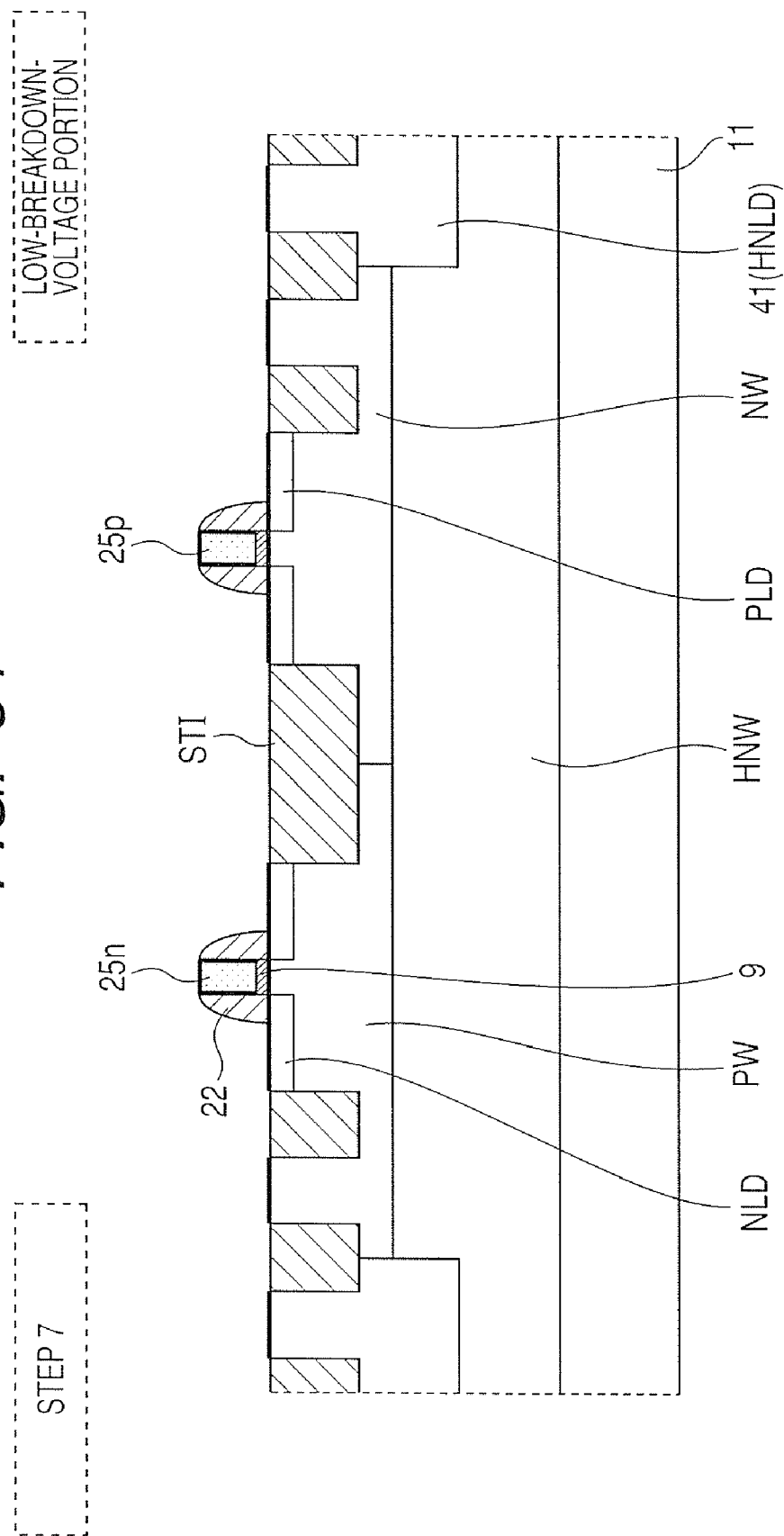
FIG. 54 is a device cross-sectional flow diagram (in a step of forming LDD regions and the sidewalls in the low-breakdown-voltage portion) in the channel length direction for illustrating the wafer process for the CMIS IC corresponding to the semiconductor integrated circuit device (using the device structure 2 according to the gate insulating film method based on thermal oxidation in the high-breakdown-voltage portion) in the another embodiment of the present invention.
Figure 55:
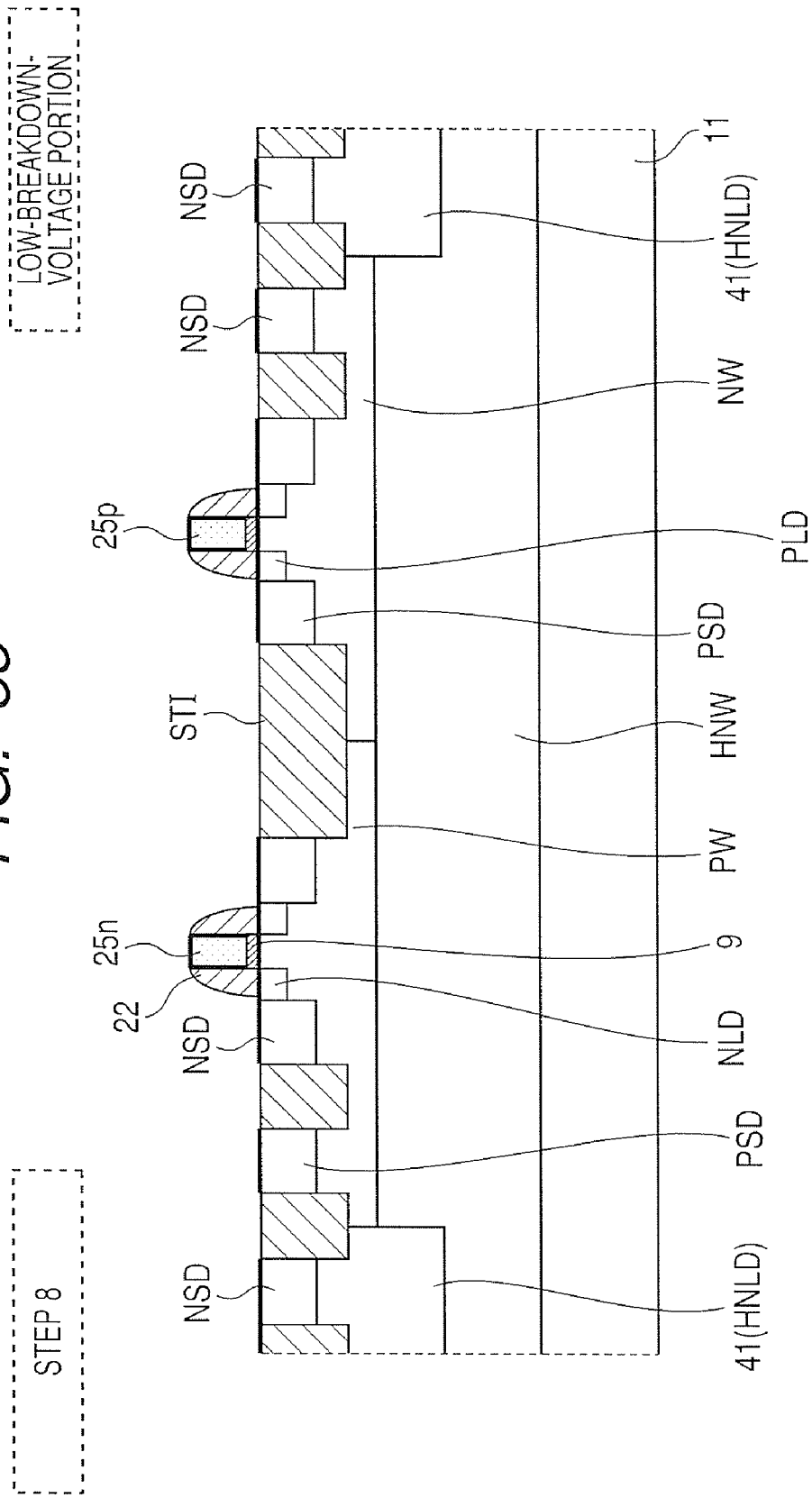
FIG. 55 is a device cross-sectional flow diagram (in the step of forming the high-concentration source/drain regions in the low-breakdown-voltage portion) in the channel length direction for illustrating the wafer process for the CMIS IC corresponding to the semiconductor integrated circuit device (using the device structure 2 according to the gate insulating film method based on thermal oxidation in the high-breakdown-voltage portion) in the another embodiment of the present invention.
Figure 56:
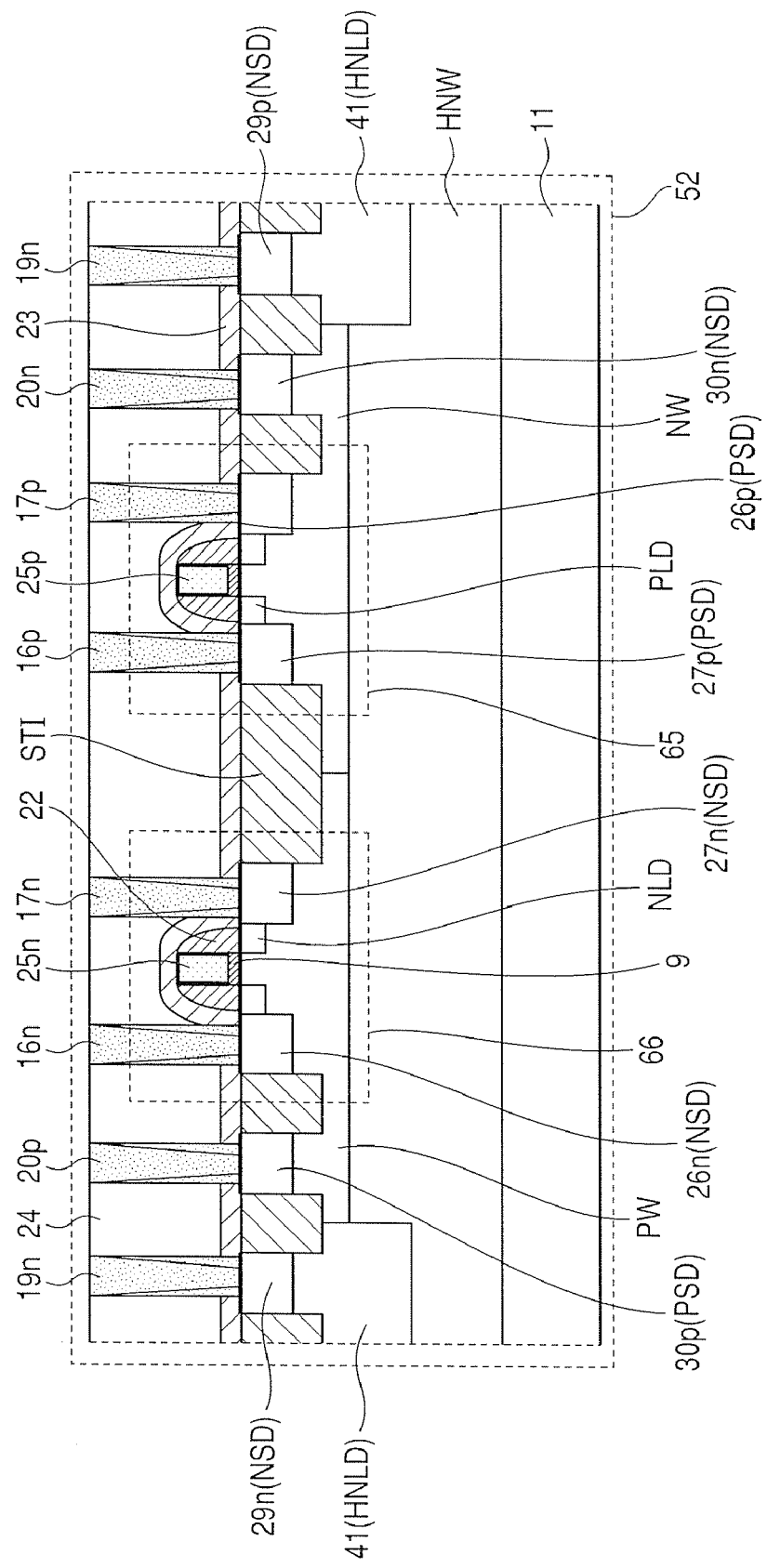
FIG. 56 is a device cross-sectional flow diagram (in the pre-metal step in the low-breakdown-voltage portion) in the channel length direction for illustrating the wafer process for the CMIS IC corresponding to the semiconductor integrated circuit device (using the device structure 2 according to the gate insulating film method based on thermal oxidation in the high-breakdown-voltage portion) in the another embodiment of the present invention.

Hereinbelow, the manufacturing process will be described. As shown in FIGS. 46, 57, 68, and 79, the P-type single-crystal silicon wafer 11 having a diameter of, e.g., 300ϕ, and a relatively low concentration is prepared, and the STI (Shallow Trench Isolation) field insulating films STI and STI1 having a trench at a depth of about 300 nm are formed. As shown in FIG. 46, the low-breakdown-voltage portion 82 is divided into the low-breakdown-voltage P-channel device region 31 and the low-breakdown-voltage N-channel device region 32. Likewise, as shown in FIG. 57, the high-breakdown-voltage portion 81 is divided into the high-breakdown-voltage P-channel device region 33 and the high-breakdown-voltage N-channel device region 34.

The difference between Section 5 and Section 3 is that the silicon substrate surface 11a is significantly recessed (by, e.g., about 60 nm) from the upper surfaces of the buried insulating films STI and STI1. This is for implementing a finally planar substrate surface in consideration of a change in the silicon substrate surface 11a in the subsequent step. In the case of Section 3 also, there is a slight recess in a strict sense, but it is shown in a simplified fashion in the drawing, since the amount of the recess is smaller than in the case of Section 5.

Figure 96:
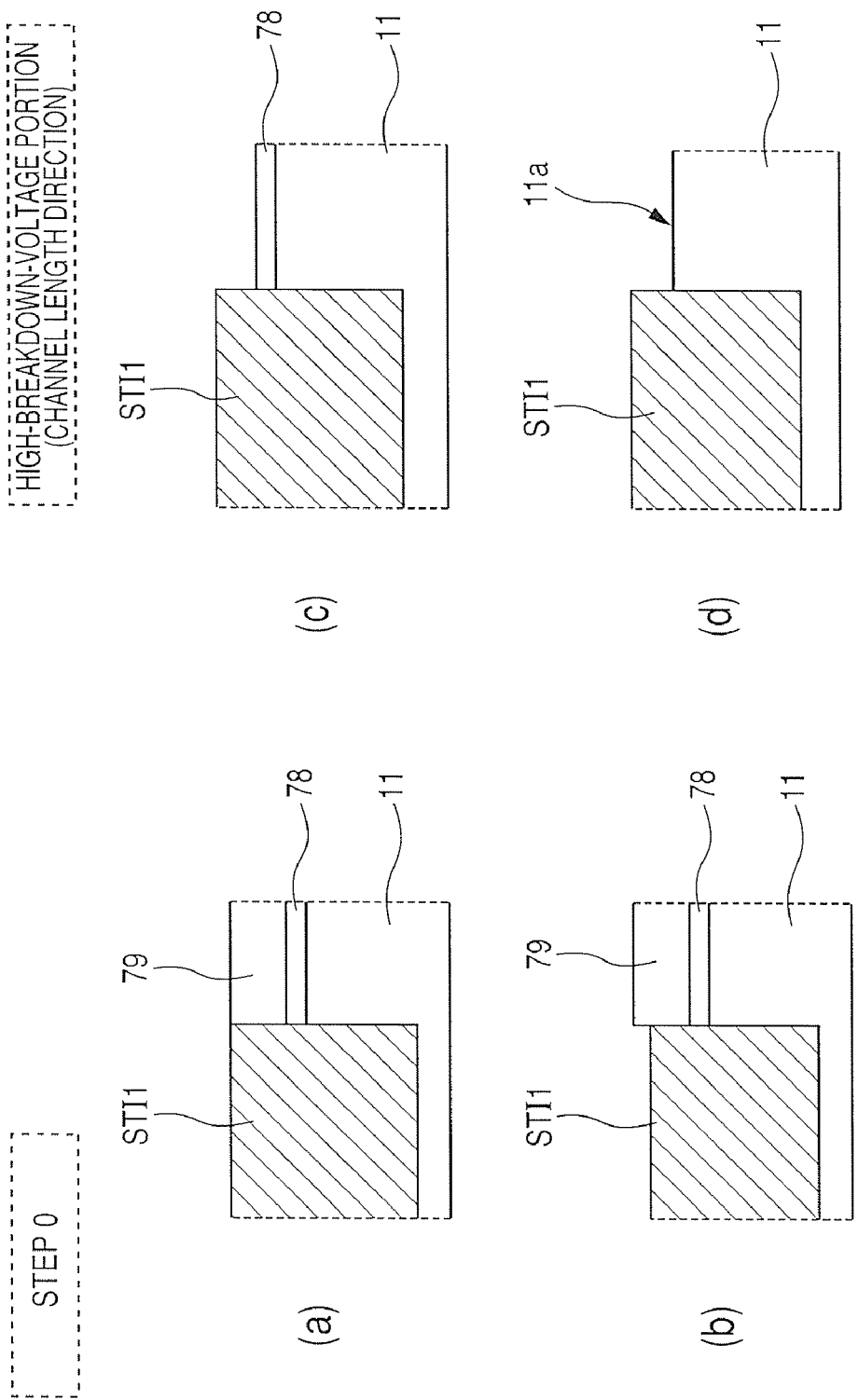
FIGS. 96(*a*) to 96(*d*) are partially enlarged device cross-sectional flow diagrams (in the step of forming the isolation region in the high-breakdown-voltage portion, which is previous to FIG. 57) in the channel length direction (corresponding to the cross section along the line F-F' of FIG. 45, which holds true hereinafter) corresponding to C1 (a STI end portion) of FIG. 57, which illustrate the wafer process for the CMIS IC corresponding to the semiconductor integrated circuit device (in which the device structure 2 using the thermal oxide gate insulating film method is used in the high-breakdown-voltage portion) in the another embodiment of the present invention.

A method of producing the recess will be described with reference to FIG. 96 in the final part of the present section using the STI end portion C1 of FIG. 57 as an example.

Next, as shown in FIGS. 47, 58, 69, and 80, phosphorus ions are implanted at a concentration of, e.g., about $3 \times 10^{12}$/cm$^2$ from the device-side face 11a (first principal surface) of the semiconductor wafer 11 to form the N-type deep well region HNW in the low-breakdown-voltage portion 82 and in the high-breakdown-voltage P-channel device region 33. Likewise, boron ions are implanted at a concentration of, e.g., about $3 \times 10^{12}$/cm$^2$ from the device-side face 11a of the semiconductor wafer 11 to form the P-type deep well region HPW in the high-breakdown-voltage N-channel device region 34.

Next, a shown in FIGS. 48, 59, 70, and 81, phosphorus ions are implanted at a concentration of, e.g., about $6 \times 10^{12}$/cm$^2$ from the device-side face 11a of the semiconductor wafer 11 to form the N-type guard ring region 41 (which is the N-type intermediate-concentration region HNLD according to the classification of impurity doped regions) in the peripheral portion of the low-breakdown-voltage portion 82. Likewise, phosphorus ions are implanted at a concentration of, e.g., about $6 \times 10^{12}$/cm$^2$ from the device-side face 11a of the semiconductor wafer 11 to form the N-type guard ring region 40 (which is the N-type intermediate-concentration region HNLD according to the classification of impurity doped regions) in the peripheral portion of the high-breakdown-voltage P-channel device region 33. Further, from the device-side face 11a of the semiconductor wafer 11, phosphorus ions are implanted at a concentration of, e.g., about $6 \times 10^{12}$/cm$^2$ to form the N-type source region 36n and the N-type drain region 37n (which are N-type intermediate-concentration regions HNLD according to the classification of impurity doped regions) in the center portion of the high-breakdown-voltage N-channel device region 34. Further, from the device-side face 11a of the semiconductor wafer 11, boron ions are implanted at a concentration of, e.g., about $6 \times 10^{12}$/cm$^2$ to form the P-type source region 36p and the P-type drain region 37p (which are the P-type intermediate-concentration regions HNLD according to the classification of impurity doped regions) in the center portion of the high-breakdown-voltage P-channel device region 33. Further, from the device-side face 11a of the semiconductor wafer 11, boron ions are implanted at a concentration of, e.g., about $6 \times 10^{12}$/cm$^2$ to form the P-type guard ring region 39 (which is the P-type intermediate-concentration region HPLD according to the classification of impurity doped regions) in the peripheral portion of the high-breakdown-voltage N-channel device region 34.

Next, as shown in FIGS. 49, 60, 71, and 82, the silicon dioxide film 14 (having a thickness of, e.g., about 80 nm) is formed by thermal oxidation over the silicon surface of the device-side face 11a of the semiconductor wafer 11.

Next, as shown in FIGS. 50, 61, 72, and 83, a region which is to form the insulating film mesa region 14r (FIG. 62) including the gate insulating film and the field insulating film on the periphery thereof in the high-breakdown-voltage portion 81 is covered with a resist film pattern 14m by typical lithography.

Next, as shown in FIGS. 51, 62, 73, and 84, the high-breakdown-voltage gate oxide film 14 and the buried oxide films STI and STI1 which are uncovered with the resist film pattern 14m are etched by wet etching using, e.g., a fluoric-acid-based silicon-dioxide-film etchant to form the insulating film mesa region 14r, and expose the upper surface 11a (active region) of the silicon substrate uncovered with the resist film pattern 14m.

Next, as shown in FIGS. 52, 63, 74, and 85, phosphorus ions are implanted at a concentration of, e.g., about $2 \times 10^{13}/\text{cm}^2$ from the device-side face 11a of the semiconductor wafer 11 to form the N-type well region NW in the principal portion of the low-breakdown-voltage P-channel device region 31. Likewise, boron ions are implanted at a concentration of, e.g., about $2 \times 10^{13}/\text{cm}^2$ from the device-side face 11a of the semiconductor wafer 11 to form the P-type well region PW in the principal portion of the low-breakdown-voltage N-channel device region 32. Further, by thermally oxidizing the silicon surface of the device-side face of the semiconductor wafer 11 in the low-breakdown-voltage portion 82, the gate insulting film 9 is formed. The thickness of the gate insulating film 9 is equivalent to that of a standard silicon dioxide film such as a silicon dioxide film, a silicon nitride film, a silicon oxynitride film, or a composite film thereof (including a High-k insulating film in 90 nm and 65 nm processes), which is, e.g., about 4 nm.

Next, as shown in FIGS. 53, 64, 75, and 86, a polysilicon film (having a thickness of, e.g., about 180 nm) is deposited by CVD over the entire surface of the device-side face 11a of the semiconductor wafer 11. The upper surface of the polysilicon film corresponding to the low-breakdown-voltage P-channel device region 31 is covered with a resist film and, in this state, phosphorus ions are implanted at a concentration of, e.g., about $4 \times 10^{15}/\text{cm}^2$ from the device-side face 11a of the semiconductor wafer 11 to dope the polysilicon film over the high-breakdown-voltage N-channel device region 34, the high-breakdown-voltage P-channel device region, and the low-breakdown-voltage N-channel device region 32 with the N-type impurity. Subsequently, in contrast to the doping of the polysilicon film with the N-type impurity described above, the polysilicon film corresponding to the high-breakdown-voltage N-channel device region 34, the high-breakdown-voltage P-channel device region 33, and the low-breakdown-voltage N-channel device region 32 is covered with a resist film and, in this state, boron ions are implanted at a concentration of, e.g., about $4 \times 10^{15}/\text{cm}^2$ from the device-side face 11a of the semiconductor wafer 11 to dope the polysilicon film over the low-breakdown-voltage P-channel device region 31 with the P-type impurity. Further, by typical lithography, a resist film pattern for processing the gate electrode is formed over the polysilicon film. Then, using the resist film pattern as a mask, the polysilicon film is patterned into the gate electrodes 15n, 15p, 25n, and 25p by dry etching.

Next, as shown in FIGS. 54, 65, 76, and 87, boron ions ($BF_2$) are implanted at a concentration of, e.g., about $2 \times 10^{14}/\text{cm}^2$ from the device-side face 11a of the semiconductor wafer 11 to form the P-type source/drain extension regions PLD in the silicon surface region on both sides of the gate electrode 25p of the low-breakdown-voltage P-channel MISFET. Likewise, from the device-side face 11a of the semiconductor wafer 11, phosphorus ions are implanted at a concentration of, e.g., about $1 \times 10^{14}/\text{cm}^2$ to form the N-type source/drain extension regions NLD in the silicon surface region on both sides of the gate electrode 25n of the low-breakdown-voltage N-channel MISFET. Further, a silicon nitride film is deposited by CVD over the entire surface of the device-side face 11a of the semiconductor wafer 11. Thereafter, the silicon nitride film is etched by anisotropic dry etching to form the sidewall insulating films 22 over the peripheral portions of the gate electrodes 15n, 15p, 25n, and 25p.

Next, as shown in FIGS. 55, 66, 77, and 88, boron ions ($BF_2$) are implanted at a concentration of, e.g., about $2 \times 10^{15}/\text{cm}^2$ from the device-side face 11a of the semiconductor wafer 11 (into the P-type high-concentration impurity region PSD) to form the P-well contact region 30p, the P-type high-concentration source contact region 26p, and the P-type high-concentration drain contact region 27p in the low-breakdown-voltage region 82, and the P-type high-concentration guard ring contact region 29p, the P-type high-concentration drain contact region 27p, and the P-type high-concentration source contact region 26p in the high-breakdown-voltage region 81. Likewise, arsenic ions are implanted at a concentration of, e.g., about $3 \times 10^{15}/\text{cm}^2$ from the device-side face 11a of the semiconductor wafer 11 (into the N-type high-concentration impurity region NSD) to form the N-type high-concentration guard ring contact region 29n, the N-well contact region 30n, the N-type high-concentration source contact region 26n, and the N-type high-concentration drain contact region 27n in the low-breakdown-voltage region 82, and the N-type high-concentration guard ring region 29n, the N-type high-concentration drain contact region 27n, and the N-type high-concentration source contact region 26n in the high-breakdown-voltage region 81. Further, by a salicide process, the single-crystal silicon surface of the device-side face 11a of the semiconductor wafer 11, and the upper surfaces of the gate electrodes 15n, 15p, 25n, and 25p are subjected to cobalt silicidation. In a product at a 65 nm or smaller process node, nickel silicidation is performed as necessary.

Next, as shown in FIGS. 56, 67, 78, and 89, the silicon nitride film 23 (having a thickness of, e.g., about 40 nm) as the etch stop film in the contact hole process is deposited by, e.g., plasma CVD over the entire surface of the device-side face 11a of the semiconductor wafer 11. Subsequently, the pre-metal interlayer insulating film 24 (the pre-metal main interlayer insulating film) which is sufficiently thicker than the etch stop film is deposited thereon. Preferably, the pre-metal interlayer insulating film 24 has a specific structure including a lower-layer silicon-dioxide-based insulating film (having a thickness of, e.g., about 200 nm at the completion thereof) using ozone-TEOS and deposited by thermal CVD, and an upper-layer silicon-dioxide-based insulating film (having a thickness of, e.g., about 500 nm at the completion thereof) deposited by plasma TEOS CVD or the like. Subsequently, the pre-metal interlayer insulating film 24 is planarized as necessary by oxide film CMP (Chemical Mechanical Polishing). Further, as the cap film thinner than the pre-metal main interlayer insulating film, a silicon dioxide film is deposited as necessary by plasma TEOS CVD over the pre-metal main interlayer insulating film processed by oxide-film CMP. In the steps subsequent thereto, the pre-metal interlayer insulating film 24 including the cap film is referred to as such in principle. The thickness of the interlayer insulating film 24 is, e.g., about 700 nm at the completion thereof.

Next, at the device-side face 11a of the semiconductor wafer 11, a resist film pattern for forming the contact holes is formed. Using the resist film pattern as a mask, anisotropic dry etching is performed in a gas mixture atmosphere containing, e.g., a fluorocarbon-based etching gas such as $C_4F_8$ or $C_5F_8$, oxygen, argon, and the like to first open the contact holes reaching the upper surface of the silicon nitride film 23. Subsequently, anisotropic dry etching is performed in a gas mixture atmosphere containing, e.g., a fluorocarbon-based etching gas such as $CF_4$ or $CHF_8$, oxygen, argon, and the like to extend the contact holes to the lower surface of the silicon nitride film 23.

Next, over the upper surface of the pre-metal interlayer insulating film 24 and in the contact holes, a barrier metal film which is relatively thin compared with the diameters of the contact holes is formed by sputtering or CVD. The barrier metal film is formed as a laminated film of, e.g., a lower-layer Ti film, and an upper-layer TiN film. Subsequently, a tungsten film which is sufficiently thick compared with the barrier metal film is deposited by CVD over the barrier metal film so as to bury the contact holes. Subsequently, the barrier metal film and the tungsten film each outside the contact holes are removed by metal CMP to form the substrate contact plugs 19n, 20p, 16n, 17n, 16p, 17p, 20n, and 19n and the gate electrode contact plug 18 in the low-breakdown-voltage portion 82 (low-breakdown-voltage MISFET group 52), and the substrate contact plugs 19hp, 16hn, 17hn, 19hn, 17hp, 16hp, and 19hn and the gate electrode contact plug 18h in the high-breakdown-voltage portion 81 (high-breakdown-voltage MISFET group 51). At this stage, the wafer process up to the pre-metal process has been completed. The steps subsequent thereto are the same as the steps illustrated as those subsequent to FIG. 42 (corresponding to FIG. 89) with reference to FIG. 95, and the description thereof will not be repeated.

As described at the beginning of the present section, the recess in the surface 11a of the silicon substrate in FIGS. 46, 57, 68, and 79 will be described based on FIGS. 96(a) to 96(d). FIGS. 96(a) to 96(d) are partially enlarged views of the STI end portion C1 of FIG. 57 in the step prior to that of FIG. 57. Hereinbelow, the process will be described in due order. As shown in FIG. 96(a), according to a typical STI-CMP process, the buried CVD oxide film STI1 is removed till a CMP stopper film 79 (silicon nitride film) is reached. Then, as shown in FIG. 96(b), the upper surface of the buried CVD oxide film STI1 is slightly etched using a fluoric-acid-based silicon dioxide etchant to control the amount of projection. Then, as shown in FIG. 96(c), the silicon nitride film 79 is removed using a hot-phosphoric-acid-based silicon nitride etchant. Finally, as shown in FIG. 96(d), a liner silicon dioxide film 78 is removed to provide the states shown in FIGS. 46, 57, 68, and 79. The foregoing process is also the same as in the case of Section 3, though the amount of projection is different.

6. Description of High-Breakdown-Voltage-Portion MISFET (Variation of Device Structure 2 According to Thermal Oxide Gate Insulating Film Method: Lg-Direction Contact Method) in Semiconductor Integrated Circuit Device in Another Embodiment of Present Invention (Primarily Using FIGS. 91 and 92)

Figure 91:
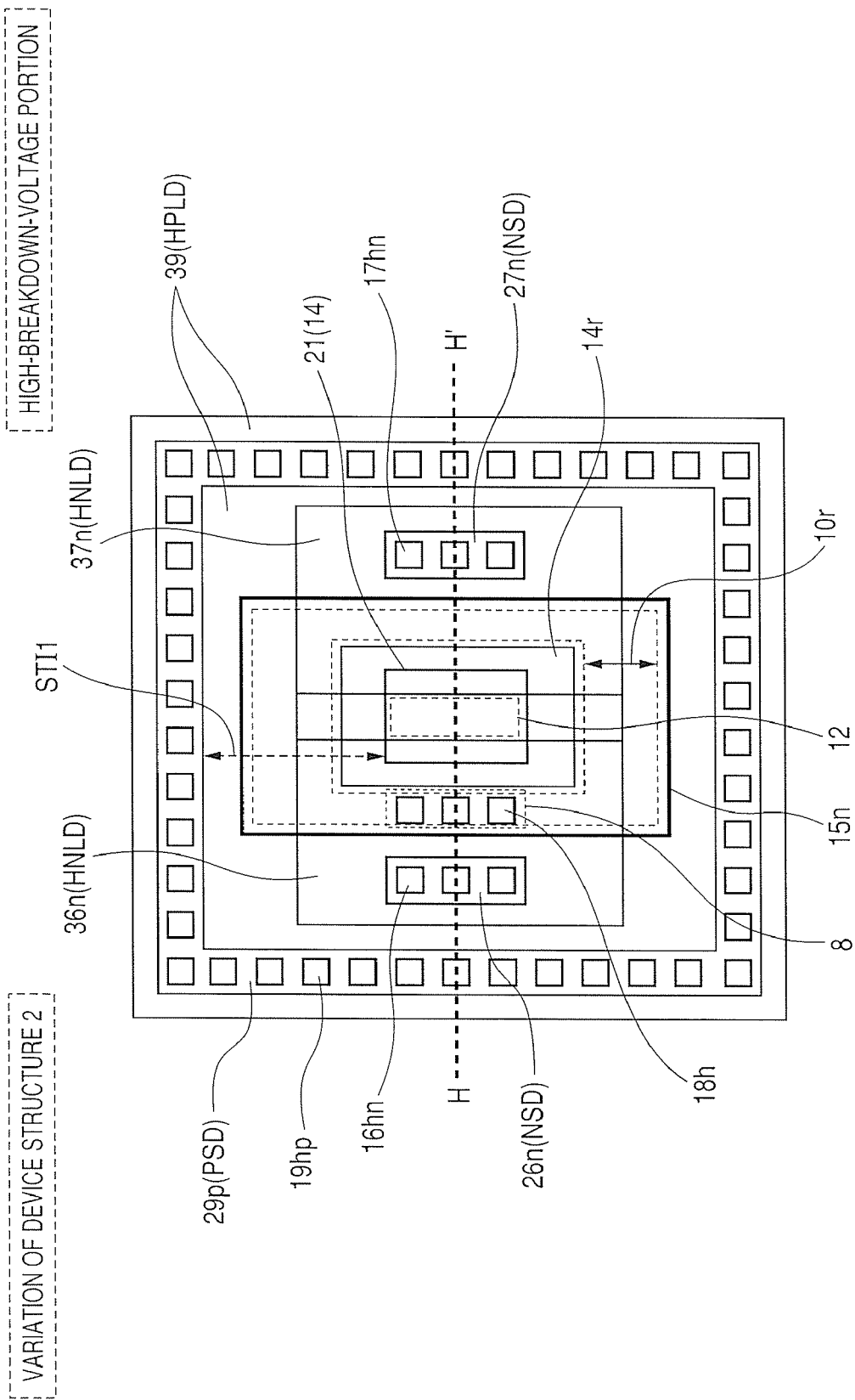
FIG. 91 is an upper-surface layout diagram of the high-breakdown-voltage-portion N-channel MISFET (a variation of the device structure 2 according to the CVD gate insulating film method) in the semiconductor integrated circuit device in the another embodiment of the present invention.
Figure 92:
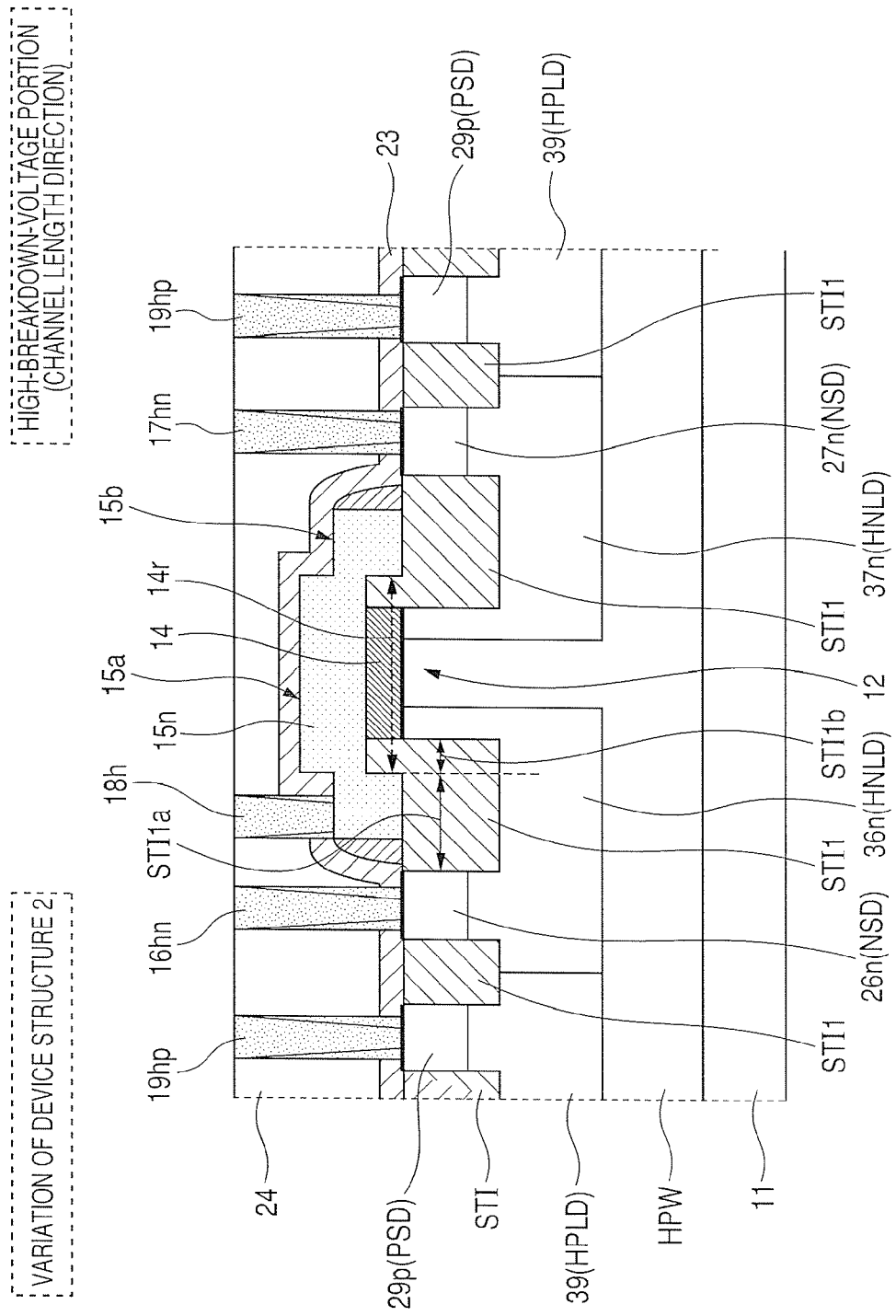
FIG. 92 is a device cross-sectional view corresponding to a cross section along the line H-H' of FIG. 91.

FIG. 91 is an upper-surface layout diagram of the high-breakdown-voltage-portion N-channel MISFET (a variation of the device structure 2 according to the CVD gate insulating film method) in the semiconductor integrated circuit device in the embodiment of the present invention. FIG. 92 is a device cross-sectional view corresponding to a cross section along the line H-H' of FIG. 91.

As shown in FIGS. 91 and 92, this example is basically the same as the example of Section 5 (in which the gate oxide film of the high-breakdown-voltage MISFET is formed by thermal oxidation), but is characterized in that the gate contact portion 8 of the high-breakdown-voltage MISFET is provided in the direction of the channel length Lg in the same manner as in the relationship between the example of Section 3 and that of Section 4.

7. Summary

While the invention achieved by the present inventors has been specifically described heretofore based on the embodiments thereof, the present invention is not limited thereto. It will be easily appreciated that various modification and changes can be made in the invention without departing from the gist thereof.

For example, the foregoing embodiments have been specifically described primarily using the semiconductor integrated circuit device in which the elements are integrated in the P-type single-crystal silicon substrate as an example. However, the present invention is not limited thereto. It will be easily appreciated that the present invention is also applicable to semiconductor integrated circuit devices in which elements are formed in an N-type single-crystal silicon substrate (including a SOI substrate), other insulating substrates, and the like. Additionally, in the embodiments described above, the example primarily using a typical aluminum-based wiring structure has been shown, but the present invention is not limited thereto, either. It will be easily appreciated that the present invention is also applicable to a semiconductor integrated circuit device using a copper- or silver-based damascene wiring structure, or a combination of a copper- or silver-based damascene wiring structure and a typical aluminum-based wiring structure.

Although the present embodiment has shown the example in which the present invention is applied to the LCD driver, the present invention is not limited thereto. The present invention is also applicable to an integrated circuit device as long as it includes a high-breakdown-voltage MISFET. The present invention is not limited to an integrated circuit device for driving a liquid crystal display, either. The present invention is also applicable to an integrated circuit device for driving another display such as an organic EL display.

What is claimed is:

1. A semiconductor integrated circuit device comprising:
   (a) a semiconductor substrate having a first principal surface and a second principal surface;
   (b) a first MISFET group formed at the first principal surface; and
   (c) a second MISFET group formed at the first principal surface, and being lower in breakdown voltage than the first MISFET group,
   wherein each MISFET belonging to the first MISFET group includes
      (i) a first source region and a first drain region which are formed in a surface region of the first principal surface to oppose each other with a first channel region being interposed therebetween;
      (ii) a first gate insulating film deposited by CVD over the first principal surface so as to cover the first channel region, and to reach a surface portion of a first field insulating film around an entire periphery of the first channel region;
      (iii) a first gate electrode film formed over the first gate insulating film so as to cover the first channel region, and to reach an outside of the region covered with the first gate insulating film; and
      (iv) a first gate contact portion provided over the first gate electrode film outside the region covered with the first gate insulating film,
   wherein an end portion of the first gate insulating film is disposed over the first field insulating film around an entire periphery thereof.

2. A semiconductor integrated circuit device according to claim 1, wherein the first gate contact portion is provided in a gate width direction.

3. A semiconductor integrated circuit device according to claim 1, wherein the first gate contact portion is provided in a gate length direction.

4. A semiconductor integrated circuit device according to claim 1, wherein each of MISFETs belonging to the second MISFET group includes:

(i) a second gate insulating film formed by thermal oxidation over a second channel region of the first principal surface.

5. A semiconductor integrated circuit device according to claim 1, wherein a part of each of both end portions of the first gate electrode film is over the first gate insulating film in a gate length direction.

6. A semiconductor integrated circuit device according to claim 1, wherein the first gate electrode film covers an entire region of the first gate insulating film.

7. A semiconductor integrated circuit device according to claim 1, wherein, at the first gate contact portion, a contact is formed of a single or a plurality of metal plugs each having a first diameter.

8. A semiconductor integrated circuit device according to claim 1, wherein, at a second gate contact portion of each of MISFETs belonging to the second MISFET group, a contact is formed of a metal plug having a first diameter.

9. A semiconductor integrated circuit device according to claim 1, wherein, at a first source contact portion of each of the MISFETs belonging to the first MISFET group and at a drain contact portion thereof, contacts are formed of metal plugs each having a first diameter.

10. A semiconductor integrated circuit device comprising:
(a) a semiconductor substrate having a first principal surface and a second principal surface;
(b) a first MISFET group formed at the first principal surface; and
(c) a second MISFET group formed at the first principal surface, and lower in breakdown voltage than the first MISFET group,
wherein each of MISFETs belonging to the first MISFET group includes:
(i) a first source region and a first drain region which are formed in a surface region of the first principal surface to oppose each other with a first channel region being interposed therebetween;
(ii) a first gate insulating film deposited by thermal oxidation over the first principal surface so as to cover the first channel region, and be coupled to a first field insulating film around an entire periphery of the first channel region;
(iii) an insulating film mesa region formed of the first gate insulating film and of a thick portion of the first field insulating film on a periphery of the first gate insulating film;
(iv) a first gate electrode film formed over the first gate insulating film so as to cover the first channel region, and reach an outside of the insulating film mesa region; and
(v) a first gate contact portion provided over the first gate electrode film outside the insulating film mesa region.

11. A semiconductor integrated circuit device according to claim 10, wherein the first gate contact portion is provided in a gate width direction.

12. A semiconductor integrated circuit device according to claim 10, wherein the first gate contact portion is provided in a gate length direction.

13. A semiconductor integrated circuit device according to claim 10, wherein each of MISFETs belonging to the second MISFET group includes:
(i) a second gate insulating film formed by thermal oxidation over a second channel region of the first principal surface.

14. A semiconductor integrated circuit device according to claim 10, wherein a part of each of both end portions of the first gate electrode film is over the insulating film mesa region in a gate length direction.

15. A semiconductor integrated circuit device according to claim 10, wherein the first gate electrode film covers the entire insulating film mesa region.

16. A semiconductor integrated circuit device according to claim 10, wherein an end portion of the insulating film mesa region is over the first field insulating film around an entire periphery thereof.

17. A semiconductor integrated circuit device according to claim 10, wherein, at the first gate contact portion, a contact is formed of a single or a plurality of metal plugs having a first diameter.

18. A semiconductor integrated circuit device according to claim 10, wherein, at a second gate contact portion of each of MISFETs belonging to the second MISFET group, a contact is formed of a metal plug having a first diameter.

19. A semiconductor integrated circuit device according to claim 10, wherein, at a first source contact portion of each of the MISFETs belonging to the first MISFET group and at a drain contact portion thereof, contacts are formed of metal plugs each having a first diameter.

20. A semiconductor integrated circuit device comprising:
(a) a semiconductor substrate having a first principal surface and a second principal surface;
(b) a first MISFET group formed at the first principal surface; and
(c) a second MISFET group formed at the first principal surface, and being lower in breakdown voltage than the first MISFET group,
wherein each MISFET belonging to the first MISFET group includes
(i) a first source region and a first drain region which are formed in a surface region of the first principal surface to oppose each other with a first channel region being interposed therebetween;
(ii) a first gate insulating film deposited by CVD over the first principal surface so as to cover the first channel region, and to reach a surface portion of a first field insulating film around an entire periphery of the first channel region;
(iii) a first gate electrode film formed over the first gate insulating film so as to cover the first channel region, and to reach an outside of the region covered with the first gate insulating film; and
(iv) a first gate contact portion provided over the first gate electrode film outside the region covered with the first gate insulating film,
wherein, in a gate width direction, an end portion of the first gate insulating film is located between an end portion of the first channel region and an end portion of the first gate electrode film, and
wherein, in the gate width direction, the first gate contact portion is located between the end portion of the first channel region and the end portion of the first gate electrode film.

21. A semiconductor integrated circuit device according to claim 20, wherein each of MISFETs belonging to the second MISFET group includes:
(i) a second gate insulating film formed by thermal oxidation over a second channel region of the first principal surface.

22. A semiconductor integrated circuit device according to claim 20, wherein a part of each of both end portions of the first gate electrode film is disposed over the first gate insulating film in a gate length direction.

23. A semiconductor integrated circuit device according to claim 20, wherein the first gate electrode film covers an entire region of the first gate insulating film.

24. A semiconductor integrated circuit device according to claim 20, wherein an end portion of the first gate insulating film is disposed over the first field insulating film around an entire periphery thereof.

25. A semiconductor integrated circuit device according to claim 20, wherein, at the first gate contact portion, a contact is formed of a single or a plurality of metal plugs each having a first diameter.

26. A semiconductor integrated circuit device according to claim 20, wherein, at a second gate contact portion of each MISFET belonging to the second MISFET group, a contact is formed of a metal plug having a first diameter.

27. A semiconductor integrated circuit device according to claim 20, wherein, at a first source contact portion of each of the MISFETs belonging to the first MISFET group and at a drain contact portion thereof, contacts are formed of metal plugs each having a first diameter.

28. A semiconductor integrated circuit device according to claim 20, wherein in a gate length direction, the end portion of the first gate electrode film is located between the end portion of the first channel region and the end portion of the first gate insulating film.

* * * * *